United States Patent [19]

DiMassimo et al.

[11] Patent Number: 4,465,970
[45] Date of Patent: Aug. 14, 1984

[54] METHOD AND APPARATUS FOR MULTIPLE RATE METERING OF ELECTRICAL ENERGY

[75] Inventors: Donald V. DiMassimo; John B. May, both of Liverpool; Brian C. Johnson, Syracuse; Jeffrey L. Cooper, Liverpool, all of N.Y.

[73] Assignee: General Electric Company, Somersworth, N.H.

[21] Appl. No.: 578,315

[22] Filed: Feb. 10, 1984

Related U.S. Application Data

[63] Continuation of Ser. No. 238,450, Feb. 26, 1981, abandoned.

[51] Int. Cl.³ .................. G01R 15/08; G01R 11/64; G06F 15/20
[52] U.S. Cl. ................. 324/116; 324/103 R; 364/483
[58] Field of Search ........... 324/116, 103 R; 364/483, 492

[56] References Cited

U.S. PATENT DOCUMENTS

| | | | |
|---|---|---|---|
| 548,419 | 10/1895 | Barstow | 324/116 |
| 585,258 | 6/1897 | Cox | 324/116 |
| 591,195 | 10/1897 | Oxley | 324/116 |
| 593,852 | 11/1897 | Oxley | 324/116 |
| 596,283 | 12/1897 | Wilson | 324/116 |
| 597,985 | 1/1898 | Kapp | 324/116 |
| 710,070 | 9/1902 | Oxley | 324/116 |
| 1,078,206 | 11/1913 | Mayer | 324/116 |
| 2,132,256 | 10/1938 | Cameron | 324/116 |
| 2,139,821 | 12/1938 | Greenwood et al. | 324/116 |
| 2,246,185 | 6/1941 | Pratt | 324/116 |
| 2,415,653 | 2/1947 | Ogurkowski | 324/116 |
| 2,915,704 | 12/1959 | Kahn | 324/103 R |
| 4,050,020 | 9/1977 | Germer et al. | 324/116 |
| 4,077,061 | 2/1978 | Johnston et al. | 364/483 |
| 4,080,568 | 3/1978 | Funk | 324/142 |
| 4,082,999 | 4/1978 | Stacker | 324/116 |
| 4,093,997 | 6/1978 | Germer | 364/900 |
| 4,106,095 | 8/1978 | Yarbrough | 364/464 |
| 4,120,031 | 10/1978 | Kincheloe et al. | 364/464 |
| 4,133,034 | 1/1978 | Etter | 364/464 |
| 4,179,654 | 12/1979 | Germer | 324/116 |
| 4,197,582 | 4/1980 | Johnston et al. | 364/483 |
| 4,229,795 | 10/1980 | Vieweg et al. | 364/483 |
| 4,298,839 | 3/1978 | Johnston | 324/116 |
| 4,301,508 | 11/1981 | Anderson et al. | 324/116 |

*Primary Examiner*—Ernest F. Karlsen
*Attorney, Agent, or Firm*—Robert E. Brunson

[57] ABSTRACT

A programmable time-of-use metering system is disclosed for metering electrical energy consumption at multiple rates depending on the time of day, time of week and time of year in which the energy is being consumed. A method for registering total energy consumed by a metered system as well as energy consumed during preselected time intervals is also disclosed.

14 Claims, 56 Drawing Figures

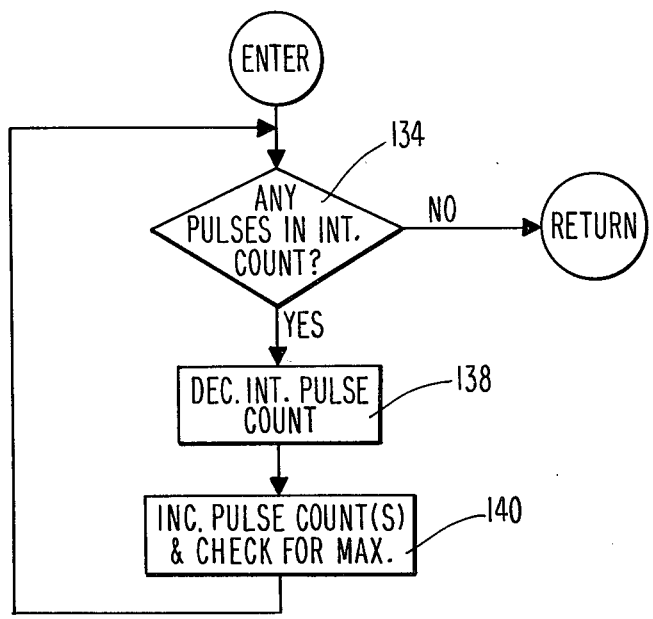
_Fig. 13_
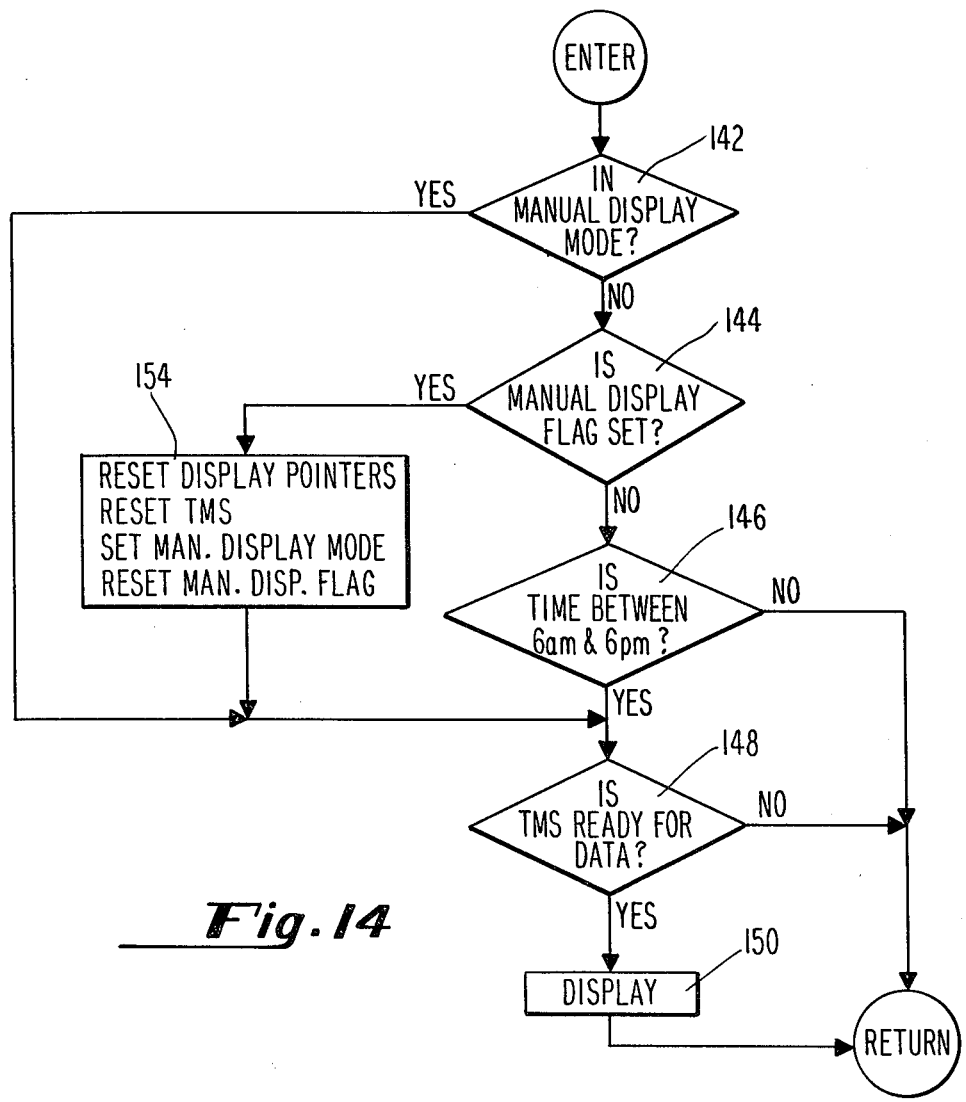
_Fig. 14_

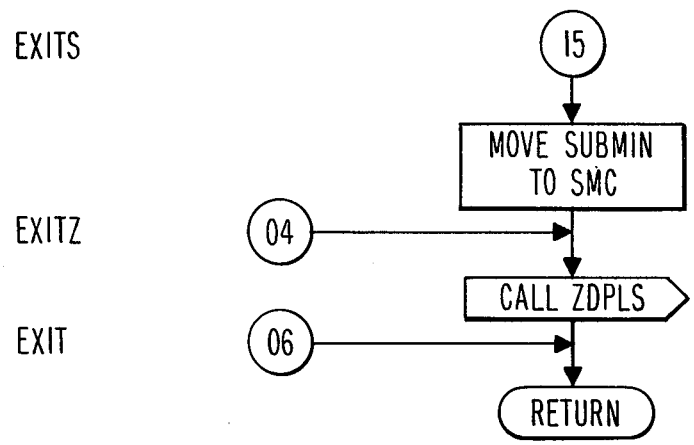
Fig. 22
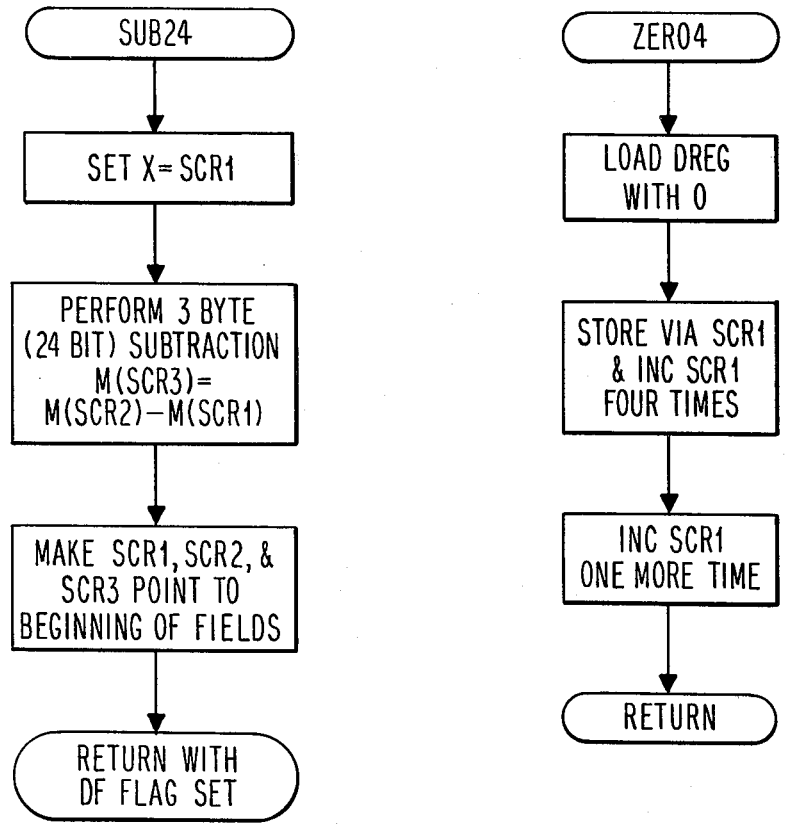
Fig. 23  Fig. 24

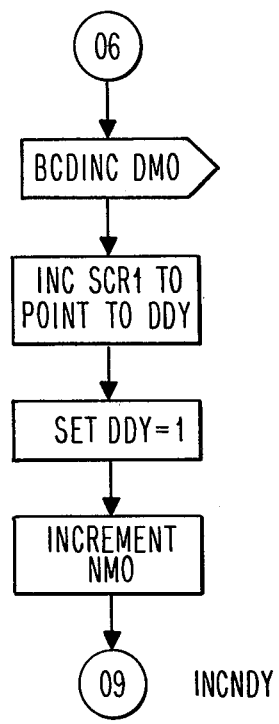
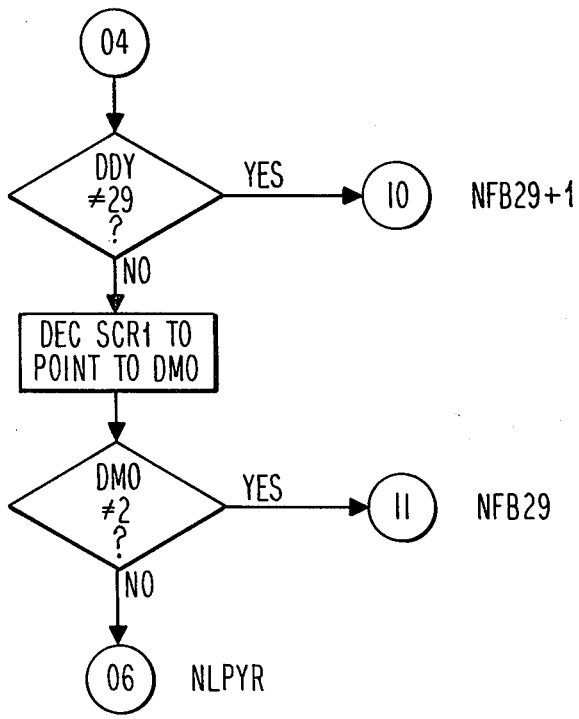
Fig. 36

| SYNC CODE | # NIBBLES | FORMAT CODE | MINUTE LSD | MINUTE MSD | HOUR LSD | HOUR MSD |
|---|---|---|---|---|---|---|
| 000001 | 10101 | 01101 | 00001 | 11001 | 00001 | 10001 |
| | $5_H$ | $6_H$ | 0 | 3 | 0 | 1 |

TIME DISPLAY MESSAGE FOR 10 30

METHOD AND APPARATUS FOR MULTIPLE RATE METERING OF ELECTRICAL ENERGY

This application is a continuation, of application Ser. No. 238,450, filed Feb. 26, 1981 now abandoned.

BACKGROUND OF THE INVENTION

I. Field of the Invention

This invention relates generally to the measurement of electrical energy consumption in a power system and more particularly to an improved method and apparatus for metering electrical energy consumption at multiple rates depending upon the time of day, time of week and time of year during which the energy is being consumed.

II. Description of the Prior Art

Initially, electrical energy had been sold quite generally on the basis of a fixed rate schedule irrespective of whether a high or low demand was made on the electrical generation system. Because of this flat rate structure, electrical generation and distribution systems were overloaded at certain times and, at other times, were only very slightly loaded. This resulted in substantial inefficiencies since a much larger plant and distribution system than is economically desirable is required in order to meet peak demands of the distribution system.

In order to provide for more efficient use of electrical generation and distribution facilities during off-peak load periods, attempts have been made at developing clock mechanisms for decreasing the flow of electricity during peak load periods. Generally, in the past, these types of devices have been found to be impractical due to the necessity of frequent checking and setting of the clock switching mechanisms at the various consumer locations and, in addition, to the inability to predict peak demand load intervals and to change the timing of the clock mechanisms on a relatively simple and efficient basis to track the peak load intervals.

Very early in the supply of electricity over a relatively large distribution area, attempts were made at multiple rate metering of electrical power consumption. These attempts were initiated in order to be able to charge a lower rate to those consuming electrical energy during the off-peak periods than the rate charged to those consuming the energy during on-peak periods. The theory behind these multiple rate structures is to encourage the user to consume the electrical energy during off-peak periods which would thereby tend to level the load requirements placed on the power distribution system.

As an example of a prior attempt to individually register different amounts of power consumed during different intervals of a day, Greenwood et al disclosed in U.S. Pat. No. 2,139,821, a simplified arrangement wherein a two-stage mechanical watt meter mechanism was provided having a clock timer associated therewith. Cams on the clock timer tripped a mechanism which, at selected times during the day, permitted the driving of one set of meter dials or the other so that consumption of electrical energy, during a selected portion of the day, could be registered by only one set of dials, while the electrical energy consumed during the other portion of the day could be registered on a second set of dials.

This arrangement was followed by the developments of Pratt, as disclosed in U.S. Pat. No. 2,246,185 and Cameron, as disclosed in U.S. Pat. No. 2,132,256. The Pratt and Cameron developments both utilized dual rate metering systems wherein a clock determined which set of meters were to be activated. Other attempts have been made at providing a dual rate kilowatt hour metering system, as exemplified by the following U.S. Pat. Nos.: Barstow, 548,419; Cox, 585,258; Oxley, 591,195; Oxley, 593,852; Wilson, 596,283; Kapp, 597,985; Oxley, 710,070; Mayer, 1,078,206; Ogurkowski, 2,415,653; Kahn, 2,915,704; and Staker, 4,082,999.

An improved apparatus for metering the consumption of electrical energy at multiple rates is disclosed by Germer, et al in U.S. Pat. No. 4,050,020, which patent is assigned to the assignee of the present invention. This apparatus employs three sets of decade gear driven dials for registering kilowatt hours consumed on a continuous basis, kilowatt hours consumed during preselected mid-peak intervals, and kilowatt hours consumed during preselected high-peak intervals. A programmable control circuit controls the operation of the alternate sets of decade gear driven dials by actuating the desired set at a predetermined time. Although an improvement over its predecessors, this apparatus is limited in its versatility since its time interval selection is based on time which is internally generated in 15-minute increments on a weekly cycle.

In addition to the aforementioned two-rate mechanical registering systems, other systems have developed wherein the use of power above a certain level is recorded. These systems include electronic watt-hour meters which are capable of measuring a maximum peak power over a predetermined time period. In order to permit power companies to supply a level load, and also to have generating capability to supply all consumers at all times, it is necessary that peak loads be predictable. Thus, there is a practice of billing large users in particular, based on a peak load within a given period of time, typically 15 minutes. This gives the user an incentive to maintain a level load and not exceed a predetermined peak. This monitoring of excess consumption is a proposed means of reducing the peak use of power by a particular customer. Such systems minimize individual peak power usage which may or may not coincide with the peak power demand on a utility system.

In a time-of-day demand metering system, the consumption of power is measured and recorded on a demand meter register during demand intervals of a predetermined length. Previously, the demand interval length had been for a fixed length of time (e.g. 15 or 30 minutes). However, as the costs of generating electrical energy escalated and the variety of demand power users increased (the demand for power during on-peak periods can be greater and for longer periods in some areas than in others) utility companies required a universal meter which can readily be altered to change the demand interval length without making extensive mechanical or electrical modifications. One such meter is disclosed by Germer in U.S. Pat. No. 4,179,654, assigned to the assignee of the present invention. The demand register in this meter is capable of being engaged at the start of a demand interval, as determined by a program in the meter, and disengaged to terminate the demand interval as determined by an interval counter generating and end-of-interval signal at a preselected time.

Although an improvement over the prior fixed interval demand meters, the demand intervals occurred at fixed times throughout the day. Since the consumer was able to predict precisely when the demand interval would begin and end, the times of peak power usage could be spread over two demand intervals thereby yielding a lower maximum demand than was actually created. For example, if the user operated at 5 KW for the first half of a fixed period of 15 minutes, at 10 KW for the next half and then remained at 10 KW for the first half of the next fixed period, the fixed period mean maximum would be 7.5 KW instead of the actual 10 KW. In U.S. Pat. No. 4,229,795, Vieweg et al disclosed a device utilizing a shift register and up-down counter to establish a sliding demand period in order to more accurately indicate the actual demand. Although an improvement over the prior art, this device lacks true versatility in that the duration of the sliding period is fixed by the number of stages in the shift register thereby limiting its flexibility since a change in the demand interval duration would apparently necessitate a change in the number of stages of the shift register.

Therefore, a need exists for a time-of-use metering system which provides the capability of readily selecting the time of occurrence and duration of multiple rate periods as well as various lengths of sliding demand intervals without the need for expensive mechanical or electrical modifications to the meter.

SUMMARY OF THE INVENTION

The aforementioned needs are met by the present invention which provides a multiple rate electrical metering system and method for registering total electrical energy consumed by a monitored load as well as electrical energy consumed by the load during at least one preselected time of use period.

The system comprises input means adapted to receive and count pulses which are representative of electrical energy consumed by the monitored load, means for detecting the beginning and the end of the time of use period, register means for accumulating the count of pulses received during the preselected time of use period and for accumulating the total count of pulses received, and means for selectively displaying the contents of the first and second registers in units of energy consumption.

A central processing unit, comprises a microprocessor which controls and communicates with an external memory, an input data selector, an output data selector, and a display processor/controller.

The microprocessor, utilizing clock inputs from a dual frequency clock generator, keeps track of real time in order to establish current time of day, day of week (that is, whether the current day is a weekday or a weekend day) and day of year (that is, whether or not the current day is a holiday, leap year day, daylight savings time change day or a day which falls within a designated season of the year).

The input data selector receives pulses from a watthour meter, transmits them to the microprocessor upon request, whereupon the microprocessor accumulates them in categories depending upon the particular time of use in which the pulse was received.

The microprocessor, utilizing the pulses accumulated during a predetermined time of use period, calculates maximum demand measured during a predetermined interval of time, which predetermined interval is constantly sliding throughout the selected time of use period.

The output data selector, upon command of the microprocessor, generates consumer alerts which are a function of the particular time of use period currently in progress, and also generates a signal for turning an external load on or off during a preselected time of use period. The output data selector also, under control of the microprocessor, transmits data and control signals to the display processor/controller which formats display data and transmits it to a numeric display. The numeric display is activated at a predetermined time of day or can be activated by means of a magnetic wand passed in proximity to a magnetically activated switch which signals the microprocessor, through the input data selector, that the display is to be activated.

It is therefore an object of the present invention to provide an improved method and apparatus for metering electrical consumption at multiple rates depending upon the time of day, time of week and time of year during which the consumption of energy is being measured.

It is another object of the present invention to provide an improved method and apparatus for selectively changing the lengths of sliding demand intervals.

A still further object is to provide an apparatus in a programmable time-of-use demand meter responsive to a program stored therein to selectively control the length of sliding demand intervals as specified by the program.

Yet another object of the present invention is to provide an apparatus in a programmable time-of-use demand meter responsive to a program stored therein to selectively control the time of occurrence and duration of at least two different rate periods, the time of occurrence and duration being a function of the day of the week, that is whether or not the day is a weekday, weekend, or holiday, as well as the day of the year, that is whether or not the day falls within a predetermined season.

Still another object of the present invention is to provide an apparatus which alerts the consumer as to which of the multiple rates is in effect throughout a particular time-of-use period, and provides a signal which is proportional to power usage.

A still further object of the present invention is to provide an apparatus which automatically switches a consumer's load on or off as desired during one or more of the time-of-use intervals.

BRIEF DESCRIPTION OF THE DRAWING

Other objects, features and advantages of the present invention will become more fully apparent from the the following detailed description of the preferred embodiment, the appended claims and the accompanying drawing in which:

FIG. 13 is the preferred embodiment of a pulses subroutine of the quick check subroutine referred to in FIG. 12;

FIG. 14 is a flow chart of the preferred embodiment of a display check subroutine of the quick check subroutine referred to in FIG. 12;

FIGS. 15 through 31 are flow charts depicting the steps of the preferred embodiment of a demand calculation subroutine of the Main program referred to in FIG. 11;

FIGS. 32 through 53 are flow charts depicting the preferred embodiment of a quarter hour check subroutine of the Main program referred to in FIG. 11.

DESCRIPTION OF THE PREFERRED EMBODIMENT

Figure 1:
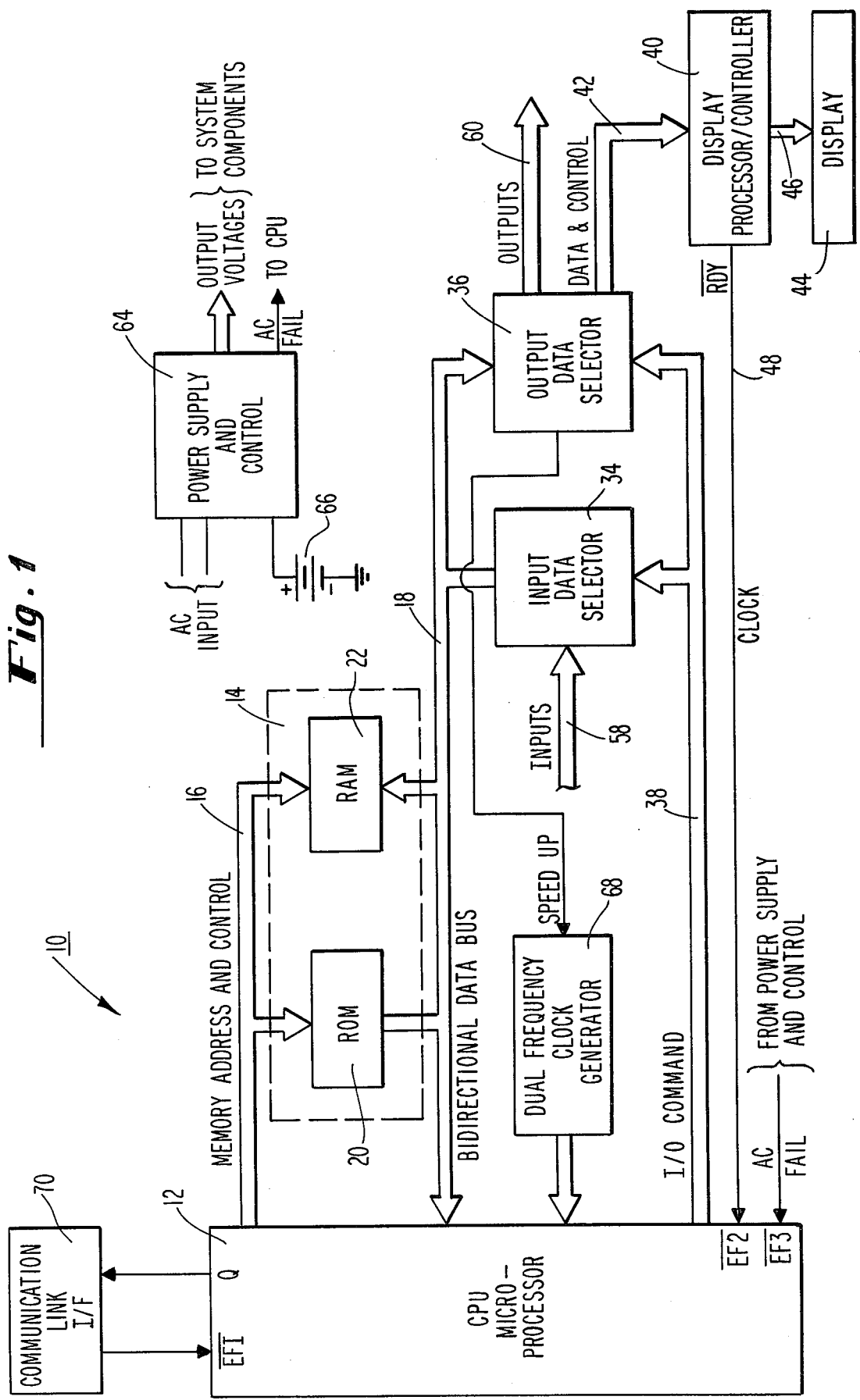
FIG. 1 is a major block diagram of the apparatus of the present invention.

Referring to FIG. 1 of the drawing, there is shown an overall block diagram of the preferred embodiment of the multiple rate metering apparatus of the present invention, generally designated 10. The apparatus 10 includes a central processing unit comprising a microprocessor 12. In the preferred embodiment, the microprocessor 12 is an RCA CDP 1802 COSMAC Microprocessor as shown and described in the RCA Corporation publication No. MPM-201B, dated November 1977, which publication is hereby incorporated by reference as if fully set forth herein. The microprocessor 12 is electrically connected to an external memory 14 by means of a memory address and control circuit 16 and a bi-directional data bus 18.

Figure 2:
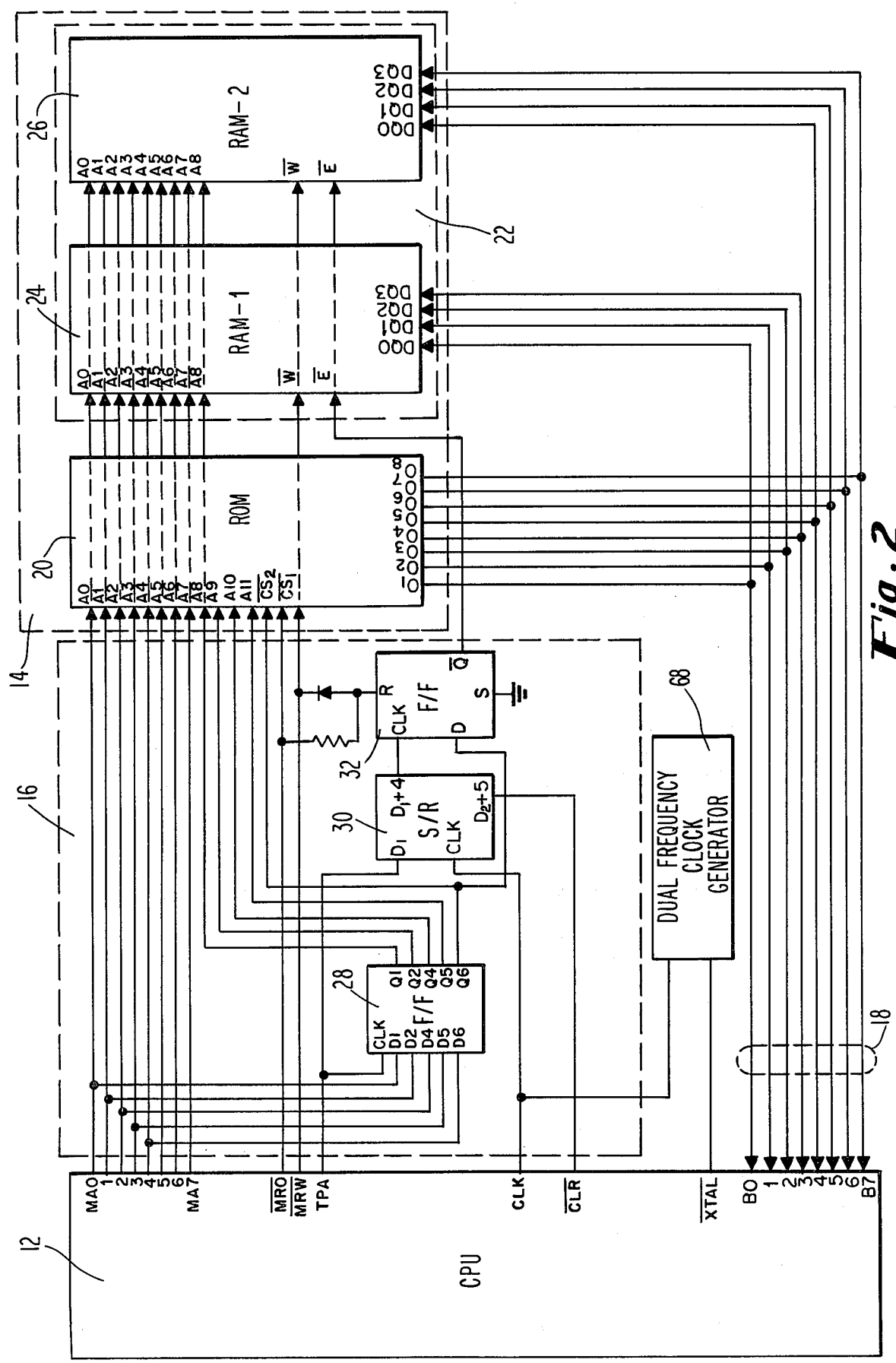
FIG. 2 is a schematic block diagram of the preferred embodiment of the central processing unit, memory address and control, bi-directional data bus and external memory portions of the apparatus depicted in FIG. 1.

In the preferred embodiment, the external memory 14 comprises a read only memory (ROM) 20 and a random access memory (RAM) 22. The ROM 20 is preferably a Supertex, Incorporated model MM3200 Read Only Memory organized in a 4096×8 configuration as shown and described in the Supertex, Incorporated publication entitled "CM 3299/MM 3200 32,768 Bit Fully Static CMOS Read-Only Memory" dated April 1979, which publication is hereby incorporated by reference as if fully set forth herein. The RAM 22 preferably comprises a pair of Harris Corporation model HM-6513-L 512×4 RAM's (24 and 26) interconnected to provide a 512×8 memory array as shown in FIG. 2. Each model HM-6513-L is as shown and described in the Harris Semiconductor Products Division publication entitled "HM-6513 512×4 Cmos RAM" dated July 1978, which publication is hereby incorporated by reference as if fully set forth herein.

Referring now to FIG. 2, there is shown a schematic block diagram depicting the interconnection of the microprocessor 12, the memory address and control section 16, the bi-directional data bus 18, the ROM 20 and the first and second RAM's, 24 and 26 respectively. The bi-directional data bus 18 electrically connects the data bus portion (B0 through B7) of the microprocessor 12 to the outputs ($O_1$ through $O_8$) of the ROM 20 and the data input/output ports (DQ0 through DQ3) of the first RAM 24 and the second RAM 26 as shown in FIG. 2. The memory address and control section 16 includes eight electrical conductors which electrically connect the memory address outputs (MA0 through MA7) of the microprocessor 12 to the address inputs (A0 through A7) of the ROM 20, the first RAM 24 and the second RAM 26 as shown in FIG. 2.

In addition, the memory address and control sections 16 includes flip-flops 28, shift register 30, and flip-flop 32. In the preferred embodiment, the flip-flops 28 are an RCA type CD40174B "COS/MOS Hex'D'-Type Flip-Flop" as shown and described on pages 365 through 368 of the RCA Corporation publication entitled "COS/MOS Integrated Circuit", dated August 1978, the aforementioned portion of which publication is hereby incorporated by reference as if fully set forth herein. The shift register 30 is preferably an RCA type CD406B "COS/MOS 18-Stage Static Shift Register" as shown and described on pages 52 through 55 of the aforementioned RCA publication, which portion is hereby incorporated by reference as if fully set forth herein. The flip-flop 32 is preferably an RCA type CD4013B "COS/MOS Dual 'D'-Type Flip-Flop" as shown and described on pages 75 through 78 of the aforementioned RCA publication, which portion is hereby incorporated by reference as if fully set forth herein.

The memory address outputs, MA0 through MA4, of the microprocessor 12 are electrically connected respectively to the D1, D2, D4, D5, and D6 inputs of the flip-flop 28 as shown in FIG. 2. The timing pulse A output (TPA) of the microprocessor 12 is electrically connected to the clock input of the flip-flops 28 as well as the $D_1$ input of the shift register 30. The Q1, Q2, Q4 and Q5 outputs of the flip-flops 28 are electrically connected respectively to the address inputs, A8 through A11, of the ROM 20 as shown in FIG. 2. In addition, the Q6 output of the flip-flops 28 is electrically connected to the chip select 2 input ($\overline{CS_2}$) of the ROM 20 as well as the D input of the flip-flop 32. The $D_1+4'$ output of the shift register 30 is electrically connected to the clock input of the flip-flop 32. The $D_2+5$ output of the shift register 30 is electrically connected to the clear (CLR) control input of the microprocessor 12. The $\overline{Q}$ output of the flip-flop 32 is electrically connected to the chip enable inputs ($\overline{E}$) of the first RAM 24 and the second RAM 26. The memory write ($\overline{MRW}$) control output of the microprocessor 12 is electrically connected to the write enable ($\overline{W}$) inputs of the first RAM 24 and the second ram 26. Finally, the memory read ($\overline{MRD}$) control output of the microprocessor 12 is electrically connected to the chip select input 1 ($\overline{CS_1}$) of the ROM 20.

The circuit configuration shown within the dotted lines representing the memory address and control section 16 enables the microprocessor 12 to selectively address any one of the 4096 bit memory locations in the ROM 20; or any one of the 512 four bit memory locations in the first RAM 24 and, at the same time, a corresponding one of the 512 four bit memory locations in the second RAM 26. Selection of any one of the 4096 eight bit memory locations of the ROM 20 via address inputs A0 through A11 as well as application of the proper control signals as described in the Supertex, Incorporated publication previously referred to, will cause the data stored at that particular location to appear at the outputs, $O_1$ through $O_8$, of the ROM 20. This data will be presented to the data bus ports B0 through B7, by means of the bi-directional data bus 18. Similarly, the simultaneous selection of a particular one of the 512 four bit memory locations of the first RAM 24 and the second RAM 26, together with the proper application of the control signals as described in the Harris publication previously referred to, will cause the data stored in that particular location to appear on the four data in/out ports, DQ0 through DQ3, of each of the RAMs. This data is presented to the data bus ports, B0 through B7, of the microprocessor 12 by means of the bidirectional data bus 18.

Referring again to FIG. 1 of the drawing, the apparatus 10 of the present invention additionally includes an input data selector 34 and an output data selector 36 which are electrically connected to the microprocessor 12 by means of the bi-directional data bus 18 and an input/output command section 38. The output data selector 36 is electrically connected to a display processor/controller 40 by means of a data and control bus 42. The display processor/controller 40 is electrically connected to a display 44 by means of a display control bus 46. In addition, the display processor/controller 40 is electrically connected to the microprocessor 12 by means of a clock line 48.

Figure 3:
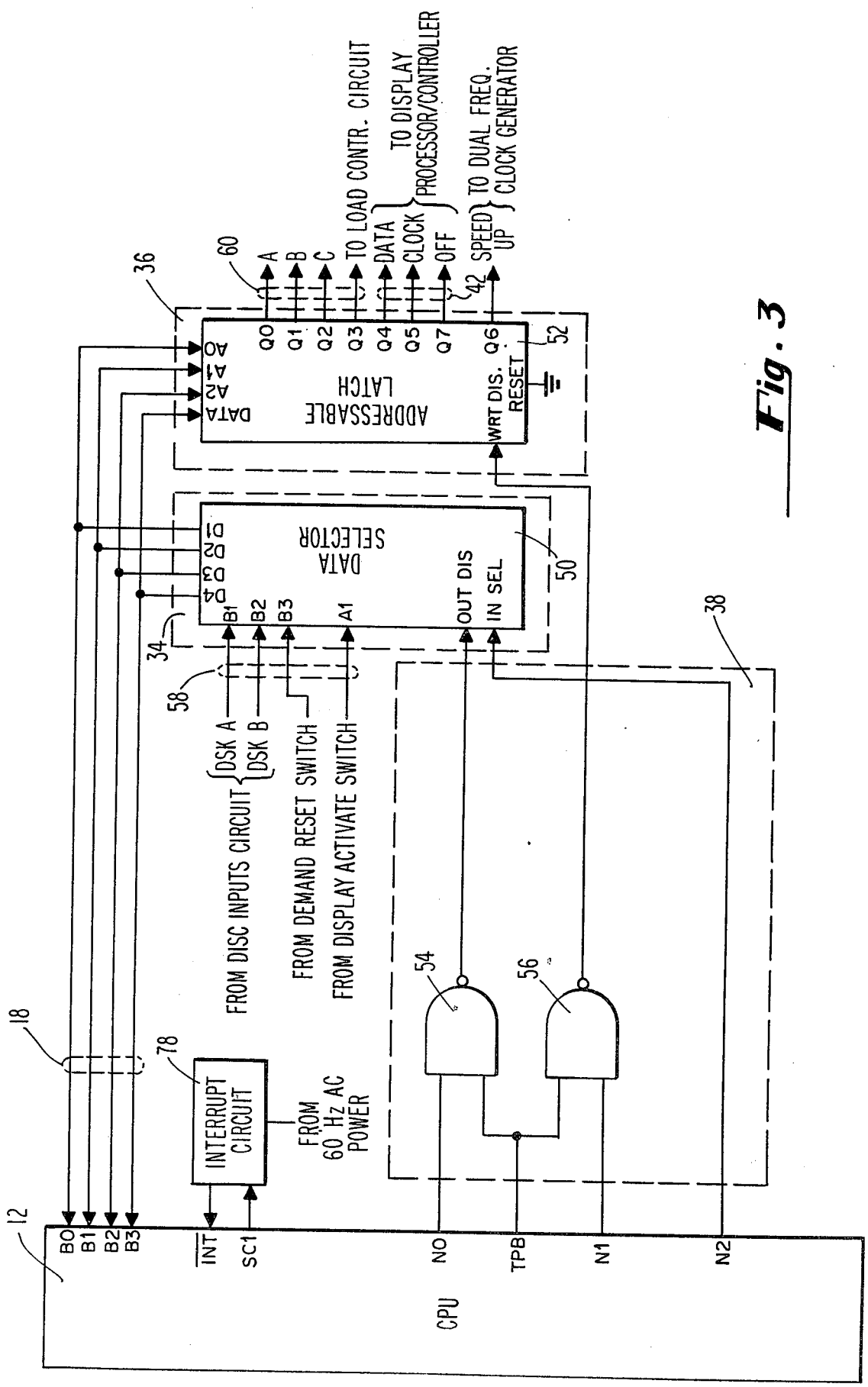
FIG. 3 is a schematic block diagram depicting the central processing unit, bi-directional data bus, input-/output command, inputs, input data selector, output data selector, outputs and data and control portions of the apparatus depicted in FIG. 1.

Referring now to FIG. 3, there is shown a schematic block diagram depicting the interconnection of the microprocessor 12, the input data selector 34, the output data selector 36 and the input/output command section 38. The input data selector 34 comprises an RCA type CD40257B "COS/MOS Quad 2-Line -to-1- Line Data Selector/Multiplexer" 50 as shown and described on pages 387 through 389 of the aforementioned RCA publication, which pages are hereby incorporated by reference as if fully set forth herein. The output data selector 36 comprises an RCA type CD4099B "COS/MOS 8-bit Addressable Latch", 52, as shown and described on pages 264 through 267 of the aforementioned RCA publication, which pages are hereby incorporated by reference as if fully set forth herein. The input/output command section 38 comprises a first two input NAND gate 54 and a second two input NAND gate 56. The first and second NAND gates, 54 and 56, are preferably RCA type CD4011B "COS/MOS NAND Gates" as shown and described on pages 67 through 70 of the aforementioned RCA publication, which pages are hereby incorporated by reference as if fully set forth herein.

Inputs 58 are electrically connected to the data selector 50 as shown in FIG. 3, with the input from disc circuit A (DSK A) being electrically connected to input terminal B1; the input from disc circuit B (DSK B) being electrically connected to input terminal B2; the input from a demand reset switch being electrically connected to input terminal B3 and the input from a display activate switch being electrically connected to input terminal A1. In the preferred embodiment, the inputs DSK A and DSK B, are developed from the rotating disc of a watt-hour meter. Optical electronics convert the disc rotation information, as developed by sensing slot locations, to electrical signals over the two lines going to the input data selector 50. These signals are indicative of the amount of electrical energy being consumed in the measured system. Such a meter is shown and described in U.S. Pat. No. 4,179,654, "Demand Meter Including Means for Selectively Controlling the Length of Demand Intervals", issued to Germer and assigned to the assignee of the present invention, which patent is hereby incorporated by reference as if fully set forth herein. The demand reset switch is preferably a manually activated momentary switch and the display activate switch is preferably a magnetically activated momentary switch. The outputs D1 through D4 of the data selector 50, are electrically connected to data input/output ports B0 through B3 respectively of the microprocessor 12 by means of the bi-directional data bus 18.

Outputs 60 from the addressable latch 52 comprise alert signals A, B, and C and a load control signal from outputs Q0, Q1, Q2, and Q3 respectively of the addressable latch 52. The output terminals Q0, Q1 and Q2 are electrically connected to external alert circuits while the output terminal Q3 is electrically connected to a load control circuit. The output terminals Q4, Q5 and Q7, generating data, clock, and OFF signals respectively, are electrically connected to the display processor/controller 40. The input/output data terminals, B0 through B3, of the microprocessor 12 are electrically connected to the address input terminals A0 through A2, and the data input terminal respectively of the addressable latch 52 by means of the bi-directional data bus 18.

The input/output command output 0 (N0) terminal of the microprocessor 12, is electrically connected to one input of the first two input NAND gate 54. The timing pulse B (TPB) output terminal of the microprocessor 12 is electrically connected to the other input of the first two input NAND gate 54 and one input of the second two input NAND gate 56. The input/output command output 1 (N1) terminal of the microprocessor 12 is electrically connected to the other input of the second two input NAND gate 56. The output of the first NAND gate 54 is electrically connected to the output disable terminal of the data selector 50. The output of the second NAND gate 56 is electrically connected to the write disable terminal of the addressable latch 52. The input/output command output 2 (N2) terminal of the microprocessor 12 is electrically connected to the input select terminal of the data selector 50. By generating the appropriate command and control signals at its terminals N0, TPB and N2, as will be subsequently described, the microprocessor can cause data representative of the selected input 58 to appear at the the data output terminals D1 through D4 of the data selector 50. Similarly, by generating the appropriate signals at its output terminals TPB and N1, as will be subsequently described, the microprocessor 12, can cause output data from its input/output data terminal B3 to appear at a selected one of the output terminals Q0 through Q7 of the addressable latch 52 as determined by the signals appearing on the input/output data terminals B0 through B2 of the microprocessor 12.

Figure 4:
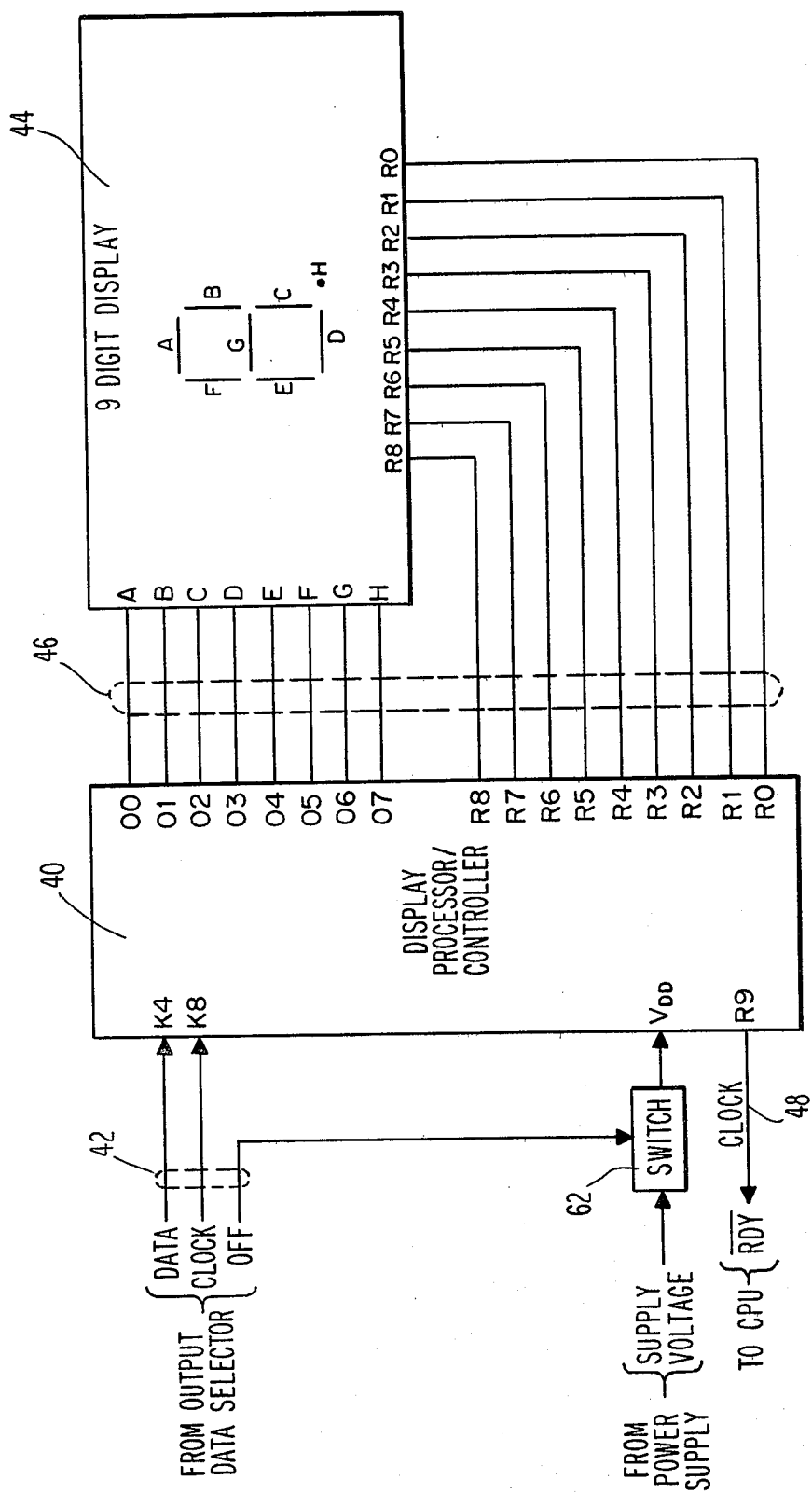
FIG. 4 is a schematic block diagram depicting the display processor/controller and display portions of the apparatus depicted in FIG. 1.

Referring now to FIG. 4, there is shown a schematic block diagram depicting the interconnection of the display process/controller 40 and the display 44 by means of the display control bus 46. In the preferred embodiment, the display processor/controller is a Texas Instruments type TMS1070 microcomputer as shown and described in the Texas Instruments Incorporated publication entitled "TMS1000 Series Data Manual MOS/LSI 10-Chip Microcomputers" dated December 1976, which publication is hereby incorporated by reference as if fully set forth herein. The dispaly 44 is preferably a Futaba model No. 9-ST-68 9-Digit Vacuum Flourescent Display as shown and described in the Futaba Corporation publication entitles "Flourescent Display Panel" 1979 Edition, page 5., which publication is hereby incorporated by reference as if fully set forth herein. "O" outputs O0 through O7 of the display processor/controller 40 are electrically connected to the segment control inputs A through H respectively of the display 44 by means of the display control bus 46. The "R" outputs R0 through R8 of the processor/controller 40 are electrically connected to the digit control inputs R0 through R8 respectively of the display 44 by means of the display control bus 46. The data and clock outputs from the output data selector 36 are electrically connected to the K4 and K8 inputs respectively of the processor/controller 40. The OFF output from the output data selector 36 controls and electronic switch 62 which selectively controls the appropriate supply voltage from a power supply and control circuit 64 (see FIG. 1) to the supply voltage terminal $V_{DD}$ of the display processor/controller 40. The R9 terminal of the processor/controller is electrically connected to the input/output flag input 2 ($\overline{EF2}$) terminal of the microprocessor 12 via the clock line 48.

Referring again to FIG. 1, there is shown the block representation of a power supply and control circuit 64 which supplies the appropriate voltages to the various components of the multiple rate metering apparatus 10. The power supply and control circuit 64 derives its primary source of power from the monitored power distribution system; however, it also includes a carryover battery 66 for supplying carryover power to the apparatus 10 in the event of a power outage in the monitored distribution system. In the preferred embodiment, the power supply and control circuit 64 comprises the preferred embodiment of the power supply and control apparatus shown and described in copending U.S. Pat. No. 4,342,922 entitled "AC Fail-detect and Battery Switchover Circuit for Multi-bus Power Supply" of Donald V. DiMassimo and John B. May, assigned to the assignee of the present invention, which patent is hereby incorporated by reference as if fully set forth herein. As set forth in the aforementioned patent, the power supply and control circuit 64 includes AC fail battery switchover, battery test, and interrupt generating circuits which monitor the primary and secondary (carryover) power sources and provide for continued operation, in a reduced keep-alive mode which keeps track of passing time (which will be subsequently described), during a primary power outage.

Also shown in FIG. 1 is a block representation of a dual frequency clock generator 68, as disclosed by Donald V. DiMassimo and John B. May in U.S. patent Ser. No. 4,365,203, entitled "Multi-frequency Clock Generator With Error-free Frequency Switching", which patent is assigned to the assignee of the present invention and which is hereby incorporated by reference as if fully set forth herein. The clock output of the dual frequency clock generator 68 is electrically connected between the clock (CLK) and crystal ($\overline{XTAL}$) terminals of the microprocessor 12 (as shown in FIG. 2), providing the clock frequency necessary to operate the microprocessor 12. As stated in the aforementioned patent, the dual frequency clock generator 68 is capable of supplying a clock signal having a higher frequency, approximately 1 $MH_z$ in the preferred embodiment, during a first mode of operation, and a lower frequency, 1 KHz in the preferred embodiment, during a second operating mode. In the preferred embodiment of the multiple rate metering apparatus 10 of the present invention, the dual frequency clock generator 68 will provide the higher frequency clock (1 $MH_z$) during normal operation and the lower frequency clock (1 $KH_z$) during periods of primary power outages.

Figure 5:
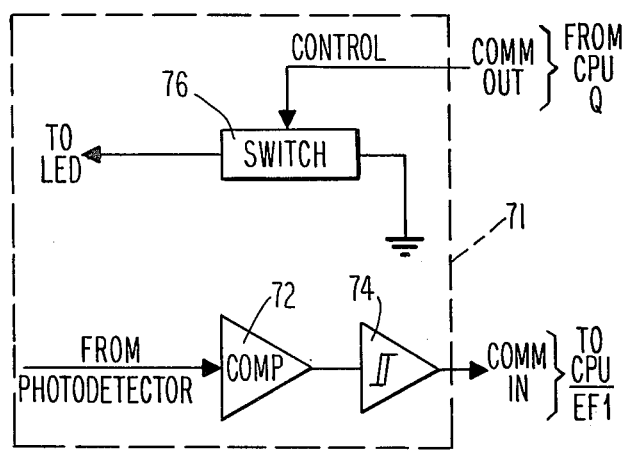
FIG. 5 is a schematic block diagram depicting a portion of a communication link interface circuit referred to in FIG. 1.

In FIG. 1, there is also shown a communication link interface circuit 70 which is electrically connected to the input/output flag input 1 ($\overline{EF1}$) and the Q output (Q) terminals of the microprocessor 12. The communication link interface circuit comprises a photo detector and a light emitting diode, in addition to these components depicted within the dotted line 71 in the schematic block diagram of FIG. 5. As shown in FIG. 5, the signal from the photo detector is connected to the input of an amplifier comparator 72, the output of which is connected to the input of a Schmitt trigger 74. The output of the Schmitt trigger 74 (hereinafter referred to as COMM IN) is electrically connected to EF1 terminal of the microprocessor 12. In the preferred embodiment, the comparator 72 is a RCA type CA 139G Quad Comparator as shown and described on page 9 of RCA publication entitled "RCA Solid State Integrated Circuits Manual SSD 240A", dated 1978, which pages are hereby incorporated by reference as if fully set forth herein. The Schmitt trigger 74 is preferably an RCA type CD 40106 B "COS/MOS Hex Schmitt Trigger", as shown and described on pages 335 through 338 of the RCA "COS/MOS Integrated Ciruits" publication hereintofore referred to, which pages are hereby incorporated by reference as if fully set forth herein. The Q output from the microprocessor 12 is electrically connected to an electronic switch 76 which controls the application of power to the light emitting diode (LED) of the communication link interface circuit 70.

The operation of the communication link interface circuit 70 is as follows. An optical communication link, having a light transmitter (for example an LED) and a light detector (for example a photo transistor), is connected to the communication link interface circuit in a complementary relationship with the LED and photodetector of the interface circuit 70. In the preferred embodiment, the LED and photodetector of the interface circuit 70 are mounted side by side in an optical port of the multiple rate metering apparatus 10 of the type shown and described in U.S. patent application Ser. No. 190,217, inventors Germer, et al, entitled "Magnetic Optical Coupler for Utility Meters and the Like", assigned to the assignee of the present invention and hereby incorporated by reference as if fully set forth herein. This interconnection permits the LED of the optical link to align with the photo detector of the interface circuit 70 while the photo detector of the optical link is positioned opposite the LED of the interface circuit 70. Upon the detection of light emitted from the LED of the optical link, the photo detector of the interface circuit 70 generates a signal which is input to the Schmitt trigger 74 through the comparator 72. The Schmitt trigger 74 generates a pulse which is coupled to the EF1 terminal of the microprocessor 12. In addition, a signal generated by the microprocessor 12 at its Q output terminal, will cause the electronic switch 76 to complete a power circuit to the LED of the interface circuit 70 causing the LED to emit light. This emitted light is detected by the photo detector of the optical link which in turn generates a signal for use at the other end of the optical link.

Figure 6:
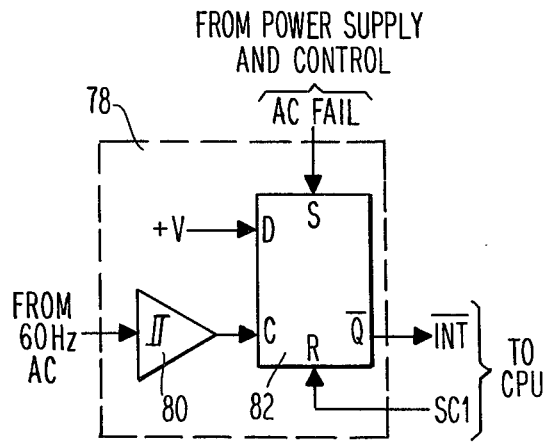
FIG. 6 is a schematic block diagram depicting the preferred embodiment of an Interrupt circuit referred to in FIG. 3.

Referring again to FIG. 3, an interrupt circuit is electrically connected to the 60 Hz AC power system. FIG. 6 depicts a schematic block diagram of the interrupt circuit 78 which comprises a Schmitt trigger 80 having an output which is electrically connected to the clock (C) input of a flip-flop 82. The Schmitt trigger is preferably an RCA type CD 4016 B and the flip-flop is preferably and RCA type CD 4013 B, both of which types have been previously described in this specification. The input of the Schmitt trigger 80 is electrically connected through an RC network to the 60 Hz power line. The reset input (R) of the flip-flop 82 is electrically connected to the state code 1 (SC1) terminal of the microprocessor 12. The $\overline{Q}$ output of the flip-flop 82 is electrically connected to the interrupt ($\overline{INT}$) terminal of the microprocessor 12. The set (S) input of the flip-flop 82 is electrically connected to the AC FAIL output of the power supply and control circuit 64. Since the input of the Schmitt trigger is connected to the 60 $H_z$ line, the Schmitt trigger will output a pulse to the C input of flip-flop 82 once a cycle or once every 17 msecs. As a result, the flip-flop generates an interrupt signal to the microprocessor 12, as shown and described on pages 80 and 81 of the RCA Microprocessor Manual previously referred to, every 17 msecs.

For purposes of clarity, the functional characteristics of the multiple rate metering apparatus 10 will be summarily set forth at this point prior to a description of the detailed operation of the apparatus 10. The apparatus 10 is programmable and reprogrammable to meet changing rate designs utilizing the through-the-cover optical communication link 70, preferably using a portable programmer/tester (not shown). This same link can be implemented for automated reading and recording of meter data if desired. The preferred embodiment of the apparatus 10 is programmable for 5 years, regardless of how many of the programmable functions are used. It can accomodate up to 10 holidays per year and 4 seasonal rate changes per year. The time of use schedule can be different for each season with up to 8 daily set points on quarter hour intervals. In addition, the apparatus can accomodate a weekend/holiday schedule for each season with up to 6 daily set points on quarter hour intervals. Daylight savings time changes and leap year are also accomodated.

Thirty-three registers are displayable on the 9 digit vacuum flourescent display 44, which display can be programmed to sequence through the quantities selected for display at preselected times. The display is also capable of being activated by a magnetic wand which when placed in proximity to the magnetic display activate switch previously described, activates the switch. The wand can be used to fast forward the display until the desired quantity is located, or single step the display to the next register if desired. In addition, holding the magnetic wand at the meter for greater than a preselected time period (one second in the preferred embodiment) can initialize the display to the first quantity. Two disc inputs are available to the input data selector 34. As previously stated, these inputs are developed from the rotating disc of the kilowatt hour meter as is commonly known in the power metering art. Other inputs to the input data selector 34 include reset demand and display activate.

The output data selector 36 is used to couple information from the microprocessor 12 to three alert outputs A, B and C. Each alert output is active when the time of use period associated with that particular alert is presently in existence; and, as each rotation of the disc occurs, that particular alert will develop a pulse on its output. In the preferred embodiment, optical couplers-/isolaters develop an electrically isolated output pulse for each rotation of the disc. In addition, a load control output from the output data selector 36 activates a relay, the contacts of which can be used to selectively control an external load. Other outputs from the data selector 76 are used to transmit data and control signals to the display processor/controller 40 and to control the output frequency of the dual frequency clock generator 68. As previously stated, the dual frequency clock generator 68 provides a high frequency clock signal (approximately 1 $MH_z$) to the microprocessor 12 during normal operations, and a low frequency clock signal (1 $KH_z$) during AC power outage conditions. The interrupt circuit 78 shown in FIG. 3, activates an interrupt routine, which will be subsequently described, either because of an AC power failure or because of a normal (60 Hz derived) input pulse.

The power supply and control circuit 64, includes multiple DC voltage sources, powered from transformer supplies which are coupled to the monitored power system and which provide normal operating voltages for the various components of the apparatus 10. During conditions of power failure in the monitored system, an AC fail and battery switchover circuit portion of the power supoly and control 64 switches a 2-cell lithium battery 66 onto a critical voltage bus, as described in the aforementioned U.S. Pat. No. 4,342,922. In the preferred embodiment of the multiple rate motering apparatus 10 of the present invention, this critical voltage bus supplies the miroprocessor 12, the ROM 20, the RAMs 24 and 26, the input data selector 34, the output data selector 36, the dual frequency clock generator 68 and the interrupt circuit 78 during the power failure interval.

Figure 7:
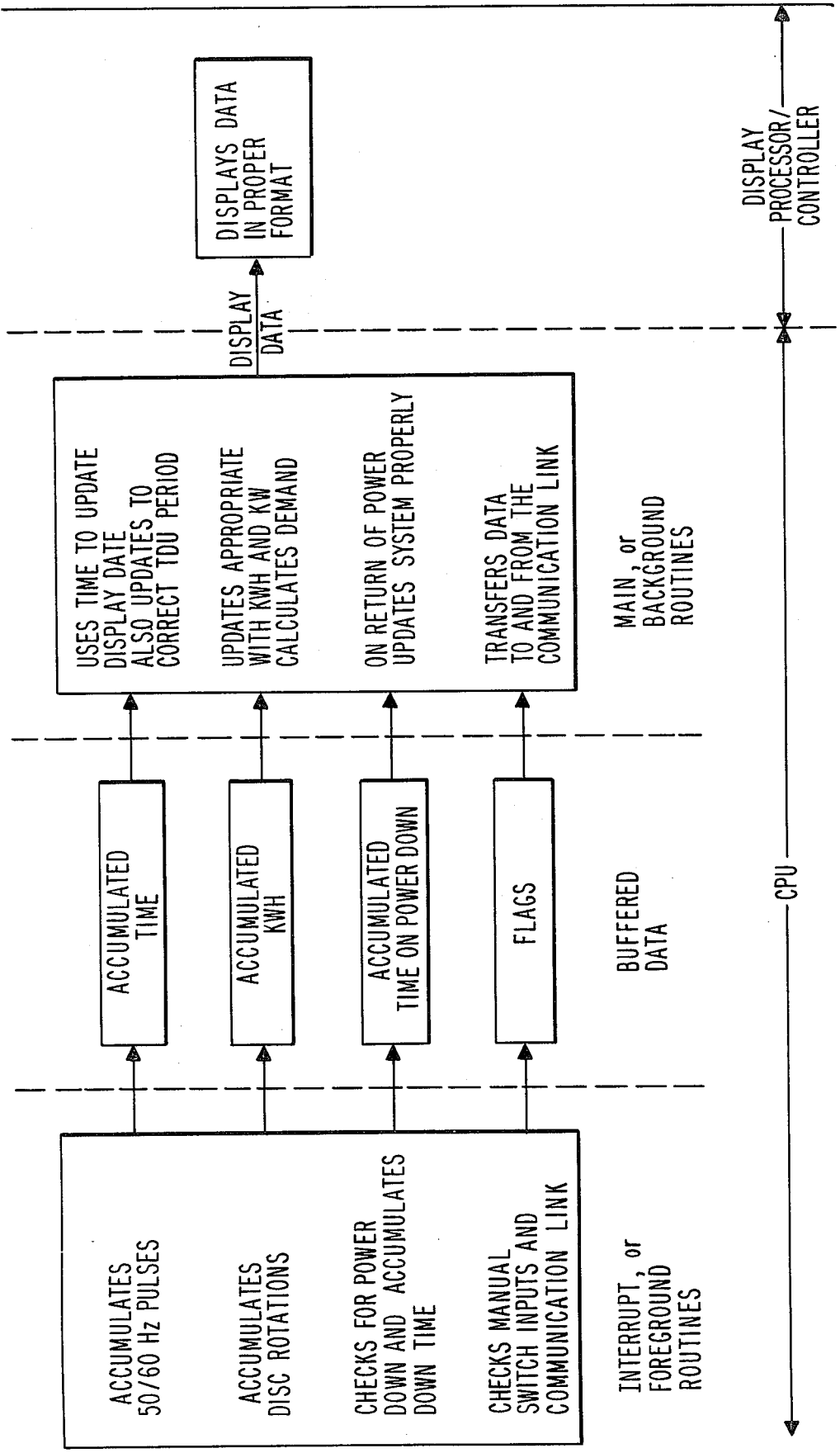
FIG. 7 is a block diagram depicting the interrelationships of the programs resident in the apparatus of the present invention.

The operation of the apparatus 10 is as follows. The operation of the multiple rate metering apparatus 10 of the present invention is controlled by unique combination of 3 co-resident programs, the inter-relationships of which are depicted in the block diagram shown in FIG. 7. The first of these is a data aquisition program which runs in the foregound and is entered at a 60 $H_z$ rate. This is identified as the Interrupt routine, having a power down routine as a subset. A second co-resident program is identified as a Main program, which comprises a computation routine and which also operates the display processor-controller 40 which activates in turn the nine digit vacuum flourescent display 44. In the preferred embodiment, the operation of the Main program is suspended during the power down time. A third program is Self-test routine, which performs internal housekeeping functions and which is suspended during power down and over-ridden, if required, by the Main program.

Figure 8:
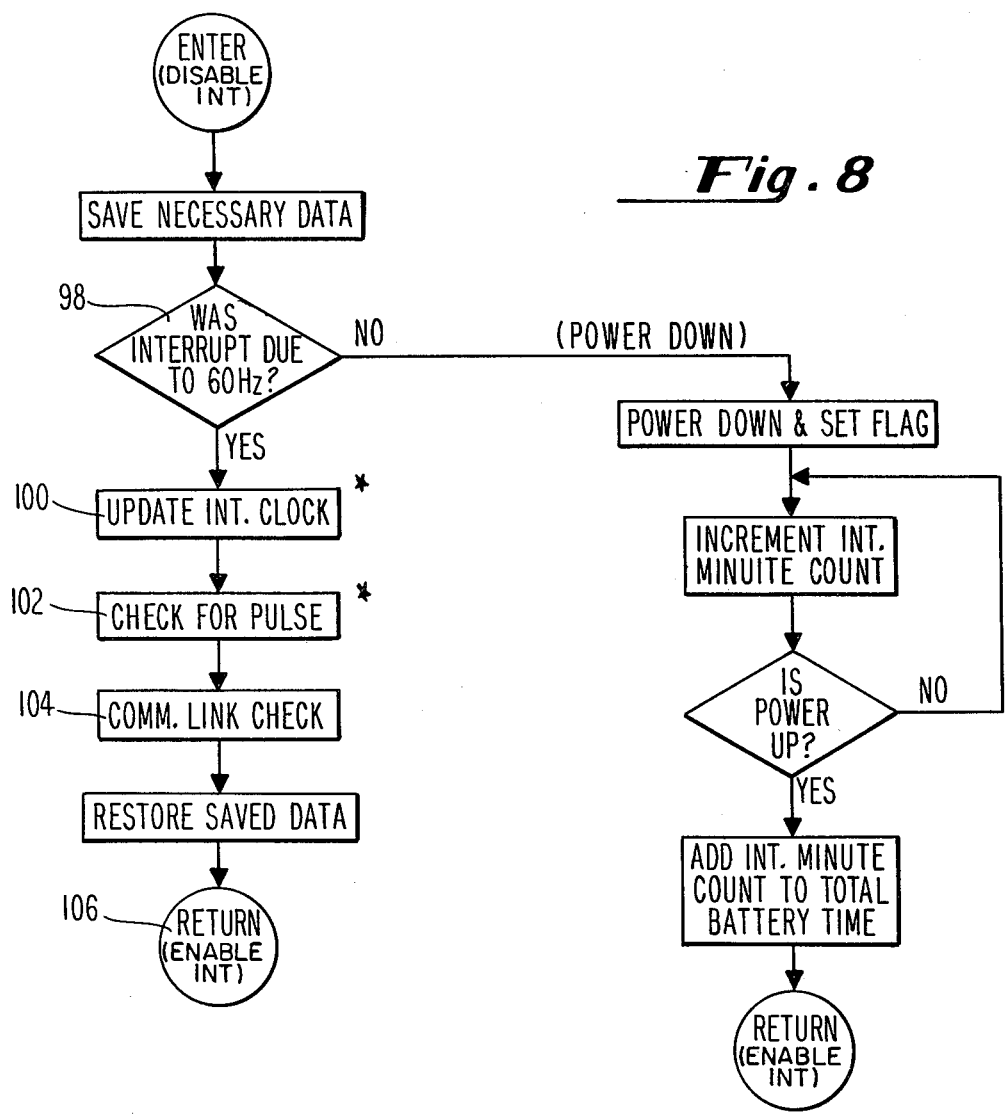
FIG. 8 is a flow chart of the preferred embodiment of an Interrupt routine of the present invention.

On each 60 Hz cycle, the interrupt circuit 78 develops an interrupt input to $\overline{INT}$, which causes the microprocessor 12 to enter an interrupt routine. FIG. 8 depicts a flow diagram of the interrupt routine. The interrupt routine determines the cause of the interrupt, step 98, by examining a flag signal at $\overline{EF3}$ which would be set high by the power supply and control circuit 64 if an AC failure had caused the interrupt. The AC fail signal is developed in the AC fail and battery switchover circuit portion of the power supply and control circuit 64 as described in U.S. Pat. No. 4,342,922 previously referenced. If the interrupt was not caused by an AC failure, a register in the microprocessor 12, called an "interrupt clock", is updated, step 100. The register in the data selector 50 holding pulses from the disc is then checked for any increments since the last 60 Hz increment, step 102. A communication link input bit register, an 80 bit register in the preferred embodiment which holds the last 80 bits detected on the communication link 70, is checked, step 104, to see if a proper code has been received. The program will then return, step 106, and enable interrupts again.

Figures 9, 10:
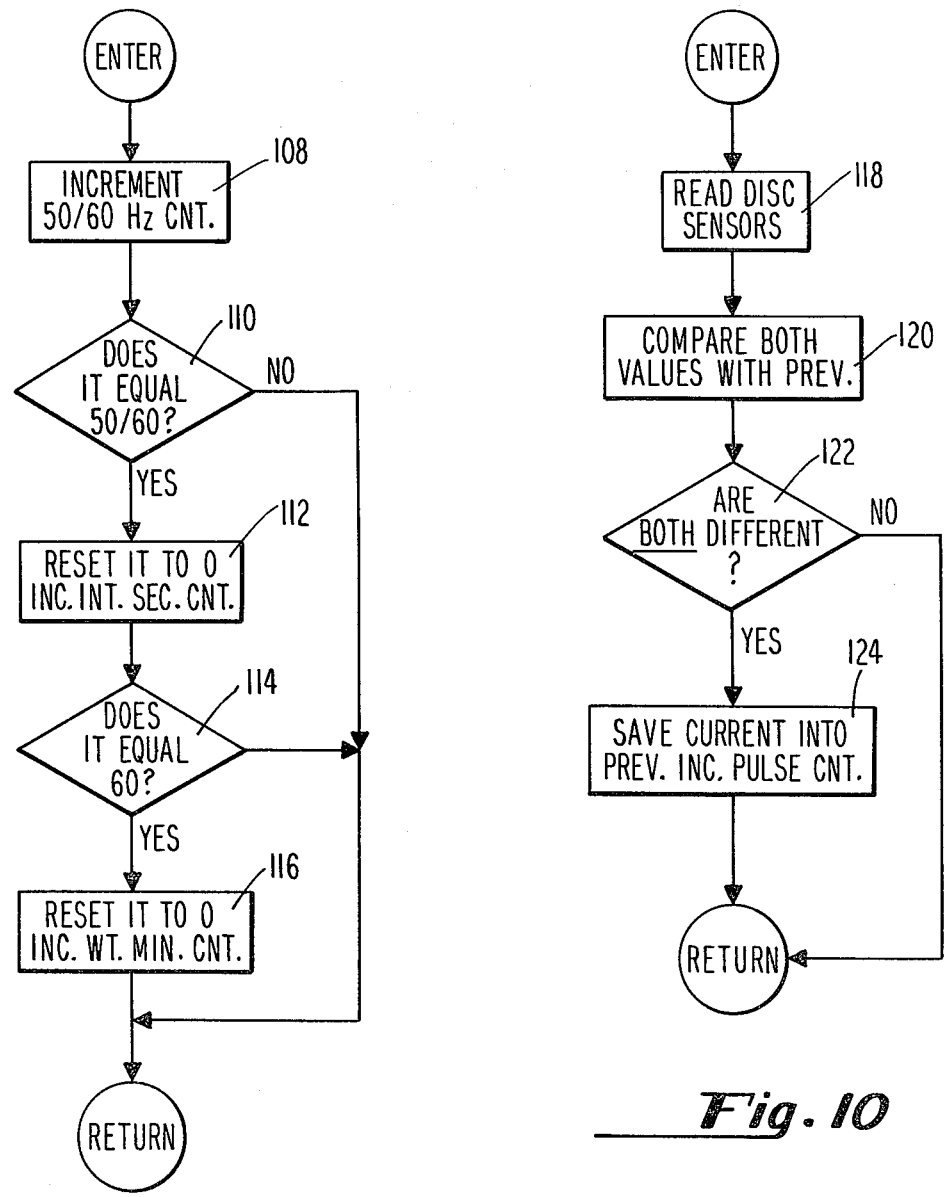
FIG. 9 is a flow chart of the preferred embodiment of an up-date Interrupt clock subroutine referred to in FIG. 8.
FIG. 10 is a flow chart of the preferred embodiment of a check for pulse subroutine of the Interrupt routine referred to in FIG. 8.

FIG. 9 depicts a flow diagram showing the steps in the update interrupt clock step 100 of FIG. 8. As shown in FIG. 9, a 60 Hz counter is incremented by 1, step 108, and tested to see if it equals 60, step 110. If not, the program will perform step 102 of the Interrupt routine depicted in FIG. 8. If it does equal 60, the 60 Hz counter is reset to zero and a seconds counter is incremented by 1, step 112. The contents of the seconds counter is then tested, step 114, to see if it equals 60. If it does not, the program returns to step 102 of the Interrupt routine as shown in FIG. 8. If it does, the seconds counter is reset to zero and an interrupt minutes counter is incremented by 1, step 116, after which the program returns to step 102 of the Interrupt routine shown in FIG. 8.

FIG. 10 is a flow diagram depicting the steps of the check for pulse step 102 of the Interrupt routine of FIG. 8. The disc sensors, A and B, are read, step 118, and compared, step 120, with respective previous values. They are then tested, step 122, to see if they are both different from their respective previous values. If not, the program will return to step 104 of the Interrupt routine shown in FIG. 8. If they are both different, the current values are substituted for the previous values and a pulse count register is incremented by 1, step 124. Thereafter the program will return to step 104 of the Interrupt routine depicted in FIG. 8. In the preferred embodiment it should be noted that the previous value will be either 11 or 00. This method will count forward and backward and reject 90% jitter.

Figure 11:
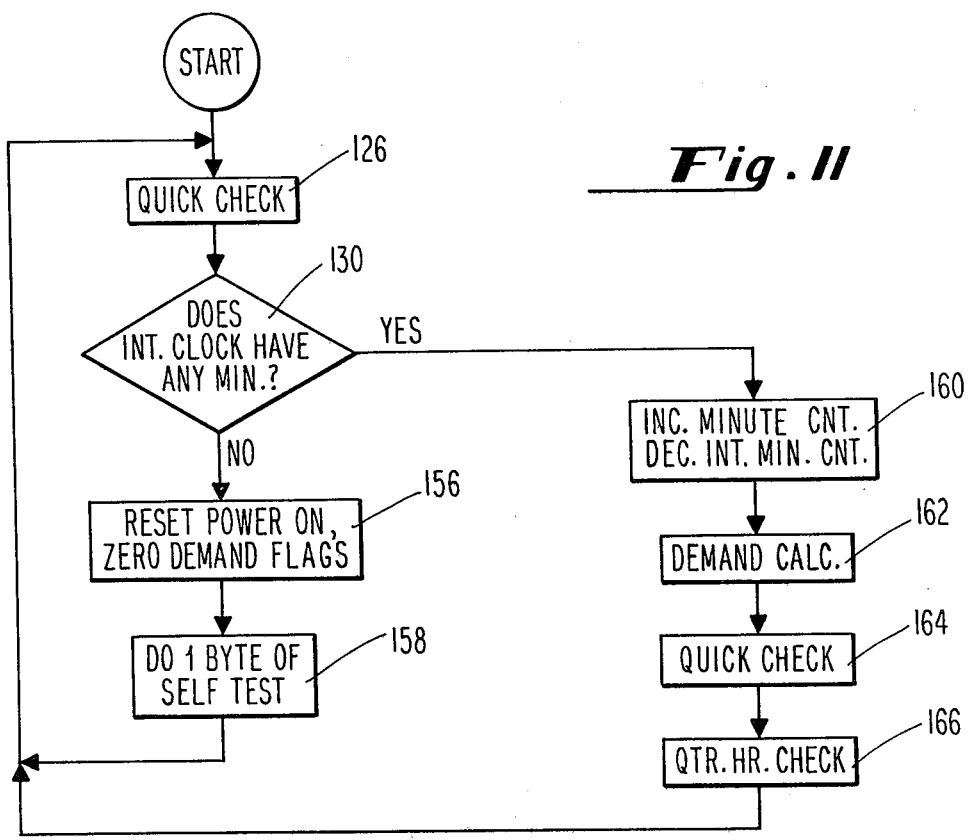
FIG. 11 is a flow chart of the preferred embodiment of a Main program of the present invention.
Figure 12:
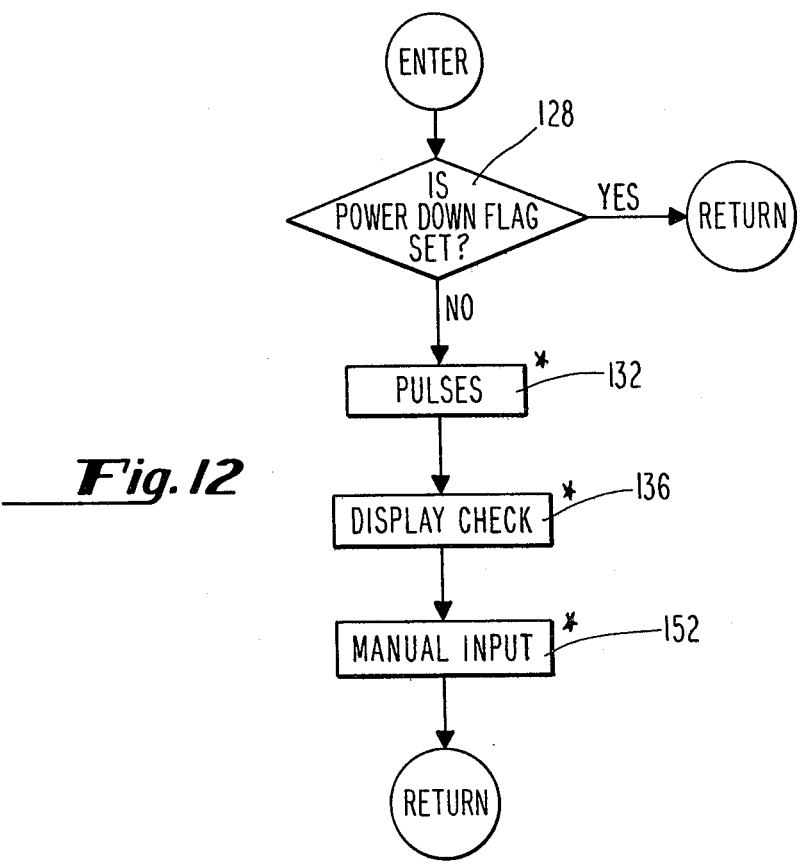
FIG. 12 is a flow chart of the preferred embodiment of a quick check subroutine of the Main program referred to in FIG. 11.
Figure 15:
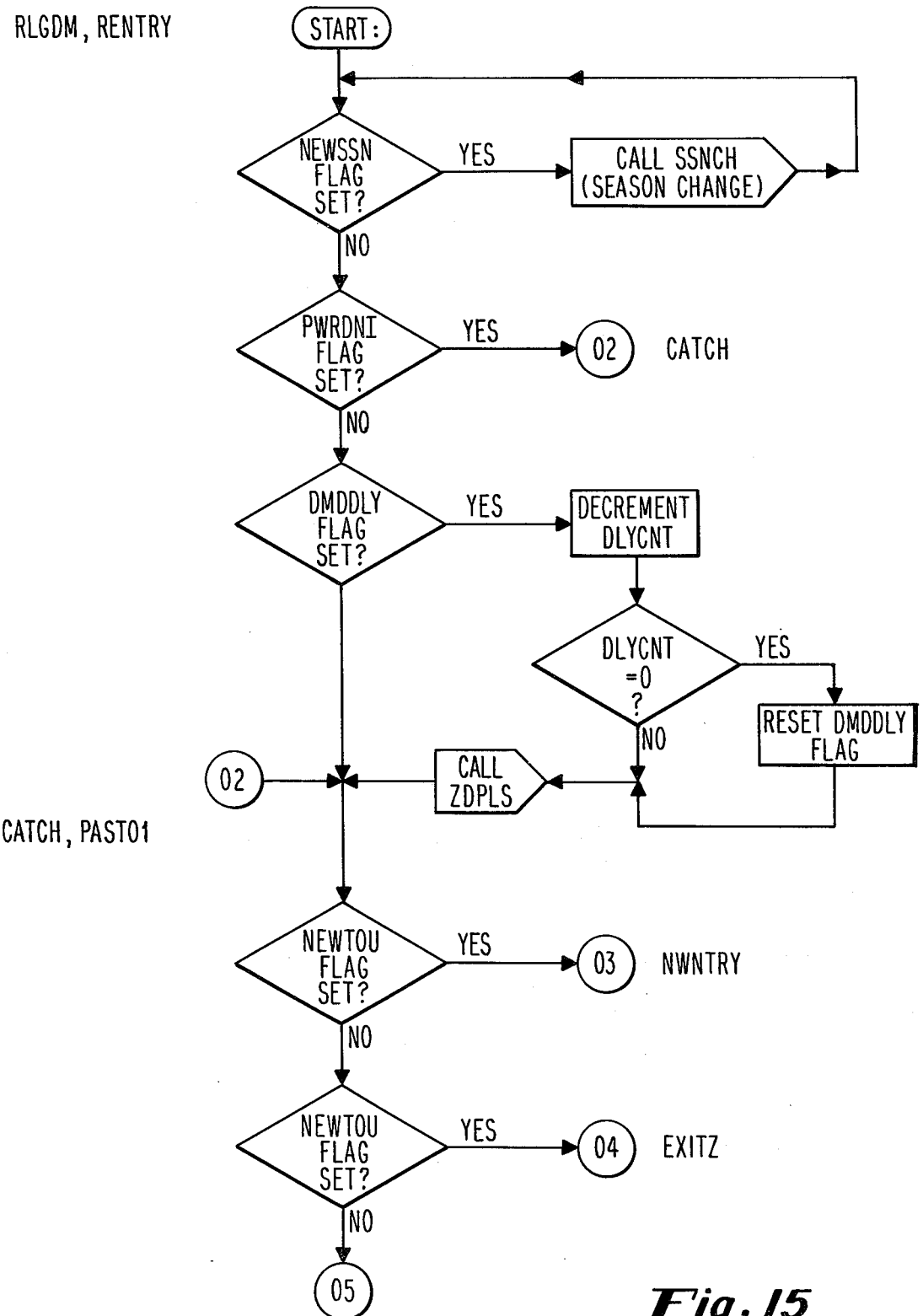
Figure 16:
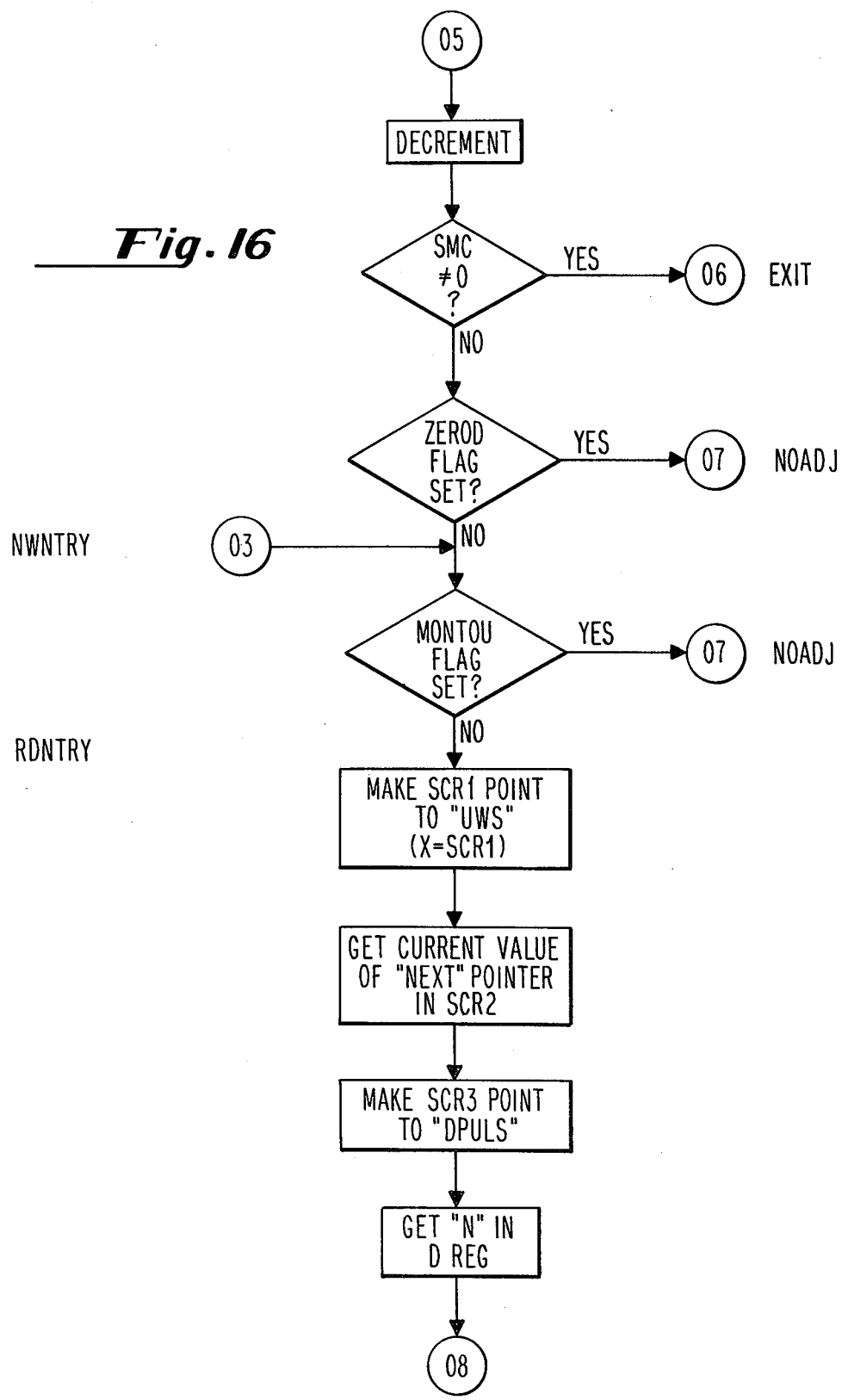
Figure 17:
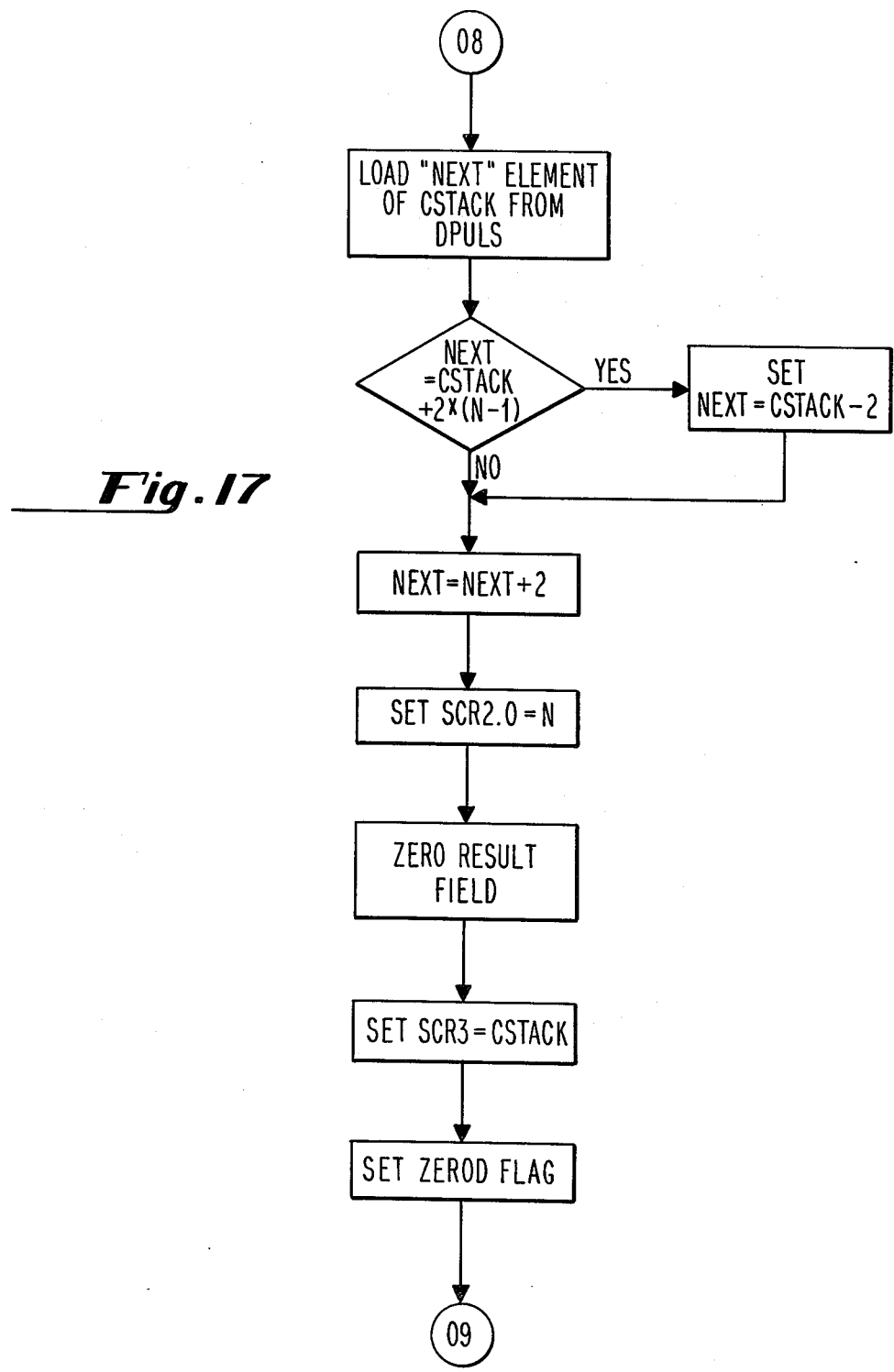
Figure 18:
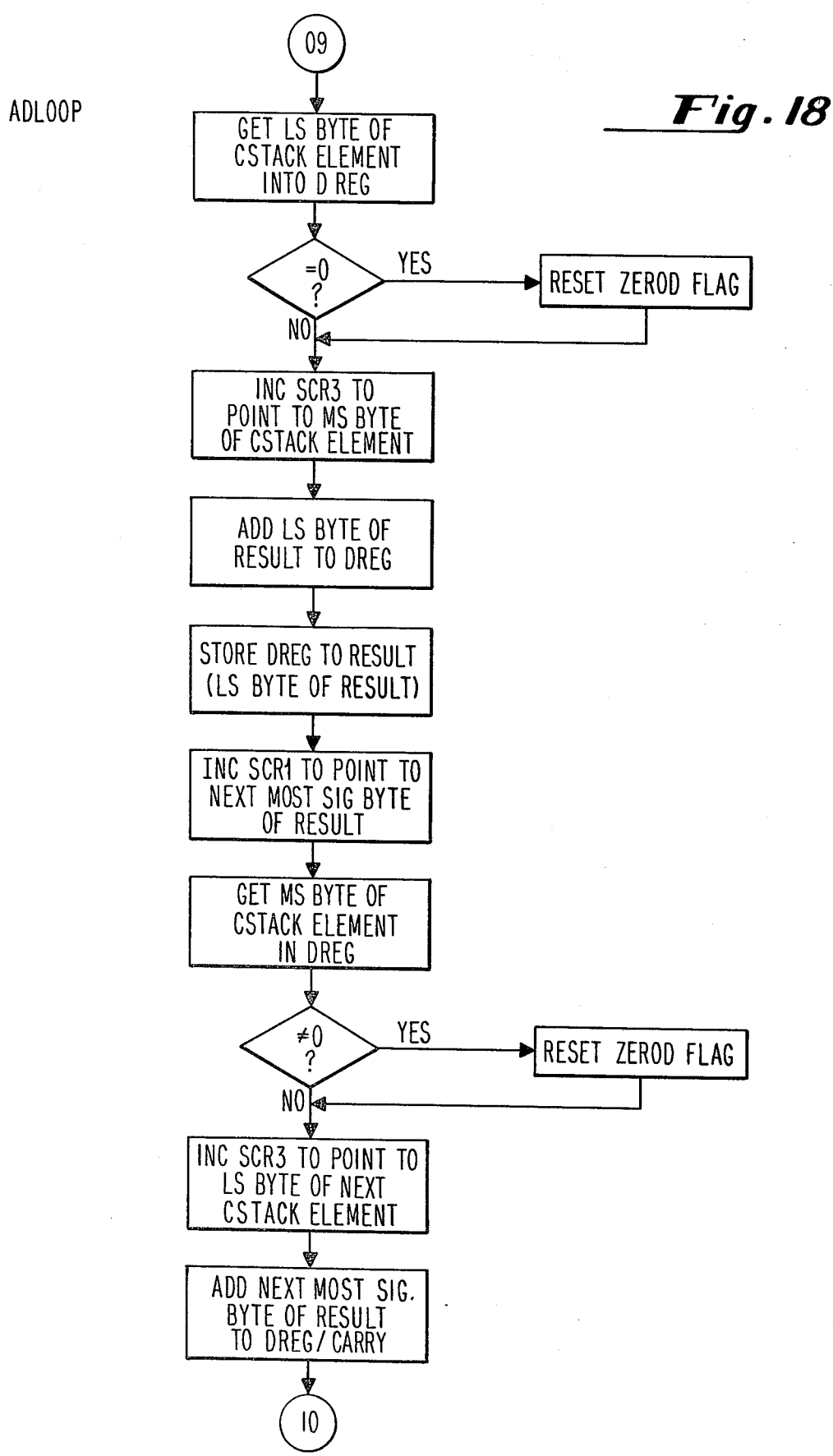
Figure 19:
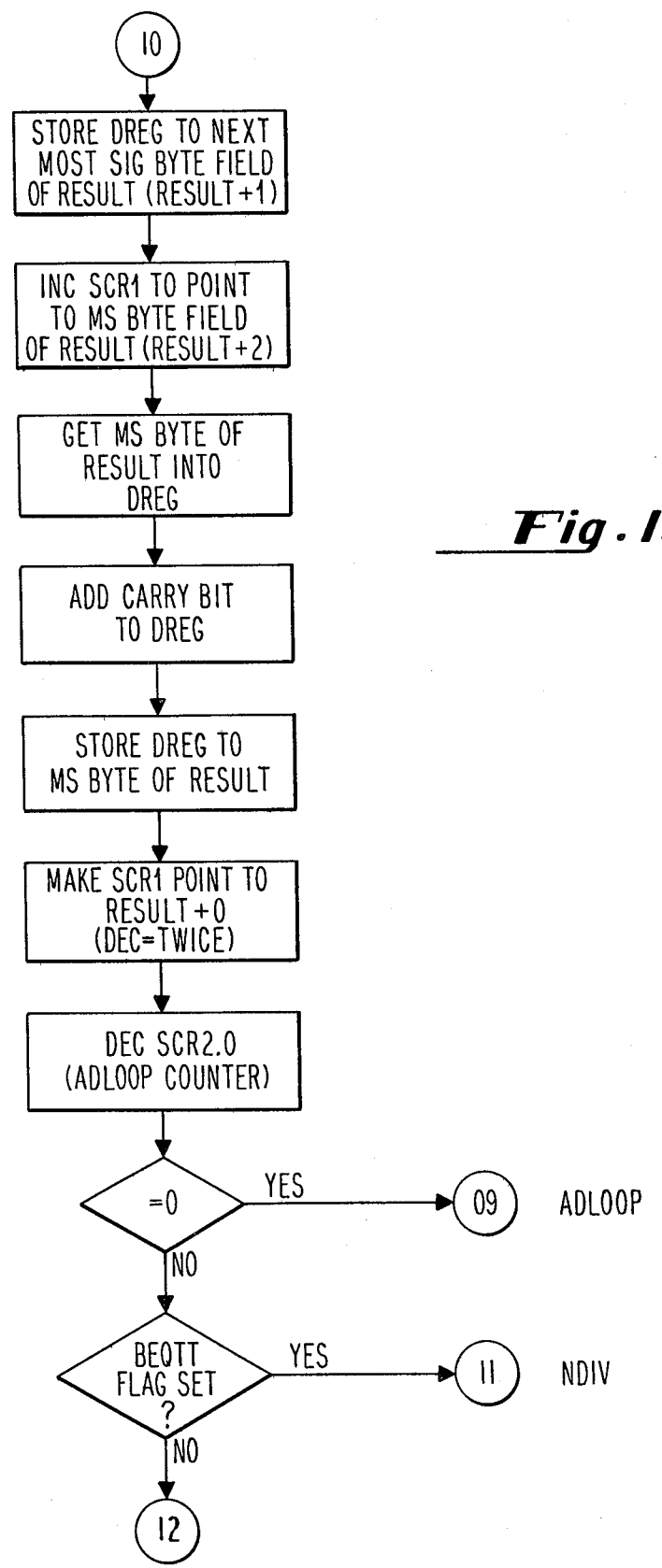

As previously stated, when not actually engaged in the performance of the Interrupt, or foreground routine, the program enters the Main routine which performs the following operations. FIG. 11 depicts the flow diagram for the main routine. As shown in FIG. 11, the main routine starts with a quick check 126, the flow diagram of which is depicted in FIG. 12. As shown in FIG. 12, the power down flag $\overline{EF3}$ is tested, step 128 to see if it is set. If it is set, the program returns to the next step 130 depicted in FIG. 11. If the power down flag $\overline{EF3}$ is not set, the program enters the pulses step 132 as depicted in FIG. 13. First, the program checks to see if there are any pulses in the interrupt counter, step 134. If no pulses, the program returns to the next step 136 as indicated in FIG. 12. If there are pulses in the interrupt counter, the interrupt pulse counter is decremented by 1, step 138, then the pulse counter is incremented by 1 and checked for maximum, step 140, at which time the program again tests, steps 134, to see if there are any pulses in the interrupt counter. If the maximum count is reached, the pulse counter is reset to zero.

Returning now to FIG. 12, the program then performs a display check 136 as shown in more detail by the flow diagram of FIG. 14. The first test 142 is to deterine whether the apparatus is in manual display mode. If not, it is then tested, step 144, to see if the manual display flag is set. If not, the time is tested, step 146, to see whether or not the current time is between 6:00 a.m. and 6:00 p.m. If the time is between 6:00 a.m. and 6:00 p.m., a test is made, step 148, to see if the display processor/controller 40 is ready for data. If the processor/controller 40 is ready for data, the data is displayed, step 150, and the program returns to the next step 152 in the quick check routine as shown in FIG. 12. If the apparatus is in the manual display mode, step 142, the program immediately proceeds to determine whether or not the processor/controller 40 is ready for data, step 148.

If the manual display flag is set, step 144, the display pointers, the processor/controller 40, and the manual display flag are reset; and the manual display mode is set, step 154. The program then proceeds to check to see if the processor/controller is ready for data, step 148, and continues as previously described. If the time is not between 6:00 a.m. and 6:00 p.m., the program immediately proceeds to the next step 136 as shown in FIG. 12. If the processor/controller 40 is not ready for data, the program also returns to the next step 152 as shown in FIG. 12. Referring again to FIG. 12, after the display check 136 is performed, a manual input step 152, which checks manual inputs, debounces them and sets a reading flag on the rising edge, is performed. At this point, the program returns to the next step 130 in the main routine as shown in FIG. 11.

Referring back to FIG. 11, after the initial quick check 126 is performed, the next step 130 involves a check to determine whether the interrupt clock register contains any minutes. If not, this indicates that the main program has caught up and therefore it resets, step 156, the power down and zero demand flags, following which, the first byte of the self test routine is performed, step 158. After performance of the first byte of the self test routine, the program returns again to the quick check step 126 as previously described. If the interrupt clock register contains any minutes, the minute count is incremented and the interrupt minute count is decremented by one, step 160. A demand calculation, step 162, is then performed, followed by another quick check, step 164, which is then followed by a quarter hour check, step 166. After this, the main program again returns to the initial quick check step 126 and follows through as previously described. The demand calculation and quarter hour checks, 162 and 166, are described as follows.

FIGS. 15 through 31 are detailed flow charts depicting the steps performed by the apparatus of the present invention in order to obtain measurements of demand. The following description utilizes the mnemonics set forth in the blocks of these flow charts, thereby enabling the reader to readily use the flow charts as an aid to better understanding the written description, if necessary.

To understand the calculation of demand in the preferred embodiment of the present invention, a number of parameters must first be established. First, the duration of the demand period, or block time, is programmable. In the preferred embodiment, the block time can be 15 minutes, 30 minutes, 60 minutes, 120 minutes or 240 minutes in length. The block time is divisible into a preselected number, N, of subintervals. These subintervals N must be an integer number of minutes in length and the blocks must be an integer number of subintervals, from 1 to 10 in the preferred embodiment. For example, if the duration of the block time is 15 minutes, the duration of the subintervals must be either 3 minutes or 5 minutes with a corresponding number N of subintervals 5 or 3. Note also that a flag, BEQTT, may be set which causes the block to equal the entire time of use period. When set, this flag causes total energy during each time of use period to be accumulated by suppressing division by time.

During each subinterval energy, as measured by the disc pulses, is accumulated in a 16 bit memory location designated "DPULS". At each subinterval boundary, DPULS is read by a rolling demand routine and zeroed. Note boundaries are found by copying the length of the subinterval in minutes into a subinterval minute counter "SMC" and decrementing once every minute, since the rolling demand routine is called once per minute by the Main program. When SMC is decremented to zero, a boundary is encountered.

Figure 20:
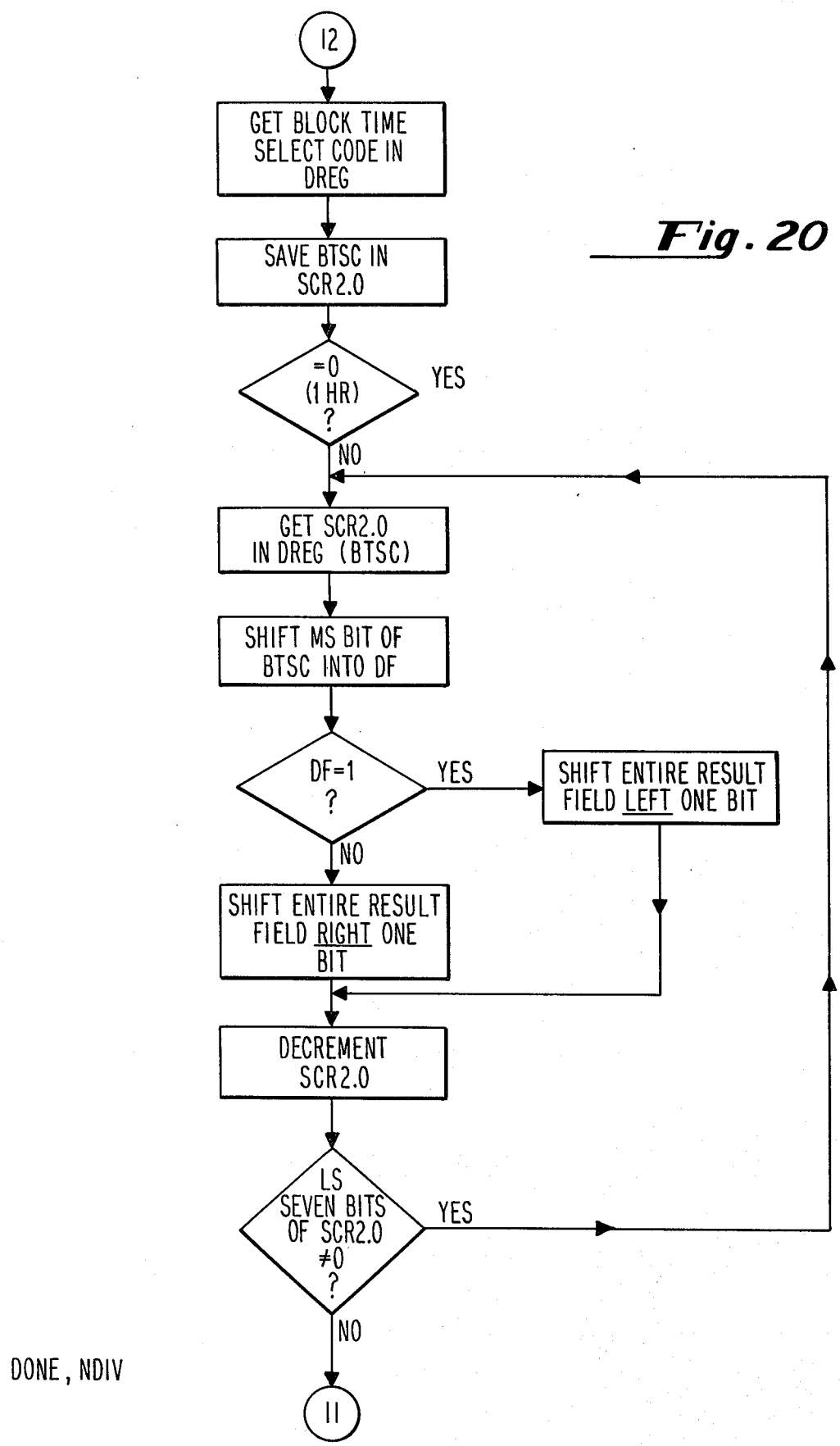
Figure 21:
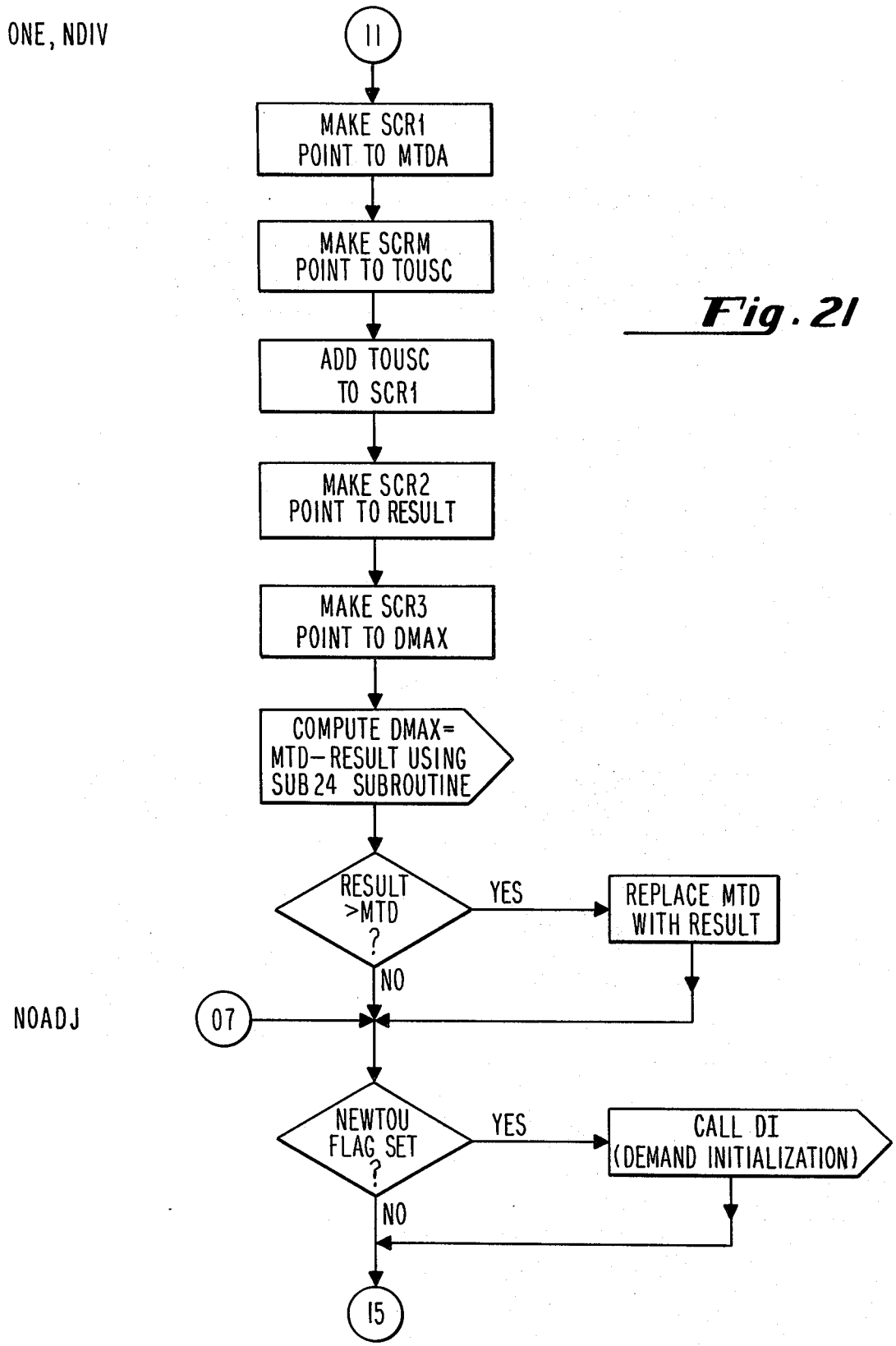
Figures 25, 26:
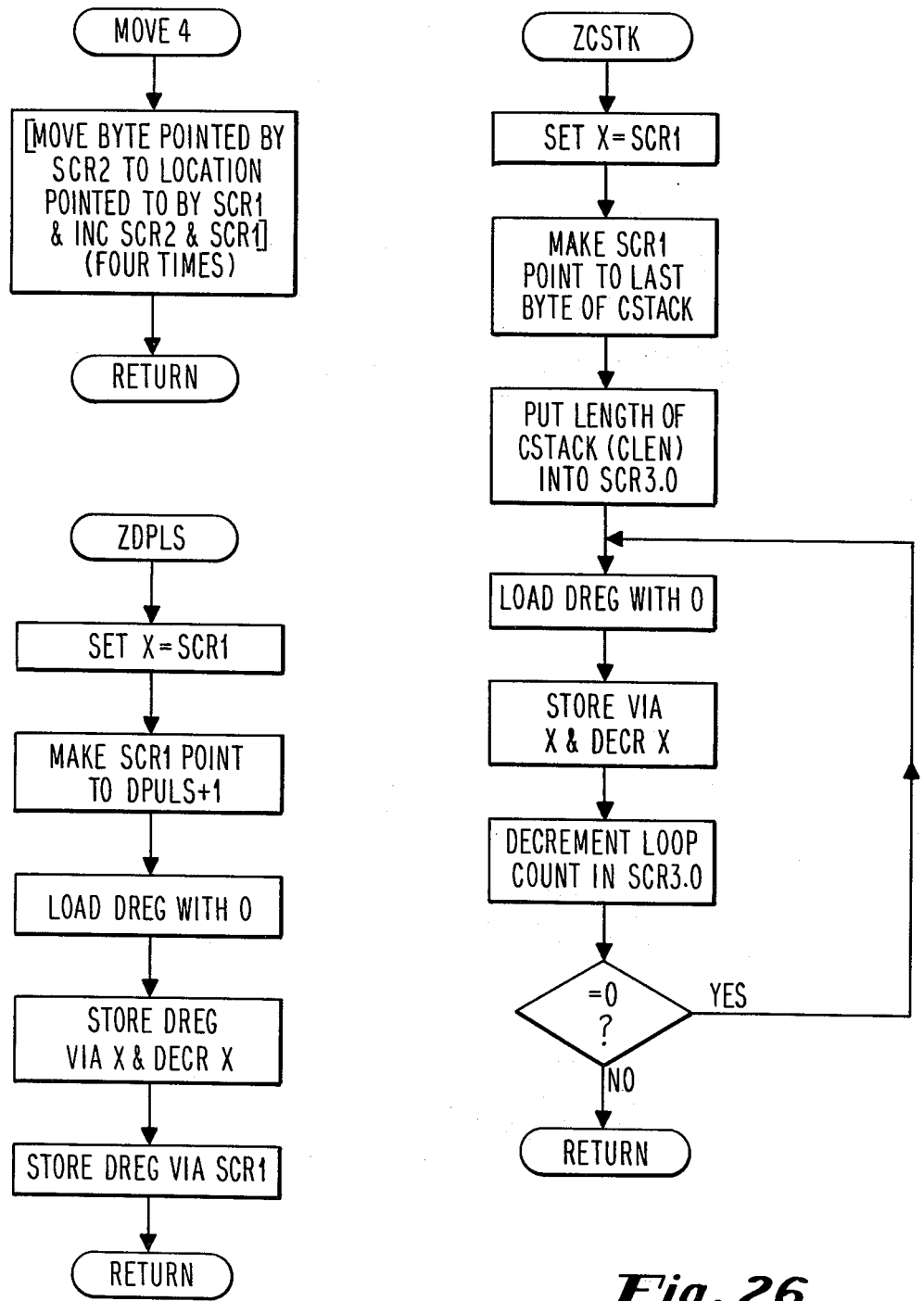
Figures 27, 28:
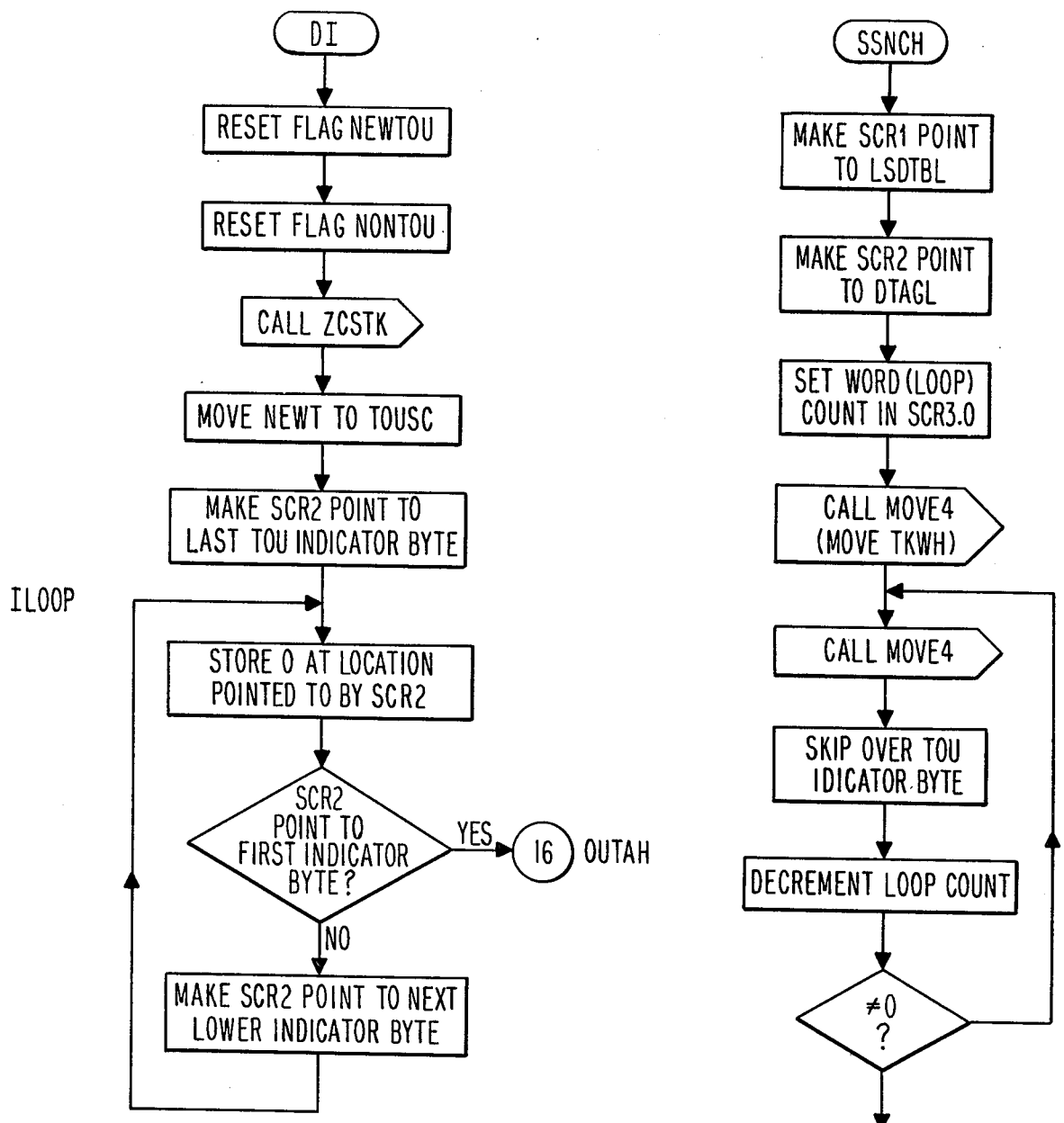
Figures 29, 30:
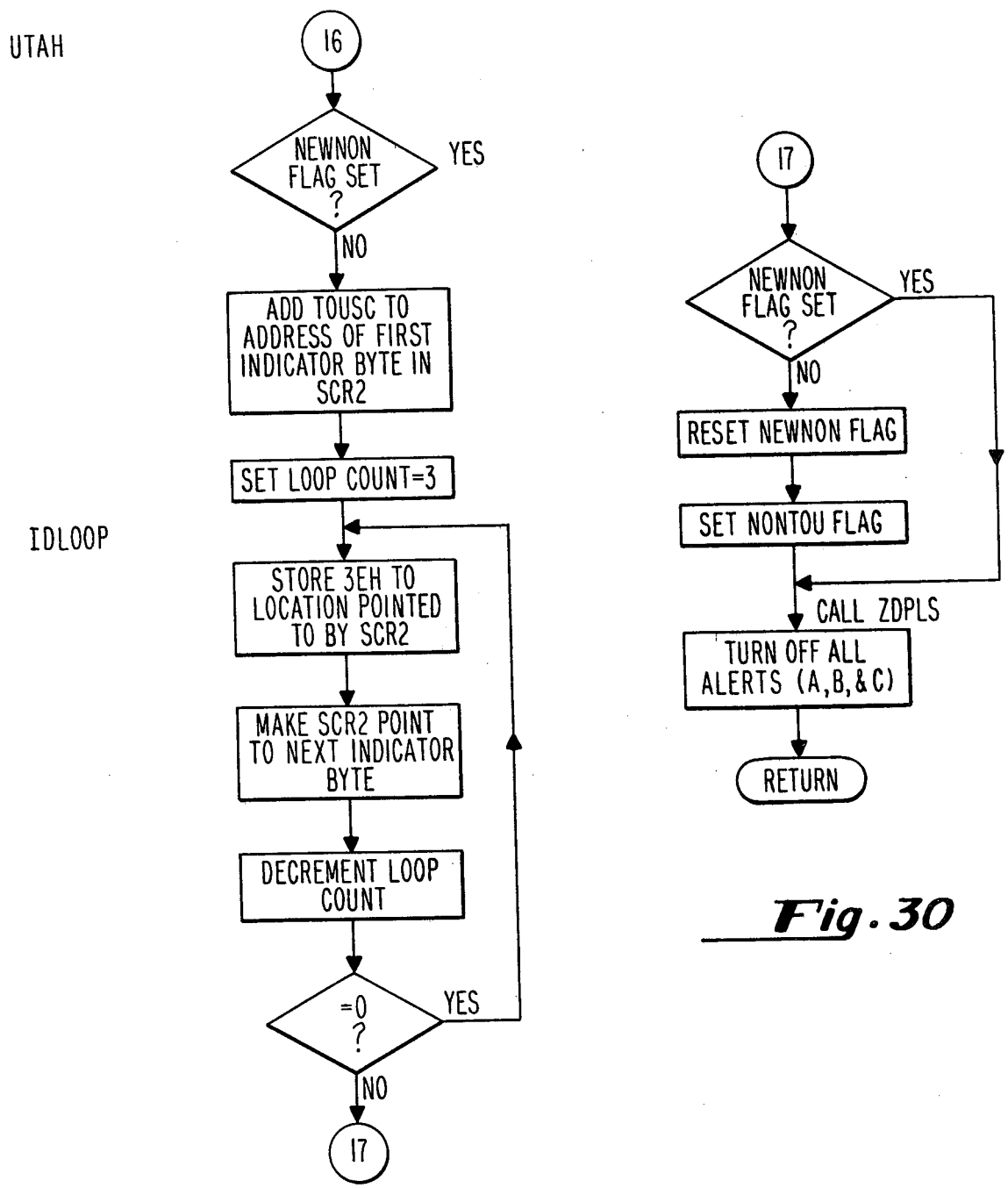
Figure 31:
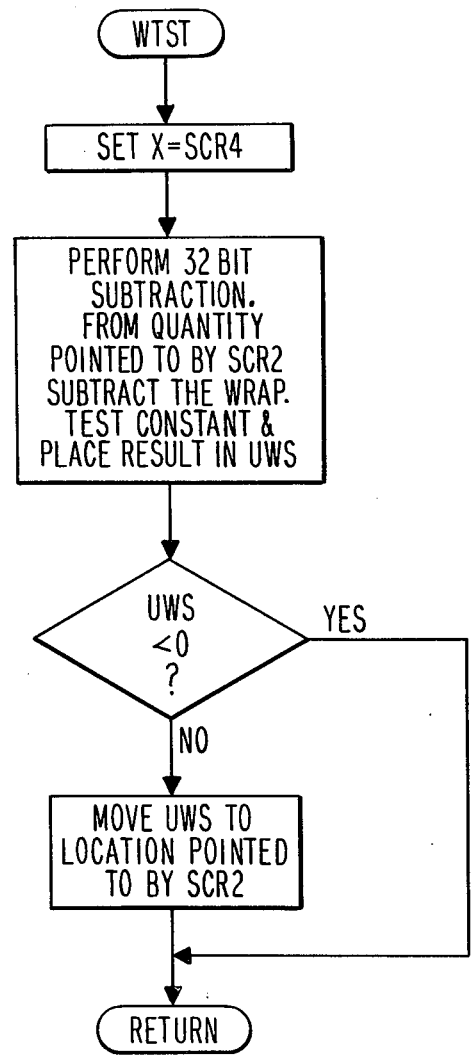

Referring to FIGS. 16 through 19, the quantity from DPULS is stored in a "circular stack" called "CSTACK". The storage element in CSTACK is pointed to by "NEXT", a 16 bit pointer, stored in RAM which continuously cycles through the first N elements of CSTACK making sure CSTACK always contains the most recent N entries. CSTACK is then totaled to a 24 bit sum in a memory location called "RESULT". RESULT is then divided by the block time in hours (if BEQTT is reset). The quantity remaining in RESULT is demand in pulses/hour. As shown in FIGS. 20 and 21, RESULT is subtracted from the month-to-date maximum demand for this time of use type and the remainder is stored at "DMAX". If DMAX is negative, RESULT is copied into a month-to-date ("MTD") location for this time of use, thereby destroying the old value (see FIG. 21). The rolling demand routine knows which MTD demand to compare to by using a 1 byte quantity called the "TOUSC" or time of use select code. The TOUSC is really an address offset from the first MTD demand (MTDA) to the MTD demand for a particular time of use type, B or C.

Activation of the demand reset switch generates an input to B3 of the data selector 50. Subsequent interrogation of the data selector 50 by the microprocessor 12 causes execution of a routine which adds the MTD demand to the cumulative demand for each time of use type and checks for decimal-overflow with correction if necessary. MTD demand is then zeroed for each time of use type.

When a season change is effected by calendar software in the quarter-hour routine (to be described subsequently), a flag identified as "NEWSSN" is set for rolling demand. Upon entering rolling demand with NEWSSN set, demand calculation is deferred while a season change subroutine identified as "SSNCH" is executed, see FIG. 27. SSNCH simply copies this season's data to last season's storage space destroying any previous last season data. Depending upon a switch position, the rolling demand routine may be assembled with the capability of zeroing this season's data on season changes.

Other aspects of the rolling demand routine operation includes zero demand wherein the routine may temporarily suspend calculation of demand during periods when no energy is being consumed by setting a "ZEROD" or "ZERDMD" flag. When the calendar software enacts a new time of use period, as will be subsequently described, the rolling demand routine is cued by two flags, "NEWTOU" and "NEWNON". The calendar software sets the appropriate flags and sets the new time of use select code in a 1 byte memory location called "NEWT". When rolling demand sees NEWTOU set, it reinitializes demand (zeros CSTACK) and copies NEWTOU into "TOUSC". Rolling demand also turns off all alert light emitting diodes (LED's) and initializes the proper indicator bytes in "DTABL". If the NEWNON flag is set, rolling demand will resest it (as it will NEWTOU) and set, in turn, the NONTOU flag which will inhibit demand calculation until the next time NEWTOU is set by the calendar software.

If there is a power outage and it exceeds a preprogrammed amount of time, the main program will set a flag called "LNGOTI" or "DMDDLY" and will place a preprogrammed value in a memory location called "DLYCNT". This value will be decremented once every minute until zero, when demand calculation is resumed. The minimum power outage length program value is called "LNGTIM" and is a 1 byte binary value. The program delay time, in minutes, is called "DLYTIM" and it is also a 1 byte binary value.

During recovery following a power outage, the rolling demand program operates as follows. Upon restoration of power, the main program sets a flag called "PWRDNI". This starts the catch-up period during which all clock and calendar information is brought up to real-time by means of a counter that keeps track of time on the carryover battery in minutes. The main program calls rolling demand during the catch-up interval but passes no pulses via DPULS. Rolling demand calculates demand and if the catch-up interval is long enough CSTACK will contain all zeros. Rolling demand will detect this condition and set the zero demand flag. Further calls to rolling demand during the catch-up interval will cause quick exits thus saving time and expediting the catch-up process. During the entire catch-up process, both rolling demand and quarter hour routines are called at faster than the once per minute rate.

If the power outage exceeds a preprogrammed amount of time, the main program will set the DMDDLY or LNGOTI flag, as previously stated. The rolling demand routine does not look at the DMDDLY flag until the catch-up interval is over. In fact, no new demand is calculated during catch-up and only total kilowatt hours are accumulated during catch-up. Only old demand is calculated or slid out of the block or sliding window. Demand delay, if appropriate, is effected from the end of the catch-up interval. After the catch-up interval, the PWRDNI flag is reset. Rolling demand is now called at the once per minute rate and decrements the DLYCNT quantity until it reaches zero (see FIG. 15). During this delay interval, rolling demand zeros DPULS and calculates demand, which may be zero. It is necessary to finish executing the demand during the delay interval in order to maintain certain housekeeping functions, especially the "DI" routine, see FIGS. 28 through 30. The zero demand flag may be set furing the delay interval since this is not a catch-up interval, the main program will continually reset it.

FIGS. 32 through 53 are detailed flow charts depicting the steps performed by the apparatus of the present invention in order to perform the quarter hour check shown as block 166 in FIG. 11. The following description utilizes the mnemonics set forth in the blocks of these flow charts in order to enable the reader to readily use the flow charts as an aid to better understanding the written description, if necessary.

Figure 32:
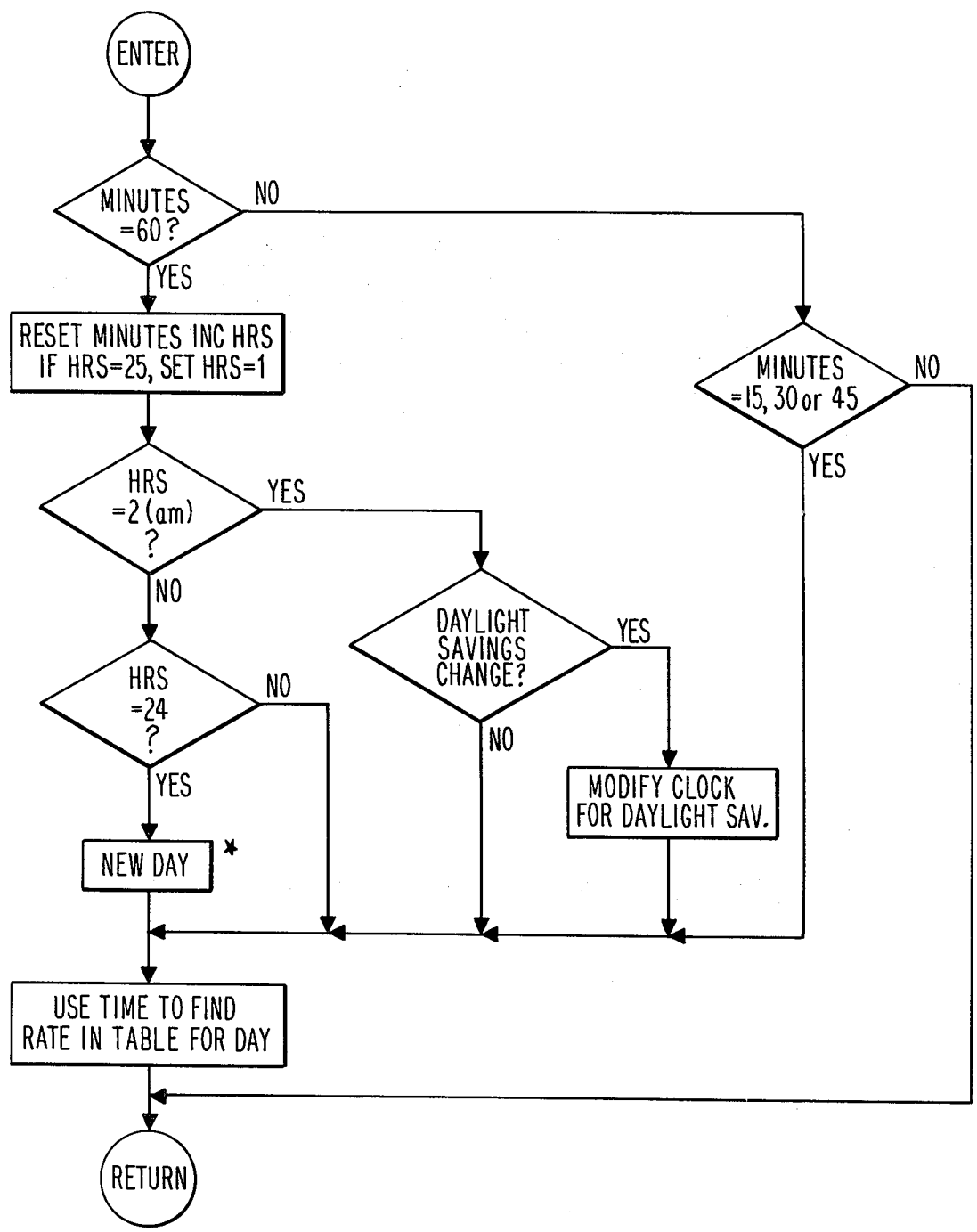
Figure 32A:
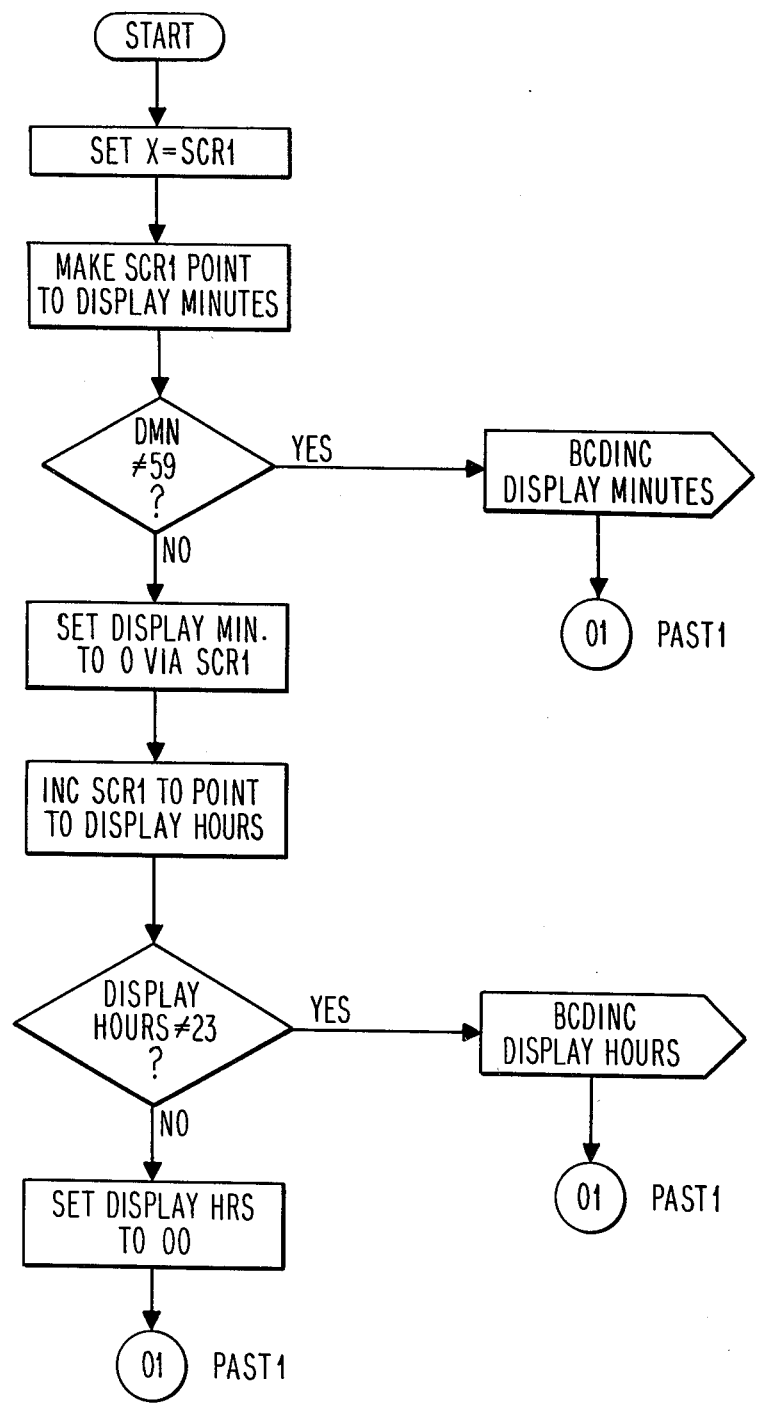
Figure 33:
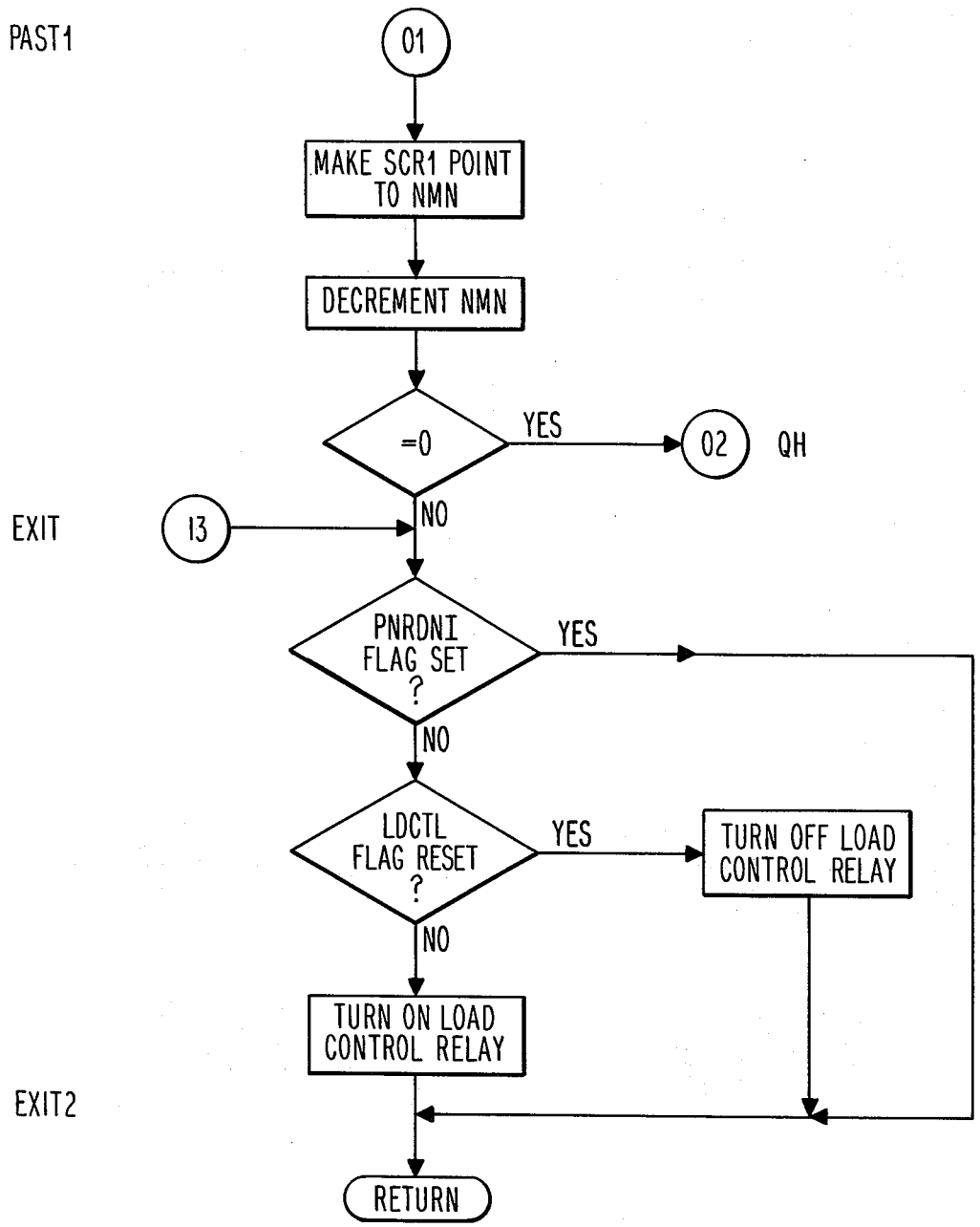

As previously stated, the quarter hour check (see FIG. 32) is made once per minute. The quarter hour routine basically maintains the clock and calendar functions. The clock time displayed by the apparatus consists, in the preferred embodiment, of two quantities, hours and minutes (see FIG. 32a). These quantities are both stored as two digit bcd (1 byte) values and are called "DHR" and "DMN" respectively. The two quantities together are called "DTIME" and are incremented by the quarter hour routine. While the display clock is used for some timekeeping functions, internal clocks are used for most functions. The following quantities are kept for internal timekeeping functions. First, the number of minutes until the next quarter hour boundary ("NMN"), a 1 byte binary number having a range of 1 to 15. Also, the number of quarter hours passed so far today ("NQHR"), a 1 byte binary number having a range of zero to 95. NQHR is incremented when NMN reaches zero (see FIG. 34). Note that NMN is decremented once every minute when the quarter hour routine is called (see FIG. 33).

In additon to the above, the quarter hour routine performs the following calendar associated functions. At midnight every day, the following parameters are tested and if appropriate, are effected. First, a test is made for the end of the year. This requires a separate test for leap year. If this was the 365th day of the year and this year is not a leap year, then a new year is set up, see FIG. 38. The leap year select code ("LYSC") determines whether this year is a leap year or not. The least significant 5 bits of this 1 byte code are used to determine when a leap year will occur. Up until February 29th of a leap year, LYSC is 0000001; this value is tested but not changed at midnight after February 28th. If the least significant bit is set, then February 29 is inserted. On the 365th day (December 30th for a leap year), the code is again tested but this time ring shifted right to a value of 00010000. Because this was a leap year, a "one" in the least significant bit was shifted to the fourth bit position. The shifting of a one here causes the 366th day to be inserted. At the end of the 366th day, the code is advanced again, this time to 00001000 (see FIG. 37). It is advanced on the 365th day each year and tested at the end of every February 28th. The quarter hour routine maintains a binary 16 bit day of year count whose range is 1 through 356 (366 on leap years). This value is called "NDY" and is the key reference for calendar events stored in the daily action table. NDY is incremented at midnight each day. The operation can be found in the flow chart, FIG. 35 at the label "INCNDY".

Figure 34:
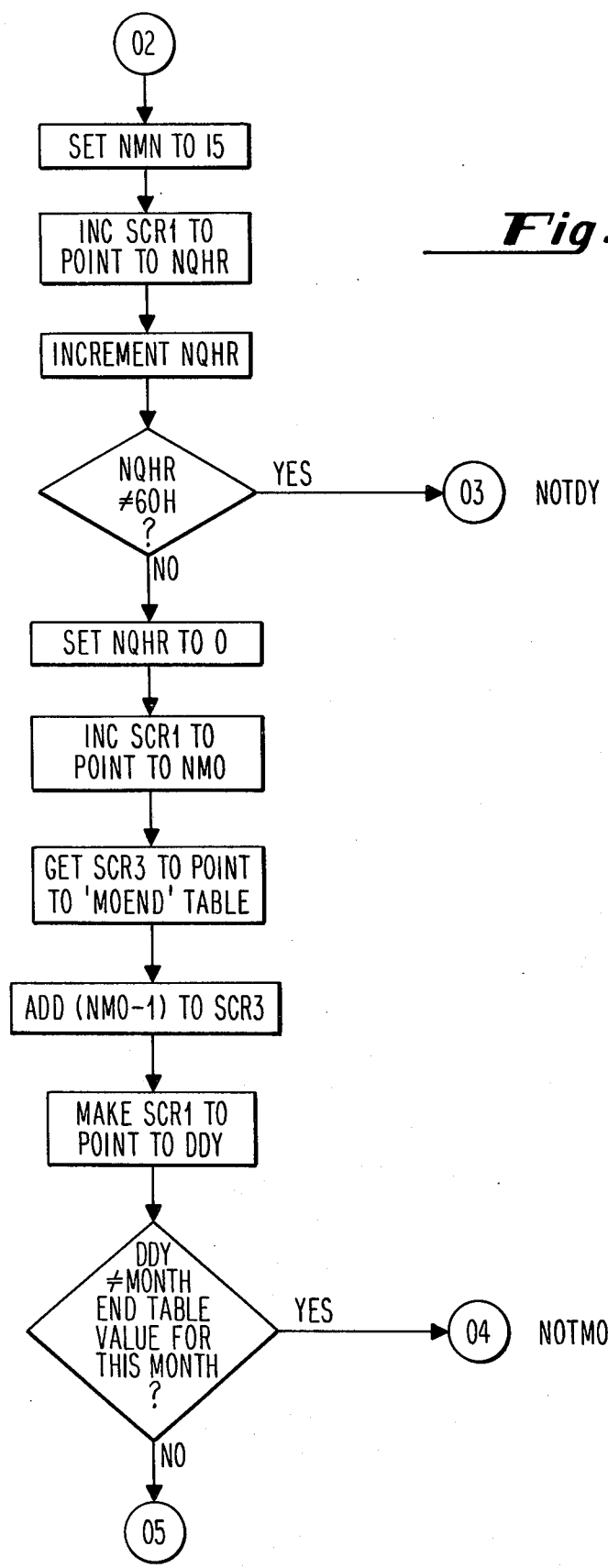
Figure 35:
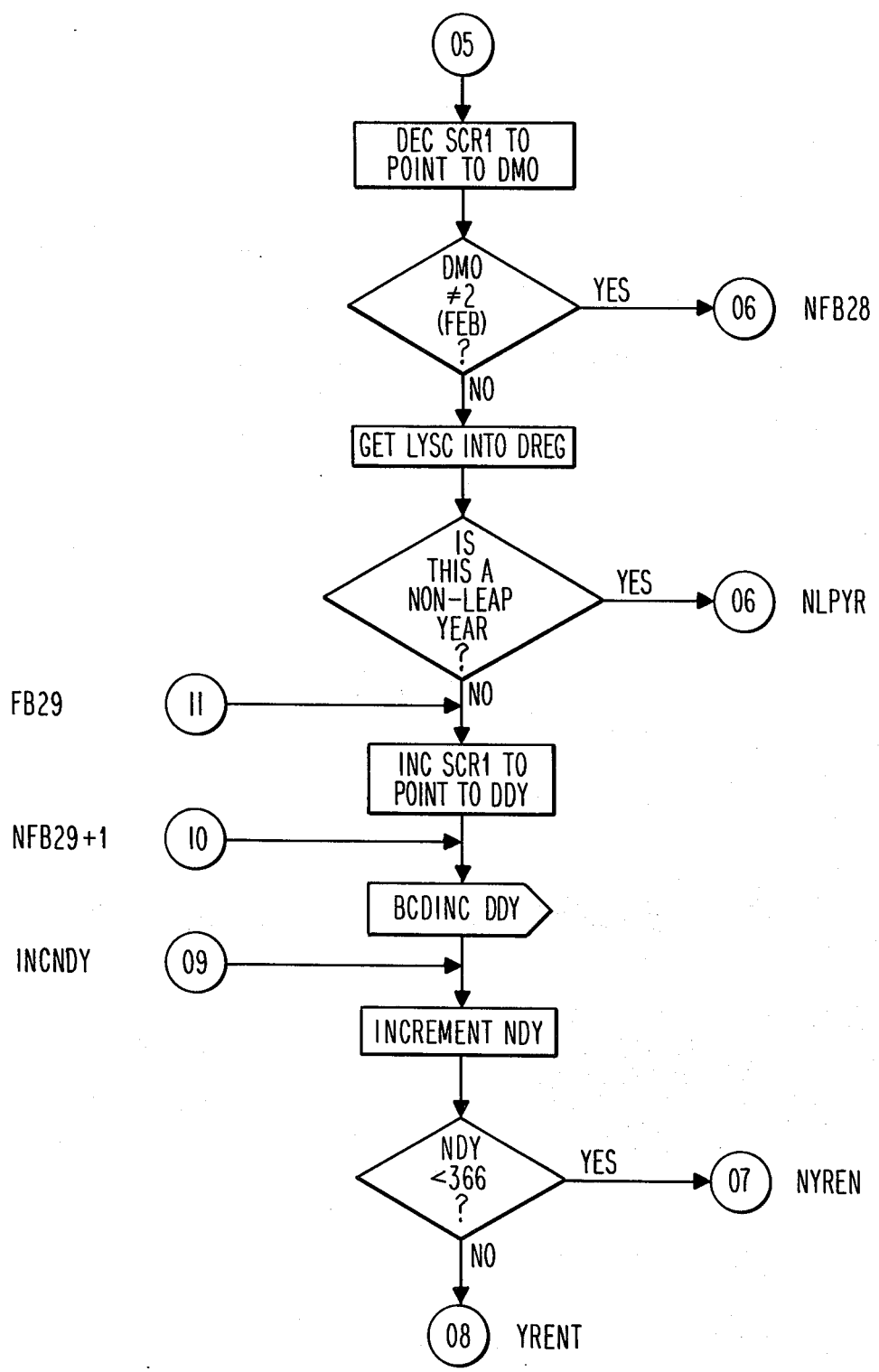
Figure 37:
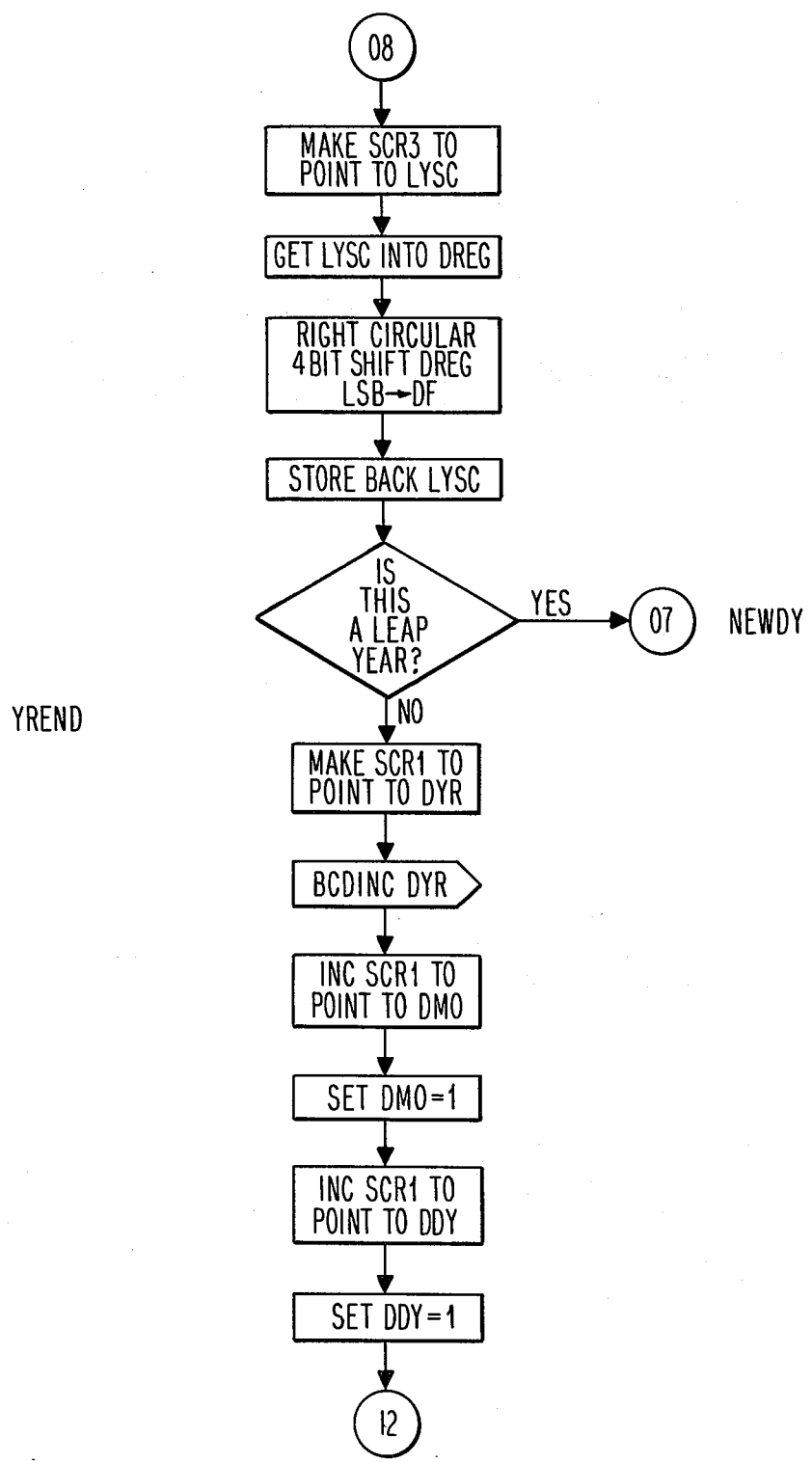
Figure 38:
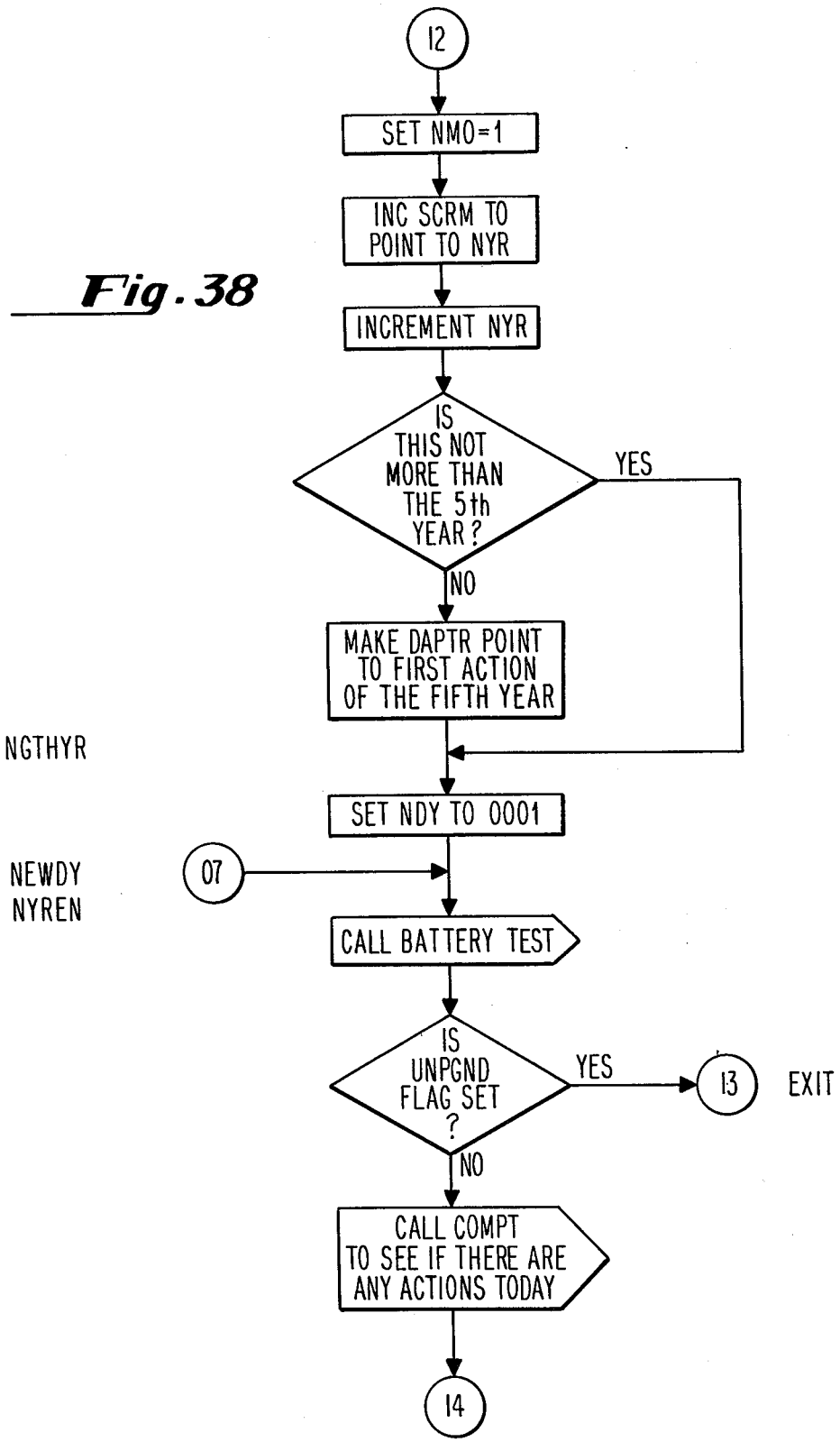

A test for the end of the month is made by comparing the display day of the month to a table of last days of months (see FIG. 34). The table is stored in the ROM and is called "MOEND". The display day of the month is called "DDY" and is a two digit bcd (1 byte) quantity. The display month is also a two digit bcd as is the display year. These quantities are called "DMO" and "DYR" respectively. The end of month table is indexed by a binary 1 byte month number called "NMO" whose range is 1 through 12 (see FIG. 36).

Figure 39:
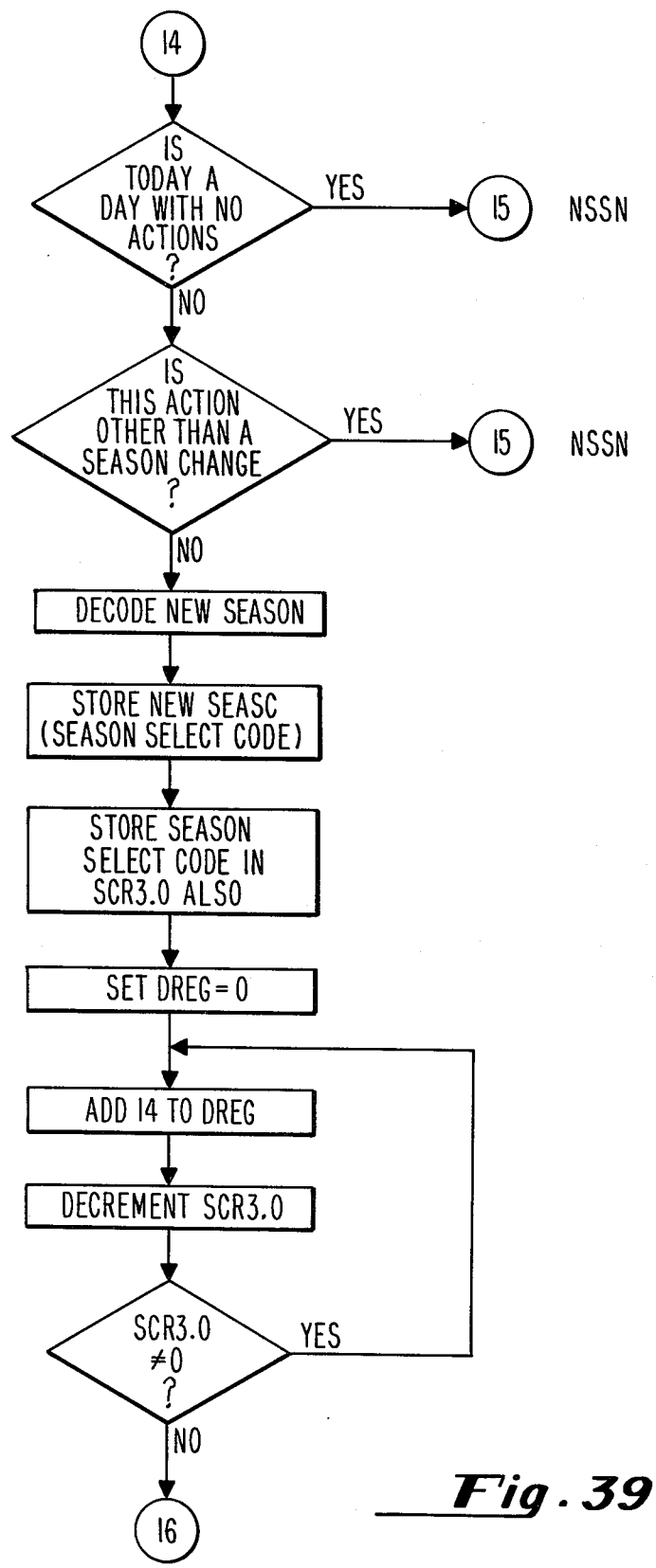
Figure 40:
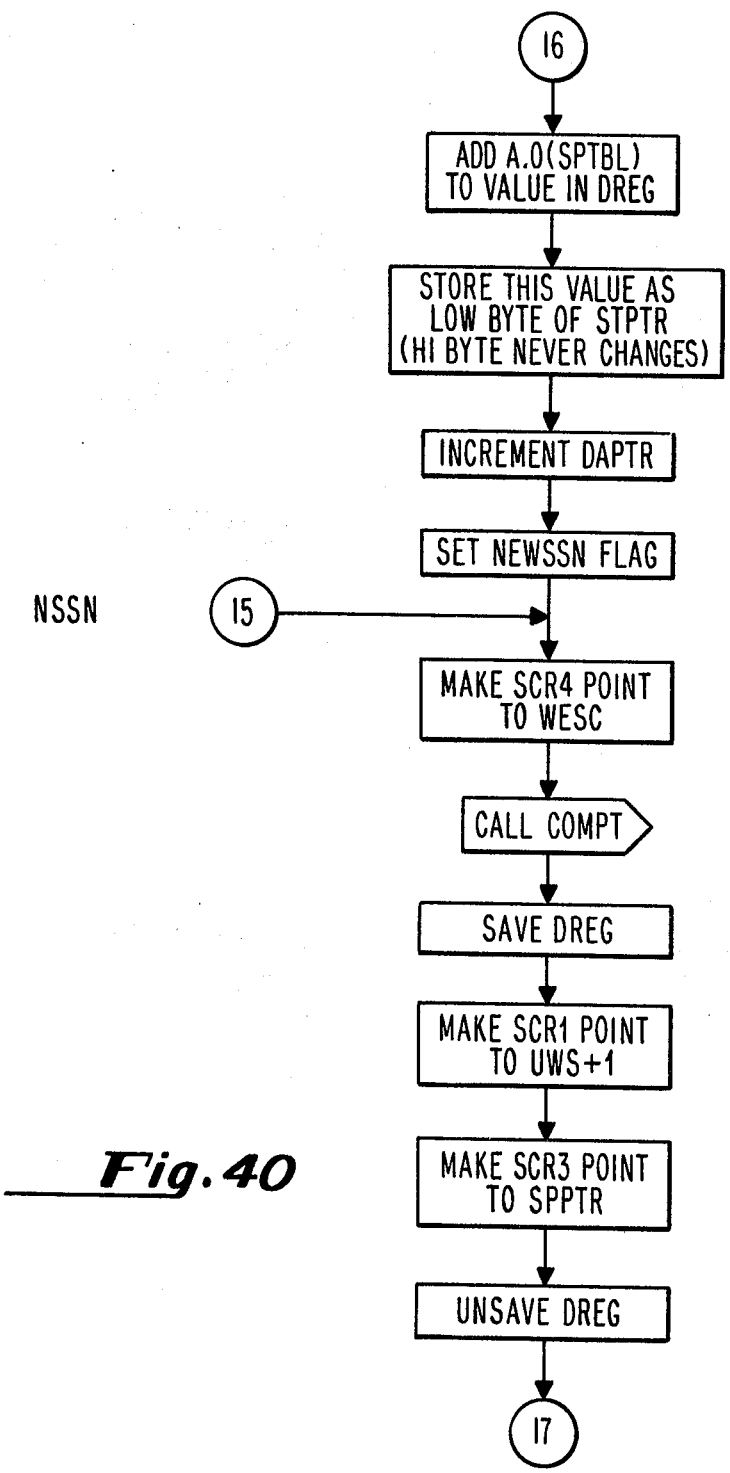

This routine also tests for season changes (see FIGS. 39 and 40). Note that a season change is a calendar event so the following description will serve as a basis for other calendar events as well. Calendar events in the daily action table are stored in chronological order and indexed by a 16 bit pointer called "DAPTR". To find if a calendar event is to happen today, the data stored in the daily action table must be decoded and the "activation day" of the event compared to the present value of NDY. If they are equal, the event is to occur.

Figure 52:
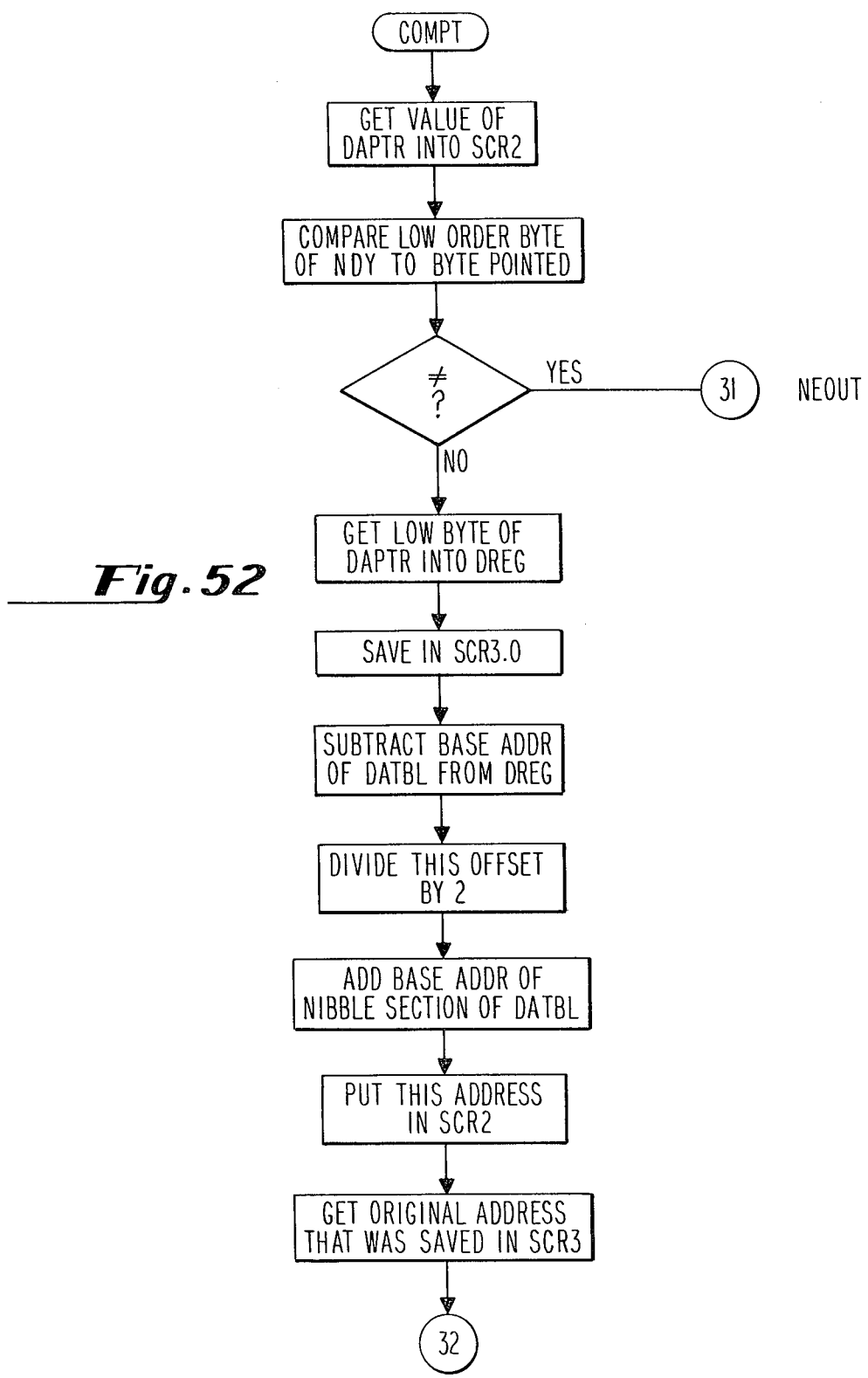
Figure 53:
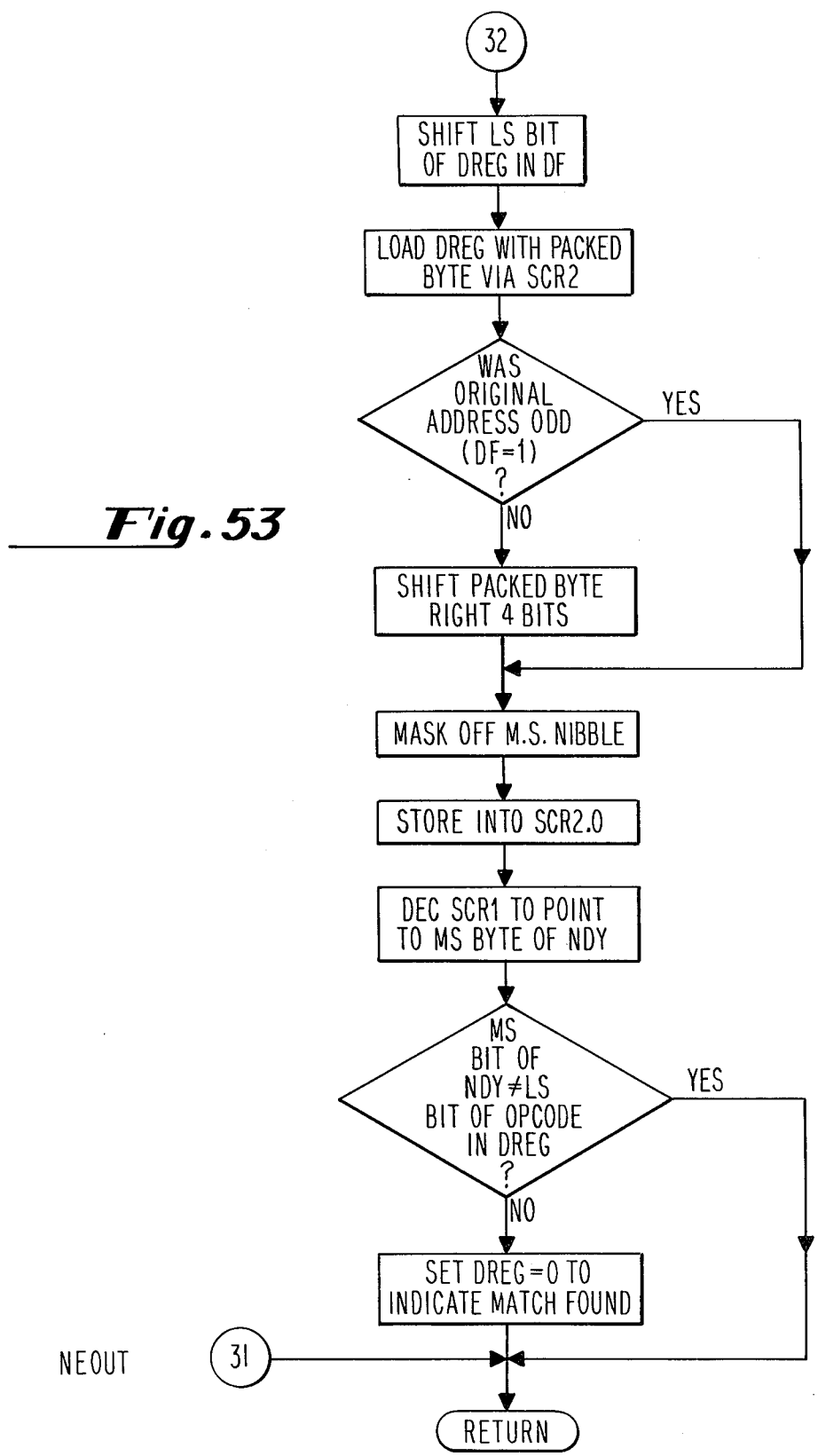

A subroutine called "COMPT" performs the decoding and comparison test for calendar events (see FIGS. 52 and 53). When called, COMPT will look at the next calendar event (as pointed to by DAPTR) and decode the activation day, compare it to NDY and, if unequal, will return with the "D" register containing a non-zero quantity. If COMPT makes the comparison and finds a quality, it will further extract the opcode portion of the stored calendar event placing it in "SCR 2.0", which is the low order 8 bits of the scratch register 2 in the microprocessor 12, and return with zero in the D register. In the case of the season change, the opcode is checked to see if it is indeed a season change. If it is, DAPTR is advanced to the next calendar event (i.e. incremented by one) and the season change effected. If not, DAPTR is not advanced.

To enact a season change, three functions must be performed. First, the NWSSN flag is set for the rolling demand routine to move data to the last season's registers. Second, the season select code of the new season must be put in the memory location called "SEASC" (1 byte binary: 0,1,2,3). Third, the "STPTR" (season table pointer) must be set to the value for that season (SPTBL, SPTBL+14, SPTBL+28, SPTBL+42). The "STPTR" is a 16 bit address index that points to the first of 14 set points for a particular season table. This scheme will be subsequently described in the portion of this detailed description pertaining to the five year calender and set point programming. The method used for determining the value of the season table pointer is to evaluate the quantity A (SPPTR)="SPTBL+SEASC"×14. This is because there are 14 set points in each season (8 weekday and 6 weekend/holiday setpoints).

Figure 41:
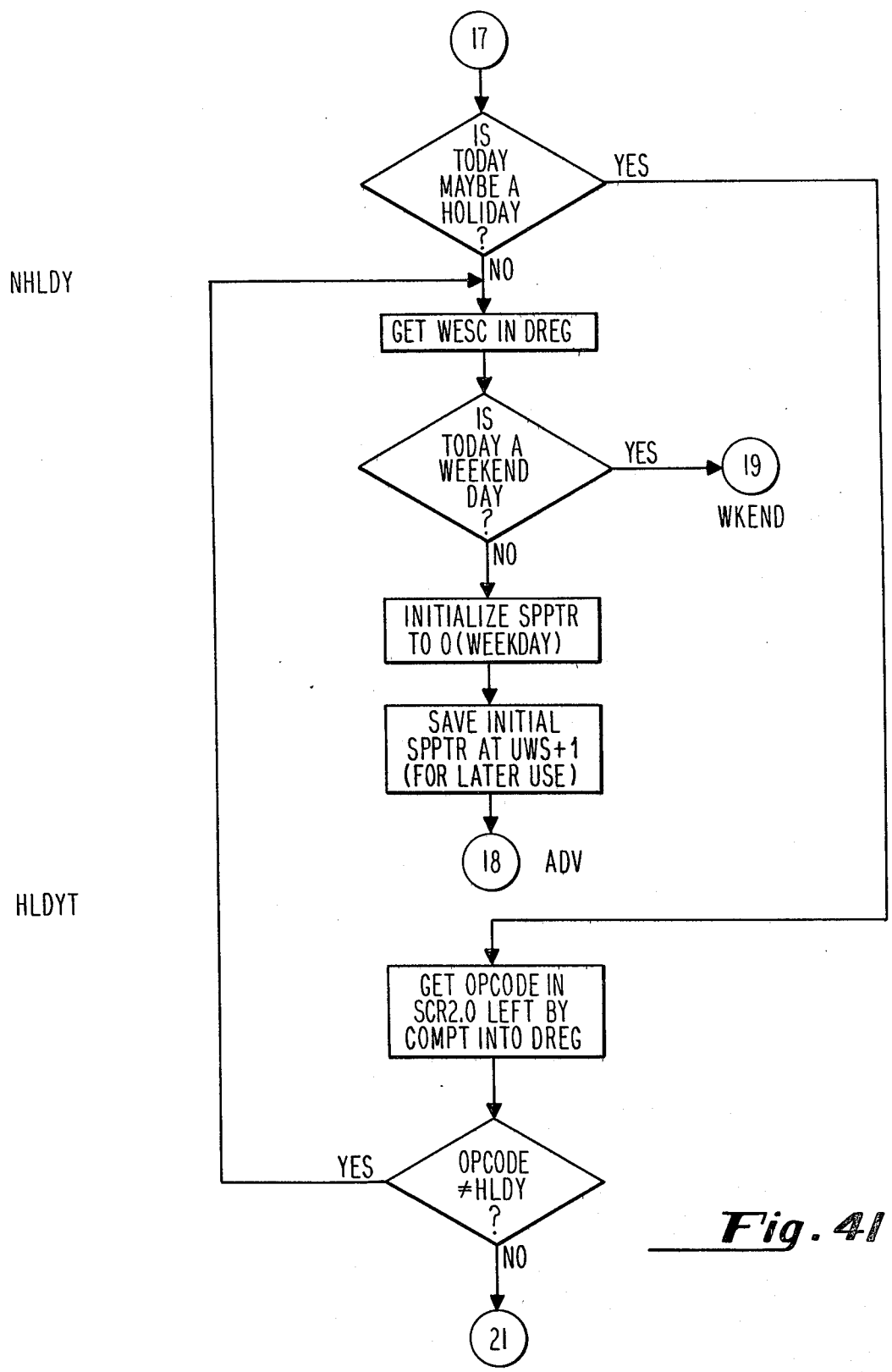
Figure 42:
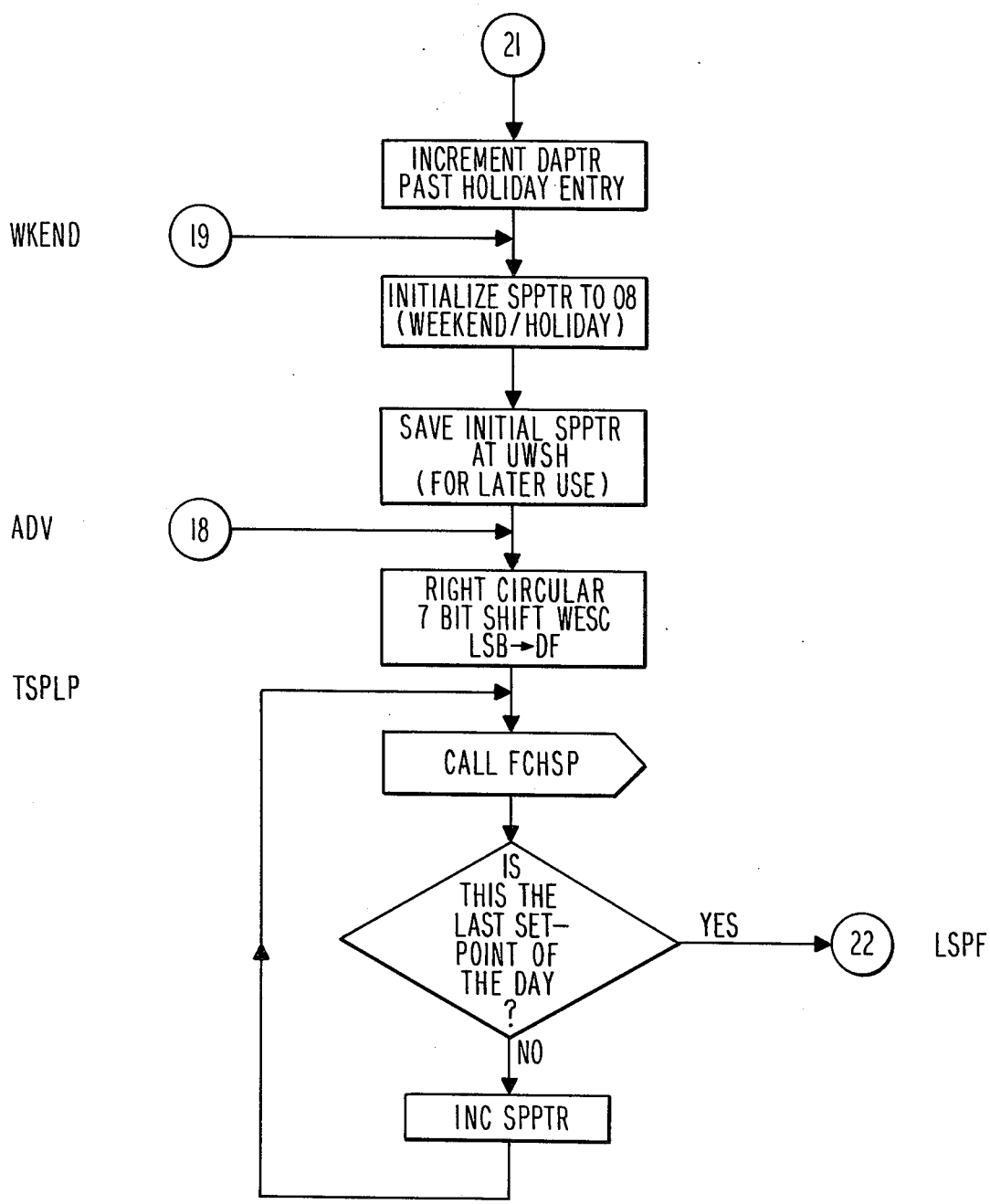
Figure 43:
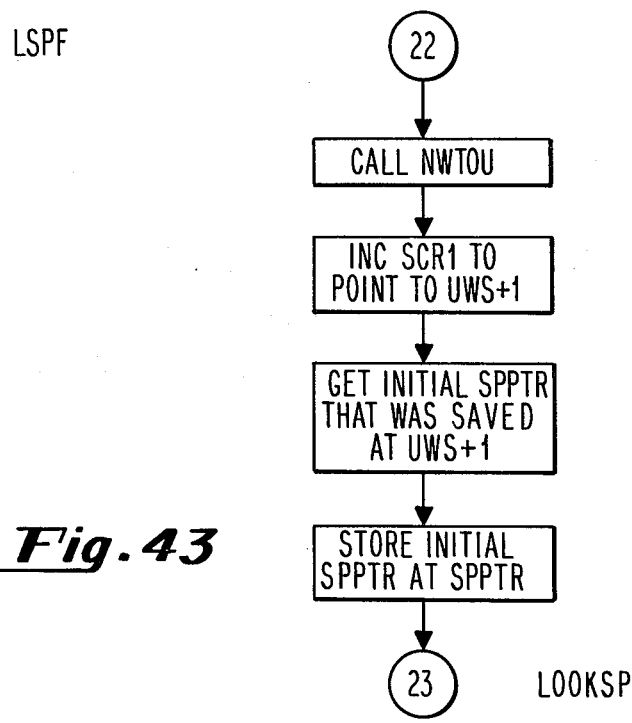
Figure 45:
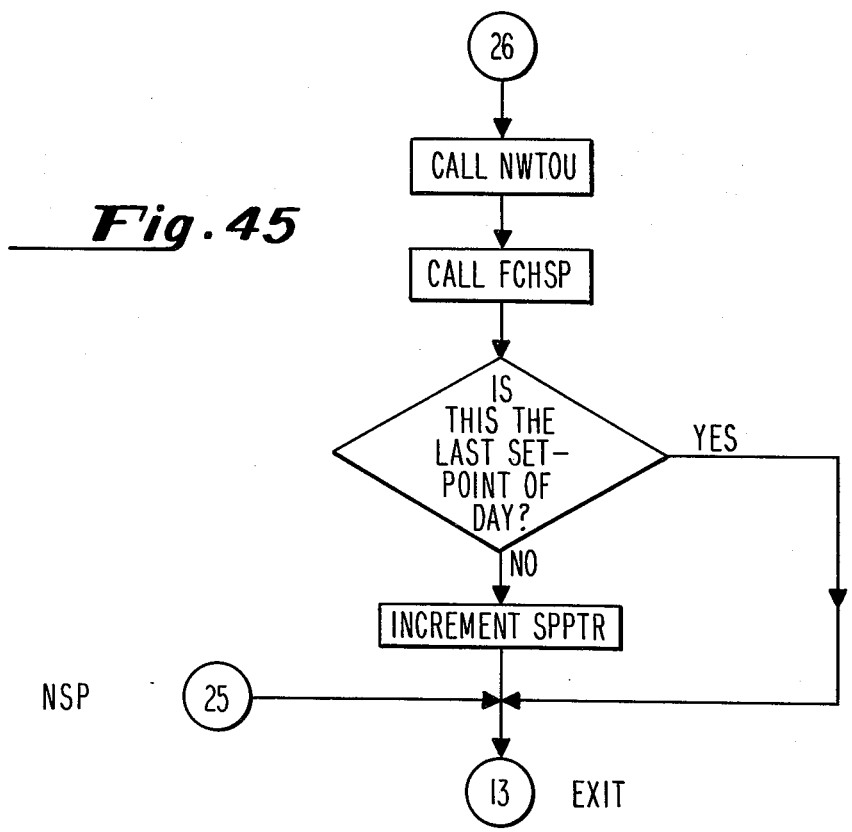
Figure 44:
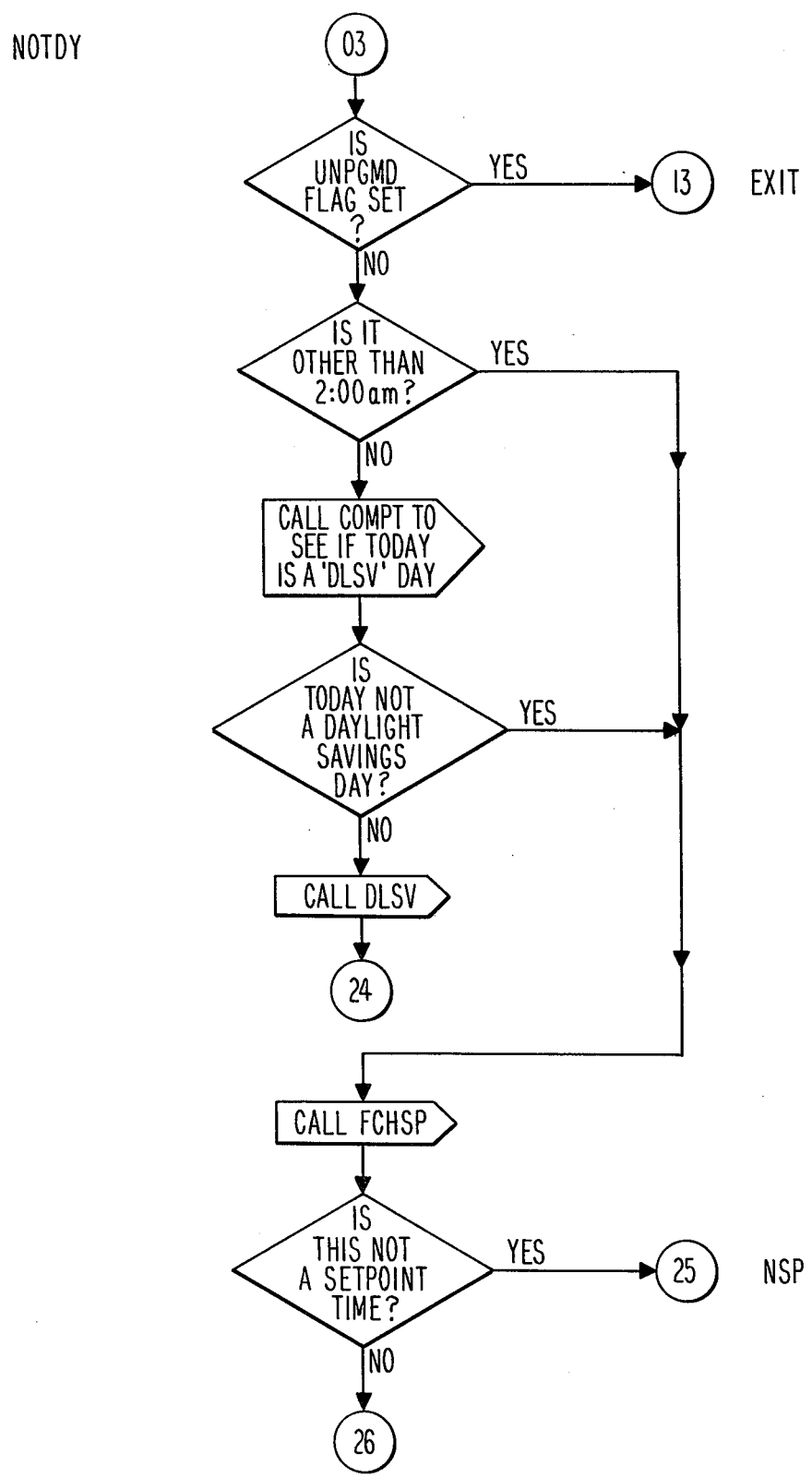
Figure 46:
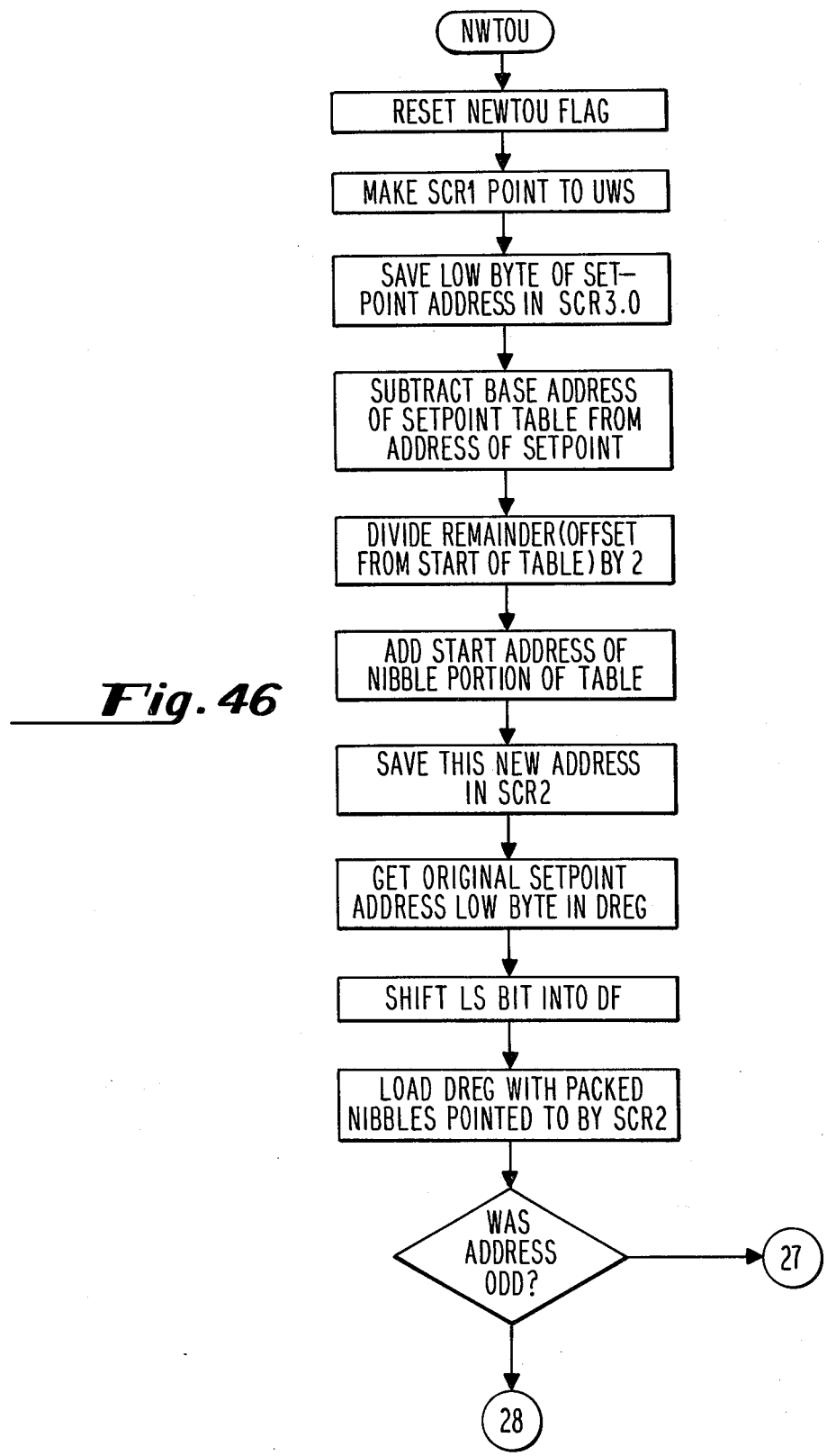
Figure 47:
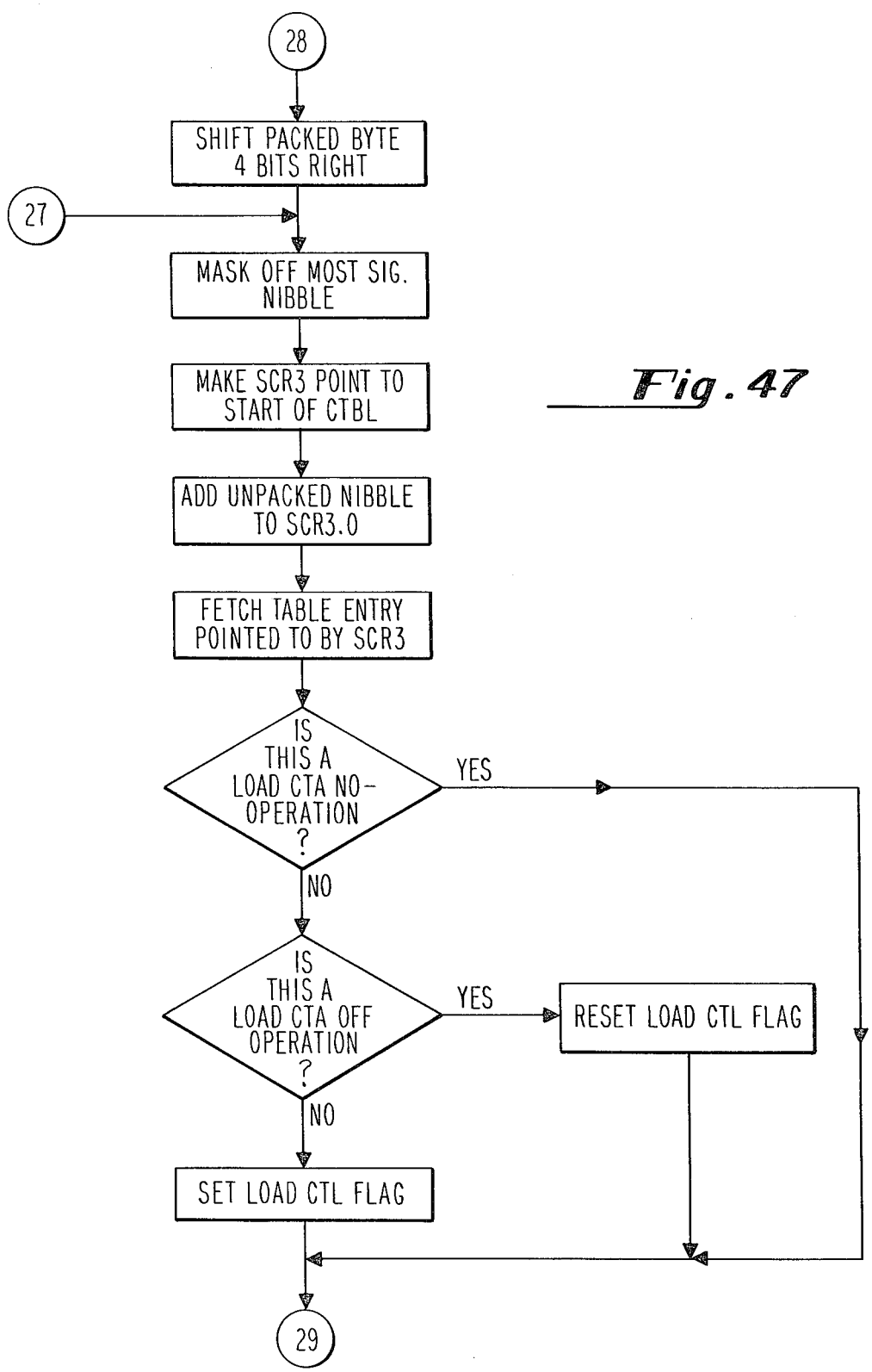
Figure 48:
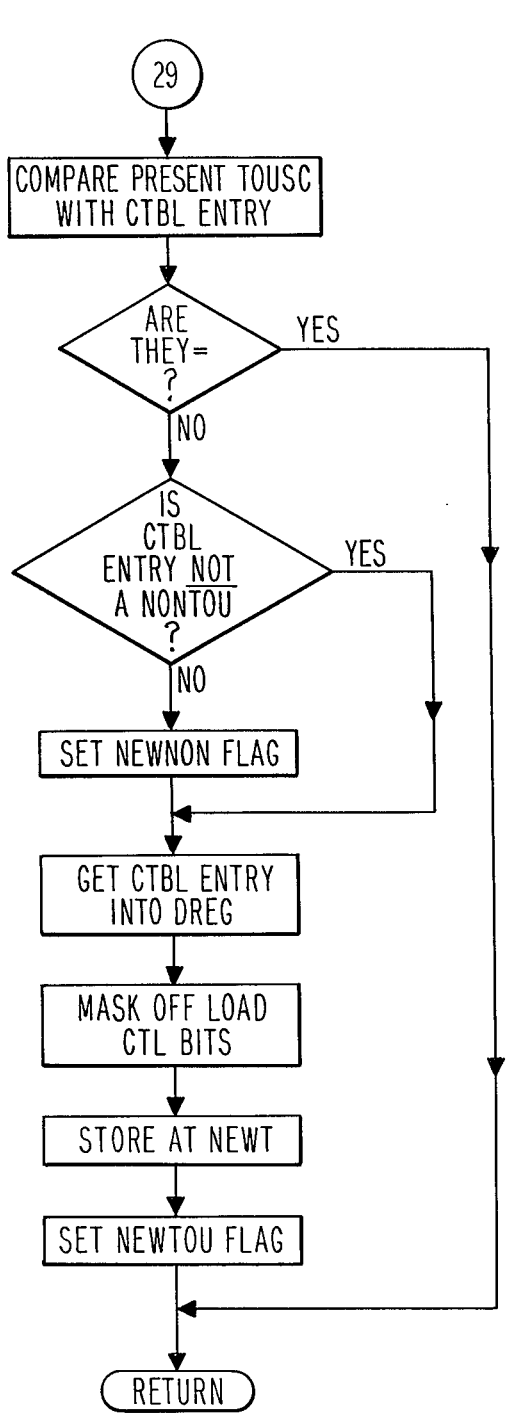
Figure 49:
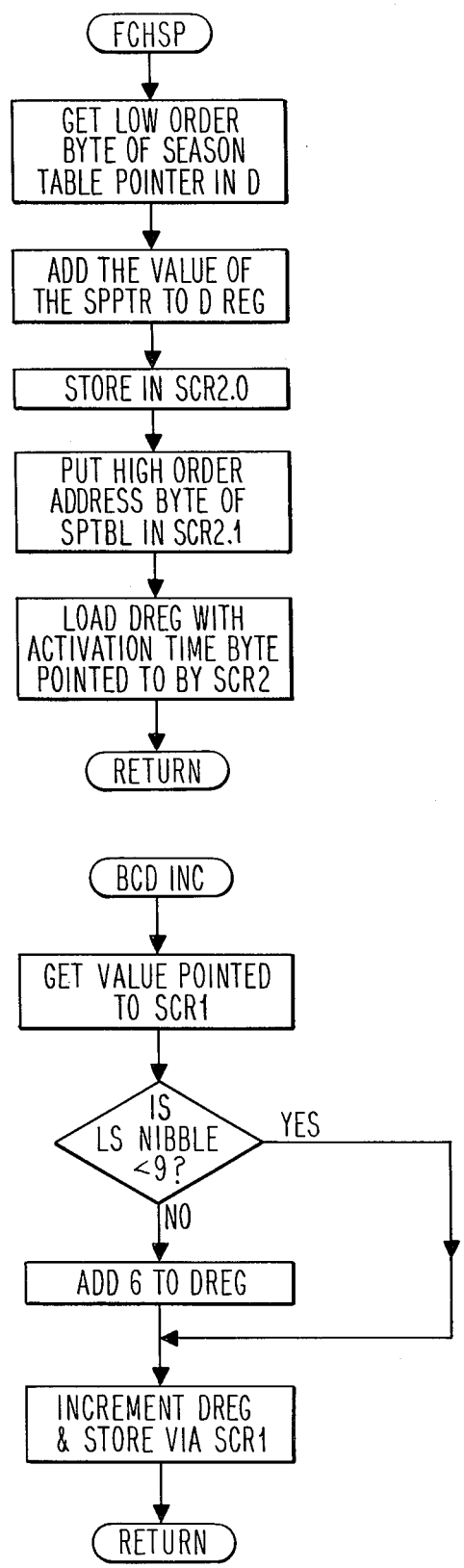
Figure 50:
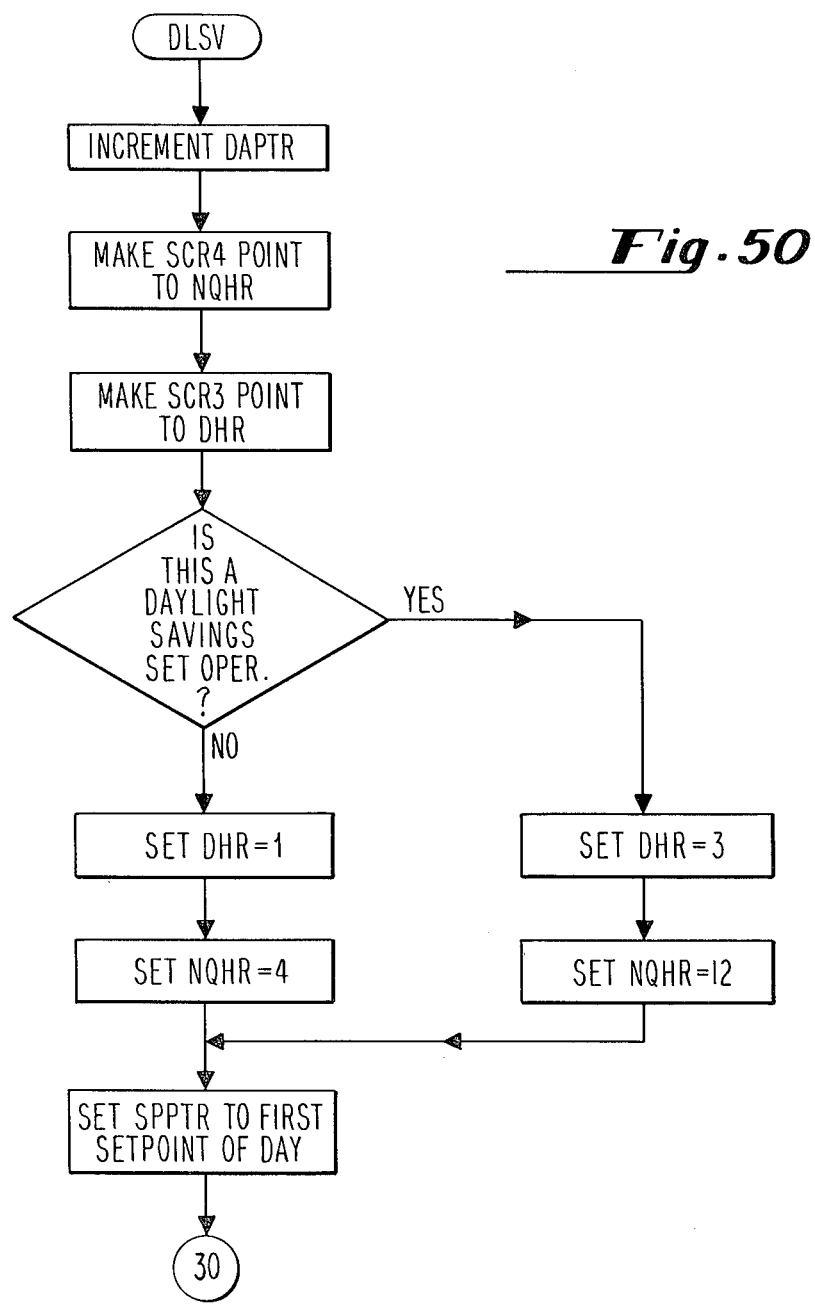
Figure 51:
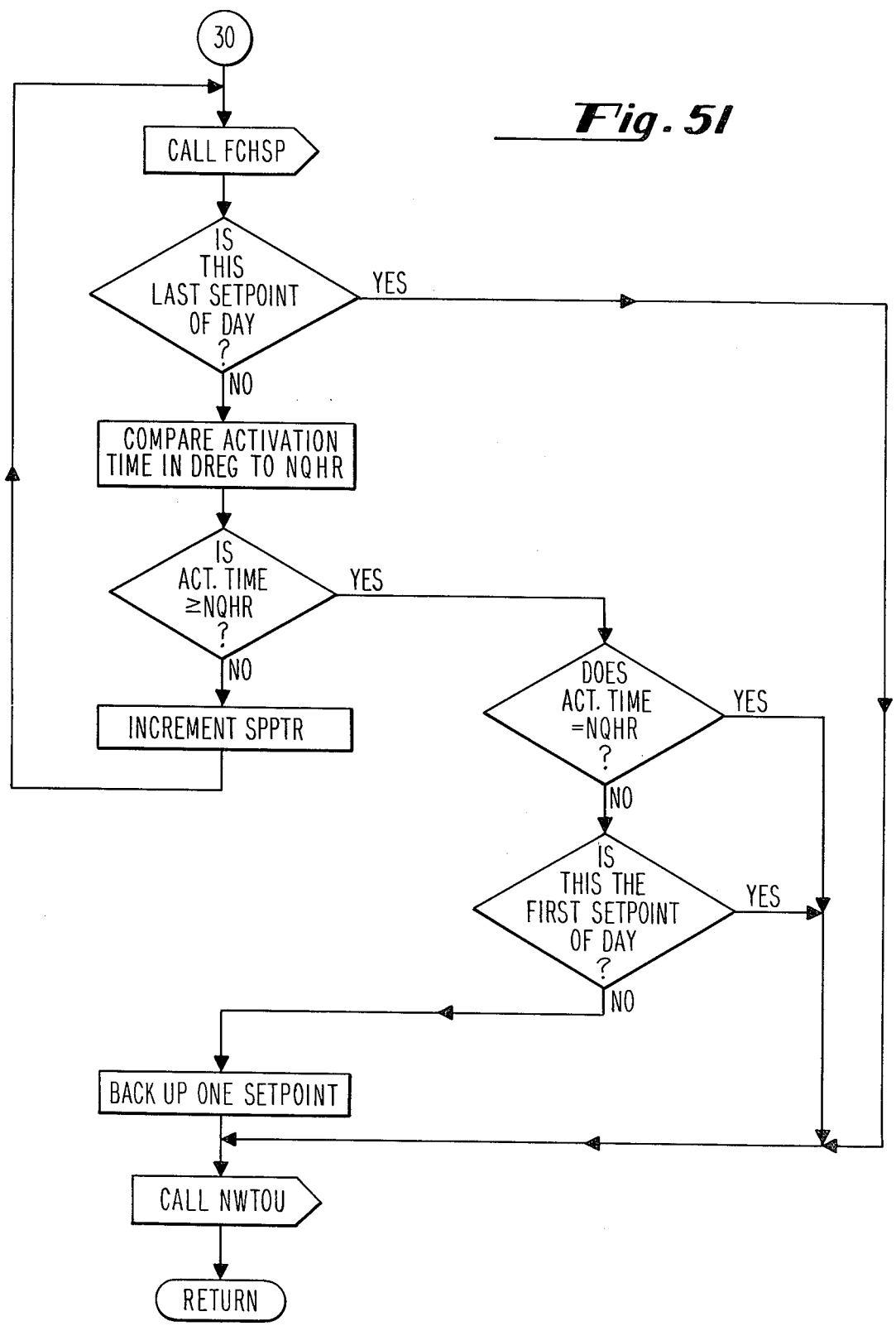

At midnight each day, after checking for a season change, a determination is made as to what type of day today will be, that is a weekday or a weekend/holiday (see FIGS. 41 and 42). Since a holiday is a calendar event, the COMPT routine is invoked, just as in the season change. Also at midnight each day, the weekend select code ("WESC") is tested at advance. The WESC is a 1 byte binary code that uses the 7 least significant bits of the byte as a right-ring-shifted code in which a one bit designates a weekend day and a zero bit designates a weekday. The bit that is tested to determine what type today will be is the least significant bit of the code. This bit is transferred from the least significant position to the next most significant position (7th bit from the right) and during transit is tested.

After determining if today will be a weekend/holiday or weekday, the set point pointer or "SPPTR" is set accordingly. The SPPTR is a 1 byte binary address index that is added to the season table pointer ("STPTR") to address the activation time byte portion of the next set point. Initially at midnight, the SPPTR is set to 00 for weekdays and 08 for weekends/holidays. This points to the first set point in each list. A search is then made for the last set point in that list which is signified by a one in the most significant bit position of the activation time byte of the proper set point. Once the last set point of that particular day type is found, a new time of use period is effected, see FIG. 43. This is accomplished via a call to the "NWTOU" routine (see FIGS. 46 through 48) which will effect a new time of use period unless it sees that the new period would be of the same time of use type as the existing one, in which case, it takes no action. This avoids discontinuities in the demand calculation that are unnecessary. The SPPTR is left pointing to the first set point of the day, unless that set point is set for midnight (i.e. 00 quarter hours) in which case SPPTR would point to the next set point, providing the midnight setpoint was not the last setpoint of the day. If it were the last setpoint of the day, the SPPTR would be left pointing to it. The SPPTR is never incremented beyond the last setpoint of the day.

Every quarter hour marks a point in time at which a set point can occur. As set points are encountered during the day, SPPTR is incremented so that it is always pointing to the next set point. When the last set point of the day is encountered, SPPTR is left pointing to the last set point. The section of the routine that is executed every quarter hour regardless of other calender events, midnights, etc. is called "NOTDY" (see FIGS. 44 and 45) and is located near the end of the main quarter hour routine. Also every quarter hour, time is checked to see if it is 2:00 a.m. At 2:00 a.m., the "COMPT" routine is called to see if the next calender event is a daylight savings change for today. If it is, the "DLSV" or daylight savings routine (see FIGS. 50 and 51) is called. This subroutine determines whether to spring ahead or fall back in accordance with known daylight savings changes. The method of adjustment used is to set all the clocks for 1:00 a.m. or 3:00 a.m., whichever is appropriate, then find the last set point before that time (or exactly at that time) and put it into effect. As previously stated, the DLSV routine changes all clocks so that the display time is updated correctly.

As previously stated, a new time of use period is effected by a call to the NWTOU routine. This routine is usually called after a previous call to "FCHSP", the fetch set point routine (see FIG. 49). FCHSP fetches the activation time byte portion of the next set point and leaves it in the D register. It also leaves SCR2 pointed to the memory location the byte was fetched from. NWTOU expects SCR2 to point to this location. The NWTOU routine fetches and decodes the next set point, sets the load control properly, places the time of use select code for the next time of use in NEWT, sets the NEWTOU flag (and if appropriate, the NEWNON flag). However, if after comparing the old time of use type to the new type, it finds that they are equal, no action will be taken.

The "COMPT" routine, (see FIGS. 52 and 53) which does not take any action by itself, unpacks the activation day and the opcode. If the activation day (a 9 bit quantity, binary 1 through 366) is equal to the present value of NDY than the opcode is placed in SCR2.0. It is the duty of the calling program to advance any pointers, when appropriate, associated with NWTOU or COMPT. A "BCDINC" routine (see FIG. 49) increments and decimal adjusts the two bcd digits in the byte pointed to by SCR 1.

Following a power outage, the quarter hour routine operates as follows. For the most part, the quarter hour routine doesn't know if it is in real time or a catch-up interval. It simply assumes one minute has passed since it was last called. However, during catch-up intervals, it is possible that several time of use periods may be executed at high speed. This could cause an undesirable affect on the load control. To prevent this from happening, the actual adjustment of the load control is buffered from the NWTOU subroutine by means of a flag called "LDCTL". Referring to FIG. 53, the state of the LDCTL flag is examined upon exit from the quarter hour routine and output to the load control. A "set" flag means that the load control relay is picked or on and a reset means not picked or off. If the PWRDNI flag is set, indicating a catch-up mode, the load control is not affected. The next time the quarter hour routine is called after the meter is caught up to real time, the load control relay will be set to the correct state.

As previously mentioned, the apparatus of the present invention is programmable for five full years. The five year calendar contains holidays, season changes and daylight savings time changes. Events are kept in chronological order. These events are coded into a "packed" binary format. Each event requires, in the preferred embodiment, 12 bits (1 byte plus 1 nibble). The binary code is determined by numerical day of year that the event occurs and the type of action. Nine bits are reserved for the day of the year (1 through 366 binary codes) and 3 bits for the type of event. Events are stored in the "daily action table". The bytes are stored first, with the nibbles packed together at the end, each in chronological order. The least significant 8 bits of the numerical day of year forms the byte part of the numerical code. A 3 bit action code and the most significant bit of the numerical day of year portion forms the nibble part of the event code. In this format, the most significant bit of the numerical day is the least significant bit of the nibble part.

The 3 bit event or action code describes one of seven possible actions. These are the four season changes, a holiday set and a daylight savings time set or unset. In order to implement the actions, it is first required to itemize the desired events which, in the preferred embodiment can total up to eighty. The events are then organized into chronological order. Each event is then coded into a binary code having a byte part and a nibble part. The coded bytes are stored at "DATBL" (daily action table) and the nibbles, now packed in byte format, are stored at "DATBL+80". The low order 8 bits of the address of the first action of the fifth year (address of the byte portion) must be saved for "YR5PRL" in the meter in order to enable the recycle feature after five years.

The set points are implemented as follows. First, a table is divided into four season tables. Each season table may contain 8 weekday entries (set points) and 6 weekend/holiday entries (set points) for a total of 14. Each entry contains 1 byte and 1 nibble. Set points may cause one of eight events to occur. These eight events are: turn load control and initiate time of use A, time of use B, time of use C or a non-time of use interval; or turn load control OFF and initiate time of use A, time of use B, time of use C, or a non-time of use interval. The set points are based upon the time of day they occur and the type of event to be effected. In this regard, time is kept in quarter hours of the day. Quarter hours are numbered zero through 95 in decimal and 00000000 though 01011111 in binary. The byte portion of a set point is the quarter hour of execution. The most significant bit of the byte portion is normally reset except if set point is the last set point of the day in which case it is set. The nibble portion of the set point is an operation code (opcode) that effects the desired event. The four season tables are structured as shown in the following map of the set point table (SPTBL).

| SPTBL | Season #0 | Weekday | |
|---|---|---|---|
| SPTBL + 8 | Season #0 | Weekend/holiday | |
| SPTBL + 14 | Season #1 | Weekday | |
| SPTBL + 22 | Season #1 | Weekend/holiday | BYTES |
| SPTBL + 28 | Season #2 | Weekday | |
| SPTBL + 36 | Season #2 | Weekend/holiday | |
| SPTBL + 42 | Season #3 | Weekday | |
| SPTBL + 50 | Season #3 | Weekend/holiday | |
| SPTBL + 56 | Season #0 | Weekday | |
| SPTBL + 60 | Season #0 | Weekend/holiday | |
| SPTBL + 63 | Season #1 | Weekday | NIBBLES |
| SPTBL + 67 | Season #1 | Weekend/holiday | |
| SPTBL + 70 | Season #2 | Weekday | |
| SPTBL + 74 | Season #2 | Weekend/holiday | |
| SPTBL + 77 | Season #3 | Weekday | |
| SPTBL + 81 | Season #3 | Weekend/holiday | |

For each season, The weekday and weekend set points are sorted and arranged in chronological order. The set points are converted to binary code and stored into the set point table according to the chart shown above.

Figures 54, 55:
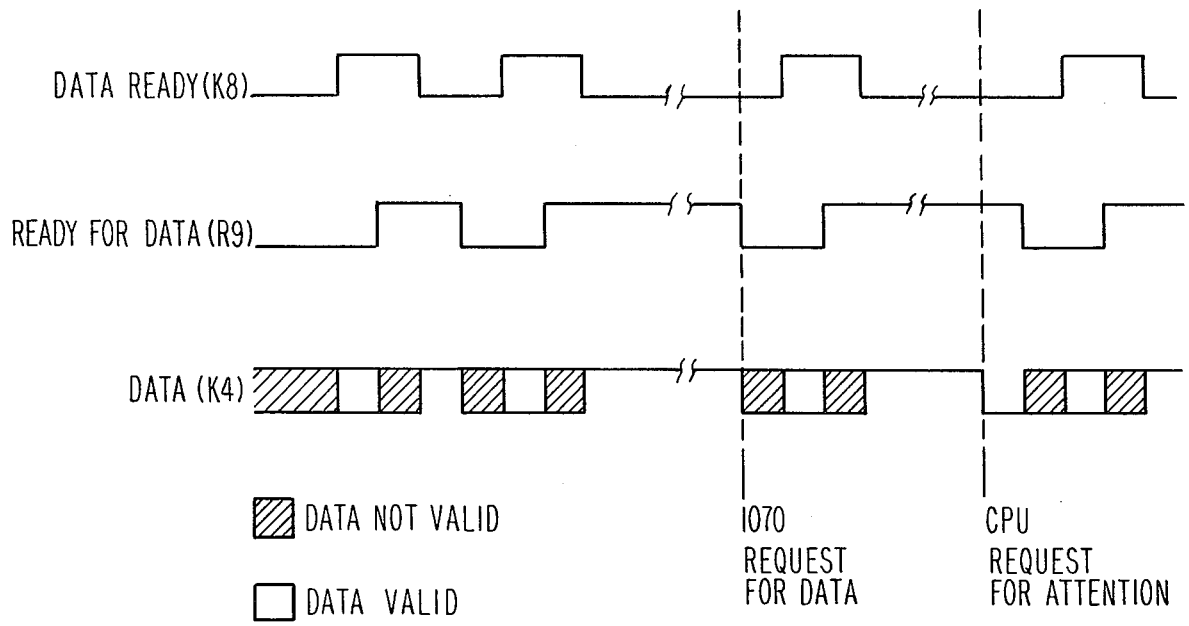
FIG. 54 is a timing diagram illustrating the relationship between clock and data signals in transmitting data to a display controller.
FIG. 55 depicts a preferred embodiment format of a time display message.

Referring back to FIG. 4, it is seen that all communication to the display processor/controller 40 is via a three wire serial link. Each data bit is clocked during transmission. The K8 input of the processor/controller 40 is the clock input line from the output data selector 36, the K4 input is the data line from the output selector and the R9 output is the clock line back to the microprocessor 12. FIG. 54 illustrates the clock and data signals in the transmission of data. The protocol established for data transmission insures error checking should incorrect data be received. As shown in FIG. 55, a sync code of five zeros followed by a "one" prefixes each message. Each nibble (4 bits) of data thereafter is also followed by a "one". The display controller 40 checks for the one following each nibble and if it is not received, begins looking for the sync code. The message consists of 1 nibble which gives the total number of nibbles in the message minus 1, a 1 nibble format code, and up to 10 nibbles of data. Each message is sent least significant digit (LSD) first and most significant digit (MSD) last followed by a decimal point location nibble if needed; and each nibble is sent least significant bit (LSB) first and most significant bit (MSB) last.

As stated above and shown in FIG. 55, the second nibble of data is the format code which is decoded to determine what is to be done with the data received. There are 16 possible format codes, of which 12 are used in the preferred embodiment. The format codes are preferably as follows:

| FORMAT CODE (HEXADECIMAL) | DISPLAY TYPE |
|---|---|
| 0 | Constance load |
| 1 | KH Display |
| 2 | Blank display |
| 3 | Message |
| 4 | Unformatted BCD Data |
| 5 | Meter ID Number |
| 6 | Time |
| 7 | Kilowatt Hours |
| 8 | Date |
| 9 | Kilowatt Demand |
| A | Kilowatt Demand |

-continued

| FORMAT CODE (HEXADECIMAL) | DISPLAY TYPE |
|---|---|
| B | Not Used |
| C | Not Used |
| D | Not Used |
| E | Not Used |
| F | Unformatted Binary Data |

All unused format codes vector the processor/controller 40 to the data input request in the communication link.

Each display cycle begins with a constant load routine. This routine sets all registers and flags for the following display sequence. Each ensuing display, except the meter identification display, will have its own unique identification number showing its position in the scroll. The typical scroll is shown as follows:

| | Meter Code Number (9 digits) | |
|---|---|---|
| 01 | Date | |
| 02 | Time | |
| 03 | Time on Carryover (Minutes, 6 digits) | |
| 04 | Total Kilowatt Hours | |
| 05 | A Kilowatt Hours | |
| 06 | A Kilowatts (indicating) | |
| 07 | A Kilowatts (cumulative) | |
| 08 | A Kilowatts (continuously cumulative) | Current |
| 09 | B Kilowatts | Season |
| 10 | B Kilowatts (indicating) | |
| 11 | B Kilowatts (cumulative) | |
| 12 | B Kilowatts (continuously cumulative) | |
| 13 | C Kilowatt Hours | |
| 14 | C Kilowatts (indicating) | |
| 15 | C Kilowatts (cumulative) | |
| 16 | C Kilowatts (continuously cumulative) | |
| 17 | Total Kilowatt Hours | |
| 18 | A Kilowatt Hours | |
| 19 | A Kilowatts (indicating) | |
| 20 | A Kilowatts (cumulative) | |
| 21 | A Kilowatts (continuously cumulative) | |
| 22 | B Kilowatt Hours | Previous |
| 23 | B Kilowatts (indicating) | Season |
| 24 | B Kilowatts (cumulative) | |
| 25 | B Kilowatts (continuously cumulative) | |
| 26 | C Kilowatt Hours | |
| 27 | C Kilowatts (indicating) | |
| 28 | C Kilowatts (cumulative) | |
| 29 | C Kilowatts (continuously cumulative) | |
| 30 | Kh (watt hours per disc revolution) | |
| 31 | Transformer factor | |
| 32 | Program ID (1-99) | |
| 33 | Day of Last Reset (3 digits) | |

The scroll will continue to advance the ID number until another group of constants is sent, at which time the ID number begins at 01 again. Receipt of a message or blank code stops the scroll and requires K4 to be taken low to interrupt either the message or blank. To begin scrolling after a message or a blank, new constants must be sent to re-enable scrolling and automatic display timeout.

In summary, the apparatus described in the foregoing detailed description, enables the metering of electrical energy consumption at multiple rates in an extremely versatile manner. The apparatus is programmable and reprogrammable to meet changing rate designs utilizing a through-the-cover optical communication link which can also be used for automated reading and recording of the metered data. The meter is programmable for five full years, regardless of how many of the programmable functions are used. It can accommodate up to 10 programmable holidays per year and four seasonal rate changes per year. The time of use schedule can be different for each season with up to 8 daily set points on quarter hour intervals for weekdays and 6 daily set points on quarter hour intervals for weekend/holidays. Daylight savings time changes and leap year are also accommodated.

As previously stated, the software associated with the apparatus of the present invention is divided into a unique combination of three co-resident programs. The structure of this software heirarchy is advantageous in that it handles burst data. Basically, the apparatus is able to operate at any given clock rate, appropriate to the pulse rate at which disc rotations are accumulated. However, for any given disc rotation rate, a clock frequency can be selected for the microprocessor 12 to be able to properly implement the program. This feature is very beneficial in that no program changes are required to handle higher rates of data. Also, computation and self test can be suspended for considerable periods of time if bursts of data, such as disc rotations, demand reset inputs, display activate inputs, holiday/weekend switch inputs, power down inputs (such as AC fail), or other requirements dictate.

The program heirarchy described is able to inherently catch-up on its work after servicing essential routines. Not only does this feature lead to high flexibility, it provides the capability to handle an extended power-down event, have power subsequently restored, then begin properly and easily to develop new disc pulse inputs while scanning through the calendar and time information as the time pulses that were stored during the power-down are incremented into the main program minute counter and decremented out of the interrupt routine minute counter. In other words, the process of updating time is run through at an excellerated rate while the normal program activities go on, without having to develop special artifacts in the program routine to handle the special case of power restoration and its effect on calendar and energy use calculations.

In the preferred embodiment described, 33 registers can be displayed on an easily readible 9 digit vacuum flourescent display, which can continually sequence through the quantities programmed for display. In addition, the display is capable of being activated by a magnetic wand passed over the outside of the apparatus in proximity to a magnetic switch. The wand may be used to fast-forward, single step until the desired register is being displayed, or initialize the display back to the first quantity. A standby power source is used to power the apparatus for up to 40 days in case of a primary AC power failure. In the preferred embodiment, this 40 day period is operable over the five year rated life of the standby power source.

While the principles of the invention have now been made clear in an illustrative embodiment, there will be immediately obvious to those skilled in the art, many modifications of structure, arrangement, the elements, material, and components used in the practice of the invention and otherwise, which are particularly adapted for specific environments and operating requirements without departing from those principles. The appended claims are, therefore, intended to cover and embrace any such modifications within the limits only of the true spirit and scope of the invention.

What is claimed is:

1. A programmable multiple rate electrical metering system for registering electrical energy consumed by a monitored load, said system comprising:
   a. input means adapted to receive and count electrical pulses which are representative of electrical energy consumption by said load;
   b. means for detecting the beginning and end of at least one season;
   c. first register means for accumulating the count of electrical pulses received during said season;
   d. means for detecting the beginning and end of at least one calendar event within each said season;
   e. means for detecting the beginning and end of at least one predetermined time of use period within each said calendar event;
   f. second register means for accumulating the count of electrical pulses received during said time of use period;
   g. means for detecting the beginning and end of at least one preselected demand interval within each said time of use period;
   h. third register means for accumulating the count of electrical pulses received during said demand interval; and
   i. means for selectively displaying the contents of said first, second and third register means in units of electrical energy consumption.

2. A programmable multiple rate electrical metering system in accordance with claim 1 additionally comprising:
   a. means for dividing said preselected demand interval into N equal rolling demand sub-intervals, where N is an integer number greater than zero;
   b. fourth register means for accumulating the count of electrical pulses received during the most recent N sub-intervals; and
   c. means for comparing, at the end of each rolling demand sub-interval, the contents of said fourth register means with the contents of said third register means and replacing the contents of said third register means with the contents of said fourth register means whenever the contents of said fourth register means is greater than the contents of said third register means.

3. A programmable multiple rate electrical metering system in accordance with claim 2 wherein N comprises a range of integer numbers from and including 1 to and including 10.

4. A programmable multiple rate electrical metering system in accordance with claim 2 additionally comprising a plurality of register means at least equal in number to said first, second and third register means for storing data accumulated during a previous season.

5. A programmable multiple rate electrical metering system in accordance with claim 4 wherein said display means additionally comprises means for selectively displaying the contents of said additional registers in units of electrical energy consumption.

6. A metering system in accordance with claim 5 wherein said means for displaying of the contents of said registers is selectively activated manually.

7. A programmable multiple rate electrical metering system in accordance with claim 6 wherein said manual activation comprises manually activating a switch by means of a magnetic wand.

8. A programmable multiple rate electrical metering system in accordance with claim 7 additionally comprising an optical communication link interface for communicating information between the metering system and an external programmer tester.

9. A programmable multiple rate electrical metering system in accordance with claim 8 additionally comprising load control means for selectively turning a load on and off during a preselected time of use interval.

10. A multiple rate electrical metering system in accordance with claim 9 additionally comprising alert means for alerting a consumer of the existance of a preselected time of use period being in effect.

11. A programmable multiple rate electrical metering system in accordance with claim 10 additionally comprising an internal power source for providing power to the metering system during power outages.

12. A programmable multiple rate electrical metering system in accordance with claim 11 additionally comprising means for delaying the turning on of a load for a preselected time interval following a power outage in the monitored system.

13. A programmable multiple rate electrical metering system in accordance with claim 12 additionally comprising means for preventing accumulation of the count of electrical pulses in said third and fourth register means for a predetermined time period following a power outage of predetermined duration in the monitored system.

14. A method for registering electrical energy consumed by a monitored load, said method comprising:
 a. receiving and counting electrical pulses which are representative of electrical energy consumption by said load;
 b. detecting the beginning and end of at least one season;
 c. accumulating the count of electrical pulses received during said season in first register means;
 d. detecting the beginning and end of at least one calendar event within each said season;
 e. detecting the beginning and end of at least one predetermined time of use period within each said calendar event;
 f. accumulating the count of electrical pulses received during said time of use period in second register means;
 g. detecting the beginning and end of at least one preselected demand interval within each said tme of use period;
 h. accumulating the count of electrical pulses received during said demand interval in third register means; and
 i. selectively displaying the contents of said first, second and third register means in units of electrical energy consumption.

* * * * *